United States Patent
Nakahata et al.

(10) Patent No.: US 8,362,521 B2
(45) Date of Patent: Jan. 29, 2013

(54) III NITRIDE SEMICONDUCTOR CRYSTAL, III NITRIDE SEMICONDUCTOR DEVICE, AND LIGHT EMITTING DEVICE

(75) Inventors: Seiji Nakahata, Itami (JP); Hideaki Nakahata, Itami (JP); Koji Uematsu, Itami (JP); Makoto Kiyama, Itami (JP); Youichi Nagai, Itami (JP); Takao Nakamura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/767,783

(22) Filed: Apr. 26, 2010

(65) Prior Publication Data

US 2010/0207138 A1 Aug. 19, 2010

Related U.S. Application Data

(62) Division of application No. 10/598,934, filed as application No. PCT/JP2005/008745 on May 13, 2005, now Pat. No. 7,732,236.

(30) Foreign Application Priority Data

May 18, 2004 (JP) ................................ 2004-147914
Apr. 15, 2005 (JP) ................................ 2005-117967

(51) Int. Cl.
*H01L 31/102* (2006.01)
*H01L 29/20* (2006.01)
(52) U.S. Cl. ............... 257/189; 257/615; 257/E29.089
(58) Field of Classification Search .............. 257/13, 257/103, E33.033, E33.023, 94, 201, 79, 257/82, 85, 86, 88, 90, 183, 189, 61, E29.895
See application file for complete search history.

(56) References Cited

U.S. PATENT DOCUMENTS

| | | | | |
|---|---|---|---|---|
| 6,617,261 | B2 * | 9/2003 | Wong et al. | 438/778 |
| 6,746,889 | B1 * | 6/2004 | Eliashevich et al. | 438/33 |
| 2002/0068201 | A1 | 6/2002 | Vaudo et al. | |
| 2002/0102819 | A1 * | 8/2002 | Tamura et al. | 438/483 |
| 2003/0045042 | A1 | 3/2003 | Biwa et al. | |
| 2003/0080345 | A1 * | 5/2003 | Motoki et al. | 257/103 |
| 2003/0114017 | A1 * | 6/2003 | Wong et al. | 438/778 |
| 2004/0033638 | A1 * | 2/2004 | Bader et al. | 438/46 |
| 2005/0048685 | A1 * | 3/2005 | Shibata | 438/46 |
| 2005/0199885 | A1 * | 9/2005 | Hata et al. | 257/79 |

FOREIGN PATENT DOCUMENTS

| | | |
|---|---|---|
| EP | 0966047 A2 | 12/1999 |
| EP | 1244140 A2 | 9/2002 |
| EP | 1361298 A1 | 11/2003 |
| JP | 2003-518737 A | 6/2003 |
| WO | WO99-23693 | 5/1999 |

* cited by examiner

*Primary Examiner* — Davienne Monbleau
*Assistant Examiner* — Selim Ahmed
(74) *Attorney, Agent, or Firm* — James W. Judge

(57) ABSTRACT

Group III nitride semiconductor crystals of a size appropriate for semiconductor devices and methods for manufacturing the same, Group III nitride semiconductor devices and methods for manufacturing the same, and light-emitting appliances. A method of manufacturing a Group III nitride semiconductor crystal includes a process of growing at least one Group III nitride semiconductor crystal substrate on a starting substrate, a process of growing at least one Group III nitride semiconductor crystal layer on the Group III nitride semiconductor crystal substrate, and a process of separating a Group III nitride semiconductor crystal, constituted by the Group III nitride semiconductor crystal substrate and the Group III nitride semiconductor crystal layer, from the starting substrate, and is characterized in that the Group III nitride semiconductor crystal is 10 μm or more but 600 μm or less in thickness, and is 0.2 mm or more but 50 mm or less in width.

13 Claims, 11 Drawing Sheets

III NITRIDE SEMICONDUCTOR CRYSTAL, III NITRIDE SEMICONDUCTOR DEVICE, AND LIGHT EMITTING DEVICE

BACKGROUND OF THE INVENTION

1. Technical Field

The present invention relates to Group III nitride semiconductor crystals used in semiconductor devices and methods for manufacturing the same, Group III nitride semiconductor devices and methods for manufacturing the same, and light-emitting appliances that include those Group III nitride semiconductor devices.

2. Description of the Related Art

Group III nitride semiconductor crystals are widely used in semiconductor devices such as light-emitting diodes (hereinafter called LEDs) and laser diodes (hereafter called LDs).

Conventionally, the manufacture of Group III nitride semiconductor devices that include a Group III nitride semiconductor crystal has required numerous process steps. There was a process of forming a thick Group III nitride semiconductor crystal on a starting substrate, a process of removing this crystal from the starting substrate, a processing of slicing that crystal, a process of attaching the crystal obtained by slicing to the crystal holder of a grinding machine and/or a polishing machine, a process of machining the surface (by this meaning to grind and/or polish; the same hereinafter) of one principal face of the crystal while using increasingly smaller grain-size abrasive, a process of removing the crystal whose one principal face has been machined from the crystal holder, a process of attaching the crystal whose one principal face has been machined to the crystal holder such that its other principal face may be machined, a process of machining the surface of the other principal face of the crystal while using increasingly small diameter abrasive grain, a process of removing the crystal whose two principal faces have been machined from the crystal holder, and a process of cleaning the crystal whose two principal faces have been machined, and by performing these process steps, a highly-clean Group III nitride semiconductor crystal substrate having a predetermined thickness was obtained. One or more Group III nitride semiconductor crystal layers are then formed on this Group III nitride semiconductor crystal substrate and the product is cut into chips of a predetermined size to produce semiconductor devices having a predetermined size (see Patent Document 1, for example).

If the starting substrate is made of a material that is different from the Group III nitride that is to be grown thereon, then to obtain a large Group III nitride semiconductor crystal, further process steps are required. These are a process of growing a 100 μm to 200 μm thick Group III nitride semiconductor crystal atop this dissimilar substrate, a process of removing a portion of the dissimilar substrate, a process of once again growing a 100 μm to 200 μm thick Group III nitride semiconductor crystal, a process of removing the remaining dissimilar substrate, and a process of growing a Group III nitride semiconductor crystal thereon (see Patent Document 2, for example).

Thus, as illustrated above, conventional manufacturing methods have included many processing steps and are inefficient due to the particularly time intensive nature of the processes for slicing, grinding/polishing, and cutting into chips, the Group III nitride semiconductor crystal.

Accordingly, there has been a need for more efficient manufacture of Group III nitride semiconductor devices having a predetermined size.

Patent Document 1: Japanese Unexamined Pat. App. Pub. No. 2002-261014.
Patent Document 2: Japanese Unexamined Pat. App. Pub. No. H11-1399.

BRIEF SUMMARY OF THE INVENTION

In view of such circumstances to date, an object of the present invention is to provide a Group III nitride semiconductor crystal whose dimensions are right for a semiconductor device and an efficient method for manufacturing the same, a Group III nitride semiconductor device and an efficient method for manufacturing the same, and a light-emitting appliance that includes that Group III nitride semiconductor device.

One aspect of the invention is a method of manufacturing a Group III nitride semiconductor crystal that includes a process of growing at least one Group III nitride semiconductor crystal on a starting substrate, and a process of separating the Group III nitride semiconductor crystal from the starting substrate, and is characterized in that the Group III nitride semiconductor crystal is 10 μm or more but 600 μm or less in thickness, and is 0.2 mm or more but 50 mm or less in width.

In this method of manufacturing a Group III nitride semiconductor crystal according to the invention, it is possible for a principal face of the Group III nitride semiconductor crystal to be made smaller in area than a principal face of the starting substrate.

Further, in this method of manufacturing a Group III nitride semiconductor crystal according to the invention, it is possible for the process of growing at least one Group III nitride semiconductor crystal to include a process of forming on the starting substrate a mask layer having at least one window, and a process of growing the Group III nitride semiconductor crystal at least on an open surface of the starting substrate below the window in the mask layer.

Further, in this method of manufacturing a Group III nitride semiconductor crystal according to the invention, it is possible for the window to be formed from a group composed of at least two micro-apertures. That is, it is possible for the process of growing at least one Group III nitride semiconductor crystal to include a process of forming a mask layer having at least one window formed from a group composed of at least two micro-apertures on the starting substrate, and a process of growing the Group III nitride semiconductor crystal at least on an open surface of the starting substrate below the window in the mask layer.

Further, in this method of manufacturing a Group III nitride semiconductor crystal according to the invention, it is possible for the process of growing at least one Group III nitride semiconductor crystal to include a process of disposing at least one seed crystal on the starting substrate, and a process of growing the Group III nitride semiconductor crystal from the seed crystal.

Further, in this method of manufacturing a Group III nitride semiconductor crystal according to the invention, it is possible for whichever method of etching, lasing, or cleaving to be used in the process of separating the Group III nitride semiconductor crystal from the starting substrate.

The Group III nitride semiconductor crystal that is obtained through this method of manufacturing a Group III nitride semiconductor crystal according to the invention can have the shape of a hexagonal plate, a rectangular plate, or a triangular plate.

Further, in this method of manufacturing a Group III nitride semiconductor crystal according to the invention, it is possible for the Group III nitride semiconductor crystal to be grown at a rate of at least 10 μm/hr but not more than 300 μm/hr. It is also possible for the Group III nitride semiconductor crystal to have an impurity concentration that is not more than $5 \times 10^{19}$ cm$^{-3}$. It is further possible for the off angle between the principal face of the Group III nitride semiconductor crystal and whichever of its (0001) face, (1$\bar{1}$00) face, (11$\bar{2}$0) face, (1$\bar{1}$01) face, (1$\bar{1}$02) face, (11$\bar{2}$1) face, or (11$\bar{2}$2) face to be 0° or more but not more than 4°.

A further aspect of the invention is a Group III nitride semiconductor crystal manufactured using a method of manufacturing a Group III nitride semiconductor crystal recited above.

A yet further aspect of the invention is a method of manufacturing a Group III nitride semiconductor device that includes a process of growing at least one Group III nitride semiconductor crystal substrate on a starting substrate, a process of growing at least one Group III nitride semiconductor crystal layer on the Group III nitride semiconductor crystal substrate, and a process of separating a Group III nitride semiconductor crystal that is constituted by the Group III nitride semiconductor crystal substrate and the Group III nitride semiconductor crystal layer, from the starting substrate, and is characterized in that the Group III nitride semiconductor crystal is 10 μm or more but 600 μm or less in thickness, and is 0.2 mm or more but 50 mm or less in width.

In this method of manufacturing a Group III nitride semiconductor device according to the invention, it is possible for a principal face of the Group III nitride semiconductor crystal substrate to be made smaller in area than a principal face of the starting substrate.

Further, in this method of manufacturing a Group III nitride semiconductor device according to the invention, it is possible for the process of growing at least one Group III nitride semiconductor crystal substrate to include a process of forming on the starting substrate a mask layer having at least one window, and a process of growing the Group III nitride semiconductor crystal substrate at least on an open surface of the starting substrate below the window in the mask layer.

Further, in this method of manufacturing a Group III nitride semiconductor device according to the invention, it is possible for the window to be formed from a group composed of at least two micro-apertures. That is, it is possible for the process of growing at least one Group III nitride semiconductor crystal substrate to include a process of forming a mask layer having at least one window formed from a group composed of at least two micro-apertures on the starting substrate, and a process of growing the Group III nitride semiconductor crystal at least on an open surface of the starting substrate below the window in the mask layer.

Further, in this method of manufacturing a Group III nitride semiconductor device according to the invention, it is possible for the process of growing at least one Group III nitride semiconductor crystal substrate to include a process of disposing at least one seed crystal on the starting substrate, and a process of growing the Group III nitride semiconductor crystal substrate from the seed crystal.

Further, in this method of manufacturing a Group III nitride semiconductor device according to the invention, it is possible for whichever method of etching, lasing, or cleaving to be used in the process of separating the Group III nitride semiconductor crystal that is constituted by the Group III nitride semiconductor crystal substrate and the Group III nitride semiconductor crystal layer, from the starting substrate.

The Group III nitride semiconductor crystal substrate and the Group III nitride semiconductor crystal layer that are obtained through this method of manufacturing a Group III nitride semiconductor device according to the invention can have the shape of a hexagonal plate, a rectangular plate, or a triangular plate.

Further, in this method of manufacturing a Group III nitride semiconductor device according to the invention, it is possible for the Group III nitride semiconductor crystal substrate to be grown at a rate of at least 10 μm/hr but not more than 300 μm/hr. It is also possible for the Group III nitride crystal substrate to have an impurity concentration that is not more than $5 \times 10^{19}$ cm$^{-3}$. It is further possible for the off angle between the principal face of the Group III nitride crystal substrate and whichever of its (0001) face, (1$\bar{1}$00) face, (11$\bar{2}$0) face, (1$\bar{1}$01) face, (1$\bar{1}$02) face, (11$\bar{2}$1) face, or (11$\bar{2}$2) face to be 0° or more but not more than 4°.

A further aspect of the invention is a Group III nitride semiconductor device manufactured using a method of manufacturing a Group III nitride semiconductor device recited above.

In a Group III nitride semiconductor device according to the invention, it is possible for a surface with peaks and valleys to be formed in a rear face of the Group III nitride semiconductor crystal substrate. Additionally, in this Group III nitride semiconductor device according to the invention, the surface roughness $R_{P-V}$ of the surface with peaks and valleys that is formed in a rear face of the Group III nitride semiconductor crystal substrate can be at least 0.01 μm but not more than 50 μm. Here, the rear face of the Group III semiconductor substrate is its face that is on the side opposite its face on which the one or more Group III nitride semiconductor crystal layers are formed.

In another aspect of the invention, a light-emitting appliance includes a Group III nitride semiconductor device recited above and is characterized in that the Group III nitride semiconductor device includes a Group III nitride semiconductor crystal substrate, and on the first principal face side of the Group III nitride semiconductor crystal substrate, a n-type Group III nitride semiconductor layer, a p-type Group III nitride semiconductor crystal layer located farther from the Group III nitride semiconductor substrate than the n-type Group III nitride semiconductor crystal layer, and a light-emitting layer that is located between the n-type Group III nitride semiconductor crystal layer and the p-type Group III nitride semiconductor crystal layer, in that the Group III nitride semiconductor crystal substrate has a resistivity of 0.5 Ω·cm or less, and in that the p-type Group III nitride semiconductor crystal layer side is mounted down and light is irradiated from a second principal face on the side opposite the first principal face of the Group III nitride semiconductor crystal substrate.

As illustrated above, the invention can provide a Group III nitride semiconductor crystals of a size right for semiconductor devices and efficient methods for manufacturing the same, Group III nitride semiconductor devices and efficient methods for manufacturing the same, and light-emitting appliances including such Group III nitride semiconductor devices.

BRIEF DESCRIPTION OF THE SEVERAL VIEWS OF THE DRAWINGS

FIG. 7B is a schematic cross section for explaining yet another method for manufacturing a Group III nitride semiconductor crystal and a Group III nitride semiconductor device according to the invention, and illustrates the process of etching the starting Group III nitride semiconductor crystal 9a located below the window 2a.

EXPLANATION OF REFERENCE MARKS

1: starting substrate; 1a: open surface; 1s: small open surface; 2: mask layer; 2a: window; 2b: upper surface of window-surrounding portion of mask layer; 2s: micro-aperture; 2p: mask portion; 3: Group III nitride semiconductor reverse polarity crystal; 3a: lower surface; 3b: upper surface; 4: seed crystal; 9, 9a: starting Group III nitride crystal; 10: Group III nitride semiconductor crystal; 10a: lower surface; 10b: upper surface; 10s: lateral surface; 11: Group III nitride semiconductor crystal substrate; 12: Group III nitride semiconductor crystal layer; 12a: i-type GaN layer; 12b: i-type $Al_xGa_{1-x}N$ layer; 12c: n⁻ GaN layer; 12d: p-type layer; 12e: n⁺ layer; 21: n-type Group III nitride semiconductor layer; 21a: n-type GaN layer; 21b: n-type $Al_xGa_{1-x}N$ layer; 22: light-emitting layer; 22a: $In_{0.2}Ga_{0.8}N$ layer; 22b: $Al_{0.2}Ga_{0.8}N$ layer; 23: p-type Group III nitride semiconductor crystal layer; 23a: p-type $Al_xGa_{1-x}N$ layer; 23b: p-type GaN layer; 51: n-side electrode; 52: p-side electrode; 53: source electrode; 54: gate electrode; 55: drain electrode; 56: ohmic electrode; 57: Schottky electrode; 60: lead frame; 60a: mount portion; 60b: lead portion; 61: wire; 62: conductive resin; 63: epoxy resin; 90, 100, 110, 120: Group III nitride semiconductor devices; 98: emission rays; 130: light-emitting appliance.

DETAILED DESCRIPTION OF THE INVENTION

Embodying Mode 1

Figure 1A:
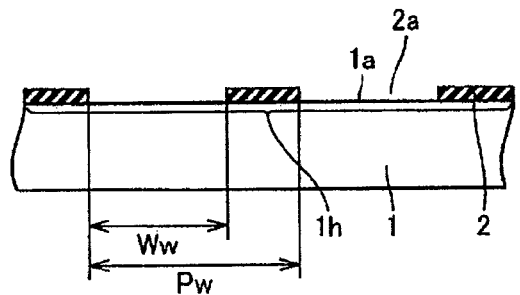
FIG. 1A is a schematic cross section for explaining one method for manufacturing a Group III nitride semiconductor crystal and a Group III nitride semiconductor device according to the invention, and illustrates the process of forming on the starting substrate a mask layer having windows.
Figure 1B:
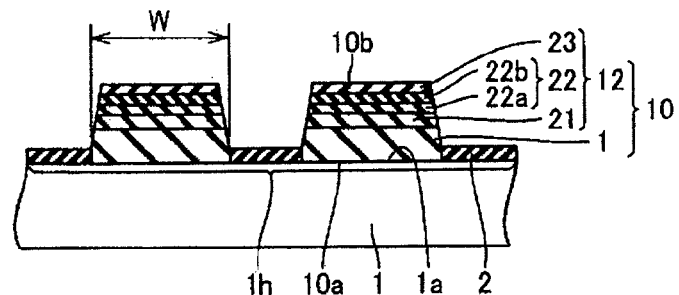
FIG. 1B is a schematic cross section for explaining one method for manufacturing a Group III nitride semiconductor crystal and a Group III nitride semiconductor device according to the invention, and illustrates the process of growing a Group III nitride semiconductor crystal on the open surface of the starting substrate.
Figure 1C:
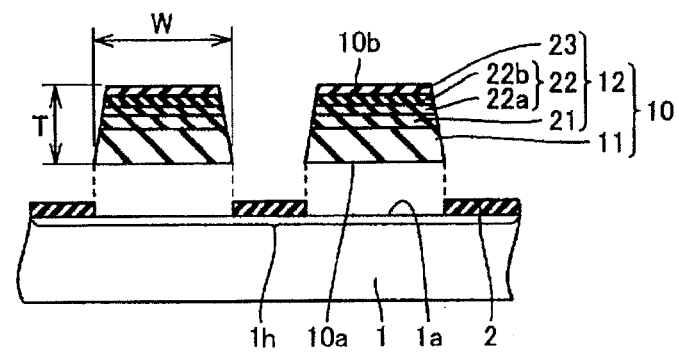
FIG. 1C is a schematic cross section for explaining one method for manufacturing a Group III nitride semiconductor crystal and a Group III nitride semiconductor device according to the invention, and illustrates the process of separating the Group III nitride semiconductor crystal from the starting substrate.
Figure 1D:
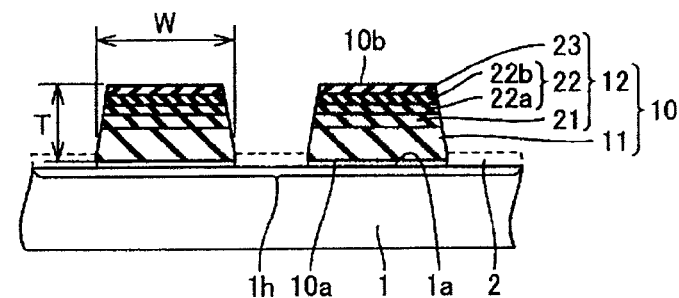
FIG. 1D is a schematic cross section for explaining one method for manufacturing a Group III nitride semiconductor crystal and a Group III nitride semiconductor device according to the invention, and illustrates the process of separating the Group III nitride semiconductor crystal from the starting substrate.

One method of manufacturing a Group III nitride semiconductor crystal according to the invention is described with reference to FIG. 1, and includes a process of growing one or more Group III nitride semiconductor crystals 10 on a starting substrate 1 as shown by FIGS. 1A and 1B, and a process of separating the Group III nitride semiconductor crystal(s) 10 from the starting layer 1 as shown in FIGS. 1C and 1D, and is a method of manufacturing a Group III nitride semiconductor crystal to produce a Group III nitride semiconductor crystal that is large enough for a semiconductor device, its thickness at least 10 μm but not more than 600 μm and its width at least 0.2 mm but not more than 50 mm. The width of the Group III nitride semiconductor crystal refers to its diameter if the Group III nitride semiconductor crystal has an annular form and refers to the distance between an edge and an opposing edge or angle if it is polygonal in form. This manufacturing method allows a Group III nitride semiconductor crystal whose size is right for a semiconductor device to be directly and efficiently obtained without performing any processing steps to slice, process the surface of, and turn into chips, the Group III nitride semiconductor crystal as in conventional manufacturing methods.

As illustrated in FIG. 1, the method of manufacturing a Group III nitride semiconductor crystal of this mode of mode of embodiment allows the area of the principal face of the Group III semiconductor crystal (this corresponds to the lower surface 10a or the upper surface 10b in FIG. 1) to be made smaller than the area of the principal face 1h of the starting substrate 1. It is therefore possible to directly and efficiently manufacture a Group III nitride semiconductor crystal about the size of a semiconductor device even when a large starting substrate is used.

Specifically, the method of manufacturing a Group III nitride semiconductor crystal of this mode of mode of embodiment specifically includes, as the process for growing at least one Group III nitride semiconductor crystal 10 on the starting substrate 1, a process of forming a mask layer 2 having at least one window 2a atop the starting substrate 1 shown in FIG. 1A, and a process of growing the Group III nitride semiconductor crystal 10 on the open surface 1a of the starting substrate 1 located below the windows 2a of the mask layer shown in FIG. 1B.

In the process of forming the mask layer 2 having the windows 2a shown in FIG. 1A, there are no particular limitations regarding the size of the windows 2a, but it is preferable that the aperture width W of the windows 2a is at least 0.2 mm but not more than 50 mm because this allows a Group III nitride semiconductor crystal whose width is at least 0.2 mm but not more than 50 mm to be obtained with ease. Further, there are no particular limitations regarding the distribution of the windows; however, dispersing them uniformly allows Group III nitride semiconductor crystals of uniform size to be obtained with ease, and thus is preferable. There are no particular limitations regarding the shape of the windows, and they may assume an annular or polygonal form, however, Group III nitride semiconductor crystals belonging to hexagonal or cubic systems readily take the form of hexagonal plates, rectangular plates, or triangular plates, and thus windows having a hexagonal, rectangular, or triangular shape are preferable. The aperture width of the windows refers to the diameter in the case of annular windows and refers to the distance between an edge and an opposing edge or angle in the case of polygonal windows. Further, there are no particular restrictions regarding the mask layer, as long as the mask layer inhibits growth of the Group III nitride semiconductor crystal, and $SiO_2$, $Si_3N_4$, W, Ni, and Ti, among others, may be used favorably for the mask layer.

In the process of growing a Group III nitride semiconductor crystal on the open surface 1a of the starting substrate 1 shown in FIG. 1B, the Group III nitride semiconductor crystal 10 that is grown is not limited to a single crystal layer, and it can also be two or more crystal layers. For example, the Group III nitride semiconductor crystal 10 can be made of a Group III nitride semiconductor crystal substrate 11 and one or more Group III nitride semiconductor crystal layers 12 that have been formed atop the Group III nitride semiconductor crystal substrate 11. In this case, the process of forming the Group III nitride semiconductor crystal will include a process of growing the Group III nitride semiconductor crystal substrate 11 on the open surface 1a of the starting substrate 1 and a process of growing at least one Group III nitride semiconductor crystal layer 12 on the Group III nitride semiconductor crystal substrate 11.

There are no particular limitations regarding the method for growing the Group III nitride crystal, and various vapor phase growth methods can be used favorably, including HVPE (Hydride Vapor Phase Epitaxy), MOCVD (Metal Organic Chemical Vapor Deposition), and MBE (Molecular Beam Epitaxy). Of these, HVPE has a fast growth rate and is particularly preferable when forming thick layers such as the Group III nitride semiconductor crystal substrate 11, and MOCVD is particularly suited for growing the Group III nitride semiconductor crystal layers 12, which must have flat surfaces as well as be thin.

In this mode of mode of embodiment, the Group III nitride semiconductor crystal 10 is grown only on the open surface 1a of the starting substrate, and is not grown on the mask layer 2. The Group III nitride semiconductor crystal can be grown easily when there is a small difference between the pitch $P_W$ between windows and the aperture width $W_W$ of the windows of the mask layer, when $Si_3N_4$ or W is used as the material for the mask layer, and when the crystal is grown at elevated temperatures for a short growth time.

There are no particular limitations regarding the method for separating the Group III nitride semiconductor crystal 10 from the starting substrate 1, but from the standpoint that little damage is caused to the Group III nitride semiconductor crystal 10, preferable methods include mechanically separating the two using a laser or cleaving or chemically separating the two by etching.

One example of a method for mechanically separating the two using a laser is described with reference to FIG. 1C, and with this method the lower surface (starting substrate side surface) 10a of the Group III nitride semiconductor crystal 10 in contact with the printer substrate 1 and the open surface 1a of the starting substrate are cleaved by a laser to separate the Group III nitride semiconductor crystal 10 from the starting substrate 1.

This laser-based separation method can be favorably employed when the band gap energy of the Group III nitride semiconductor crystal 10 is smaller than the band gap energy of the starting substrate 1, for example. In this case, irradiating the laser from the starting substrate 1 side allows the Group III nitride semiconductor crystal 10 and the starting substrate 1 to be separated without causing damage to the starting substrate, and thus the starting substrate can be reused.

In a situation where the band gap energies of the Group III nitride semiconductor crystal and the starting substrate are equal or there is little difference between them, one possibility is to form in advance a separation layer that has a smaller band gap energy than the band gap energies of the Group III nitride semiconductor crystal and the starting substrate between the starting substrate and the Group III nitride semiconductor crystal after formation of the mask layer, and then irradiate a laser from the starting substrate side to cleave the separation layer, and by doing this the Group III nitride crystal and the starting substrate can be separated without either being damaged.

In one method for mechanically separating the two through cleaving, the characteristic that the Group III nitride semiconductor crystal easily cracks at a particular Miller index face (such as the (0001) face or the (1$\bar{1}$00) face; hereinafter the Miller index face refers to the face having that Miller index) is exploited to separate the Group III nitride semiconductor crystal from the starting substrate 1. For example, growing a Group III nitride semiconductor crystal whose principal face is the (1$\bar{1}$00) face atop a starting substrate whose principal face is the (1$\bar{1}$00) face and then cleaving the interface between the starting substrate and the Group III nitride semiconductor crystal allows the Group III nitride crystal and the starting substrate to be separated without causing damage to either one.

In another method for mechanically separating the two, a mechanically brittle layer is interposed between the starting substrate 1 and the Group III nitride semiconductor crystal that is grown on the starting substrate 1. Specifically, first a Group III nitride semiconductor crystal that is several μm to several dozen μm thick and doped with carbon (C) (the mechanically brittle layer) is formed on the starting substrate 1, and then a desired Group III nitride semiconductor crystal is grown. That is, the C-doped Group III nitride semiconductor crystal is more brittle than the crystal that is not C-doped and thus can be separated from the starting substrate 1 by applying a weak force. Carbon is not the only dopant for obtaining the brittle layer, and it is only necessary that the dopant makes the crystal brittle.

FIG. 1D details one example of a method for chemically separating the two by etching, and here etching agents are used to etch the mask layer 2 and the lower surface 10a of the Group III nitride semiconductor crystal that is in contact with the starting substrate 1 and thus separate the Group III nitride semiconductor crystal 10 from the starting substrate 1. Here, a corrosive acid such as hydrofluoric acid is used as the etching agent for etching a mask layer 2 made of $Si_3N_4$ or $SiO_3$, for example, and a mixed acid made from nitric acid, hydrofluoric acid, and copper sulfate, for example, is employed as the etching agent for etching a mask layer 2 that is made of W, Ni, or Ti, for example, and a strong base such as KOH is used as the etching agent for etching the lower surface 10a of the Group III nitride semiconductor crystal 10 that is in contact with the starting substrate 1.

Here, the Group III nitride semiconductor crystal has a wurtzite crystal structure in which an atomic layer made of elemental nitrogen and an atomic layer made of a Group III element are arranged in alternating rows in the <0 0 0 1> direction of the crystal, and in the face perpendicular to the <0 0 0 1> direction of the crystal includes an atomic surface made of elemental nitrogen and an atomic surface made of a Group III element. When the Group III nitride semiconductor crystal is grown in the <0 0 0 1> direction on the starting substrate, ordinarily the crystal is grown from the starting substrate in the growth direction of the crystal in the order of an atomic layer made of elemental nitrogen, an atomic layer made of a Group III element, an atomic layer made of elemental nitrogen, an atomic layer made of a Group III element, etc., and thus, as illustrated in FIG. 1D, the lower surface 10a of the Group III nitride semiconductor crystal 10 that is in contact with the starting substrate 1 is an atomic surface made of elemental nitrogen, and the upper surface 10b of the Group III nitride semiconductor crystal 10 is an atomic surface made of a Group III element. The Group III nitride semiconductor crystal is chemically stable and not readily etched from the upper surface 10b, which is an atomic surface made of a Group III element, but etching can be performed easily from the lower surface 10a, which is an atomic surface made of elemental nitrogen, using a strong base such as KOH.

Although not illustrated in the drawings, another possible method for chemically separating the starting substrate 1 and the Group III nitride semiconductor crystal by etching is to remove the starting substrate 1 by etching. A corrosive acid such as hydrofluoric acid can be used as the etching agent in order to etch a starting substrate made of Si, for example.

The rate at which the Group III nitride semiconductor crystal of this mode of embodiment is grown preferably is at least 10 μm/hr but not more than 300 μm/hr. A Group III nitride semiconductor crystal growth rate that is less than 10 μm/hr will lower manufacturing efficiency, whereas if it exceeds 300 μm/hr, defects such as holes are likely to be introduced into the Group III nitride semiconductor crystal and make it more prone to cleaving.

The concentration of impurities in the Group III nitride semiconductor crystal of this mode of embodiment preferably is not more than $5 \times 10^{19}$ cm$^{-3}$. A concentration of impurities in the Group III nitride semiconductor crystal in excess of $5 \times 10^{19}$ cm$^{-3}$ leads to defects readily occurring in the Group III nitride semiconductor crystal and makes it more prone to cleaving.

The off angle formed between the principal face of the Group III nitride semiconductor crystal of this mode of embodiment and any one of its (0001) face, ($1\bar{1}00$) face, ($11\bar{2}0$) face, ($1\bar{1}01$) face, ($1\bar{1}02$) face, ($11\bar{2}1$) face, or ($11\bar{2}2$) face preferably is 0° or more but not more than 4°. An off angle of 0° means that the principal face of the Group III nitride semiconductor crystal is parallel to one of its (0001) face, ($1\bar{1}00$) face, ($11\bar{2}0$) face, ($1\bar{1}01$) face, ($1\bar{1}02$) face, ($11\bar{2}1$) face, or ($11\bar{2}2$) face. An off angle greater than 4° will increase the likelihood of defects occurring in the Group III nitride semiconductor crystal and make the crystal more prone to cleaving.

When the starting substrate has a hexagonal crystal system, normally it is easy to grow a Group III nitride crystal whose principal face is the same Miller index face as the Miller index face of the principal face of the starting substrate. When the starting substrate is not a hexagonal system, the Group III nitride crystal grows easily on the face that reflects the arrangement of the atoms in the surface of the starting substrate, and for example its (0001) face easily grows on an Si (1 1 1) face. Further, the off angle between the principal face of the starting substrate and a particular Miller index face and the off angle between the principal face of the Group III nitride crystal and its Miller index face substantially match one another.

Embodying Mode 2

Figure 2A:
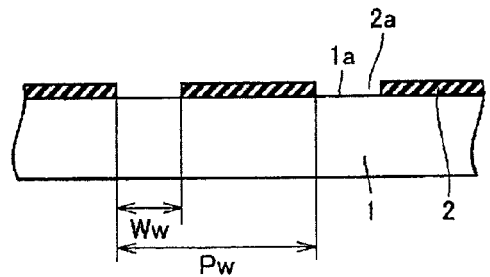
FIG. 2A is a schematic cross section for explaining another method for manufacturing a Group III nitride semiconductor crystal and a Group III nitride semiconductor device according to the invention, and illustrates the process of forming on the starting substrate a mask layer having windows.

A separate method for manufacturing a Group III nitride semiconductor crystal according to the invention is described with reference to FIG. 2, and as the process for growing at least one Group III nitride semiconductor crystal 10 on a starting substrate 1, includes a process of forming a mask layer 2 that has at least one window 2a on the starting substrate 1 shown in FIG. 2A, and a process of growing the Group III nitride semiconductor crystal 10 on the open surface 1a of the starting substrate located below the windows 2a of the mask layer 2 shown in FIG. 2B and atop some of the upper surface 2b of the mask layer surrounding the windows 2a.

Whereas in Embodying Mode 1 the Group III nitride semiconductor crystal was grown only above the open surface 1a of the starting substrate 1 located below the windows in the mask layer, in this mode of embodiment the Group III nitride semiconductor crystal 10 is grown not only on the open surface 1a of the starting substrate 1 located below the windows 2a of the mask layer 2 but also on some of the upper surface 2b of the mask layer 2 surrounding the windows 2a, and in this regard the two modes of mode of embodiment differ from one another. Such a Group III nitride semiconductor crystal can be readily grown when there is a large difference in the pitch $P_W$ between windows and the width $W_W$ of the windows in the mask layer, and when the crystal is grown at elevated temperatures under low raw gas pressure and a short growth time.

Figure 2B:
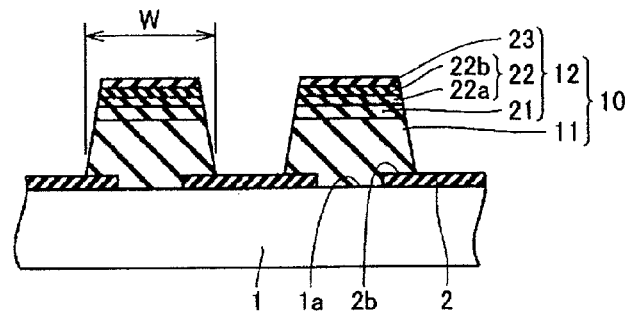
FIG. 2B is a schematic cross section for explaining another method for manufacturing a Group III nitride semiconductor crystal and a Group III nitride semiconductor device according to the invention, and illustrates the process of growing a Group III nitride semiconductor crystal on the open surface of the starting substrate located below the windows of the mask layer and on some of the mask layer surrounding the windows.
Figure 2C:
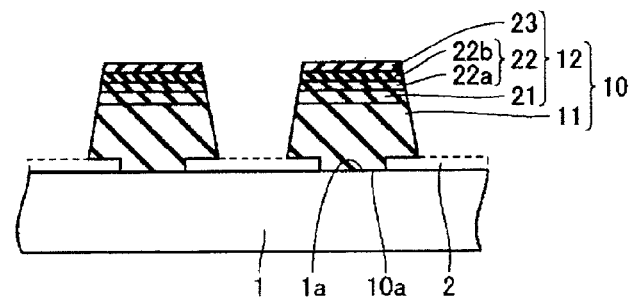
FIG. 2C is a schematic cross section for explaining another method for manufacturing a Group III nitride semiconductor crystal and a Group III nitride semiconductor device according to the invention, and illustrates the process of removing the mask layer.
Figure 2D:
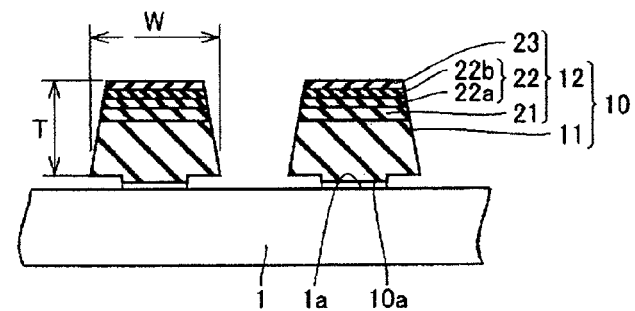
FIG. 2D is a schematic cross section for explaining another method for manufacturing a Group III nitride semiconductor crystal and a Group III nitride semiconductor device according to the invention, and illustrates the process of separating the Group III nitride semiconductor crystal from the starting substrate.

In this mode of mode of embodiment, the Group III nitride semiconductor crystal 10 is separated from the starting substrate 1 preferably by the method shown in FIGS. 2C and 2D, which illustrate a method for chemical separation by etching. That is, as shown in FIG. 2C, a corrosive acid such as hydrofluoric acid is used to etch the mask layer 2, which is made of SiO$_2$, Si$_3$N$_4$, or the like, and then, as shown in FIG. 2D, a strong base such as KOH is used to etch the lower surface 10a of the Group III nitride semiconductor crystal that is in contact with the starting substrate 1, thereby separating the Group III nitride semiconductor crystal 10 from the starting substrate 1. In this mode of mode of embodiment, the mask layer 2 takes on a form in which it is embedded in a portion of the surface of the Group III nitride semiconductor crystal 10 on its starting substrate side, and thus removing the mask layer 2 through etching makes it easy to etch the atomic surface made of elemental nitrogen that is the lower surface 10a of the Group III nitride semiconductor crystal in contact with the starting substrate.

The growth rate, impurity concentration, and off angle between the principal face and the Miller index face of the Group III nitride semiconductor crystal according to this mode of mode of embodiment are the same as in Embodying Mode 1.

Embodying Mode 3

Another method for manufacturing a Group III nitride semiconductor crystal according to the invention is described with reference to FIG. 3, and as the process for growing at least one Group III nitride semiconductor crystal 10 on the starting substrate 1, includes a process of forming a mask layer 2 that has at least one window 2a on the starting substrate 1 shown in FIG. 3A, and a process of growing the Group III nitride semiconductor crystal 10 on the open surface 1a of the starting substrate located below the window 2a of the mask layer 2 shown in FIG. 3B and growing a Group III nitride semiconductor reverse polarity crystal 3 whose polarity has been inverted on the mask layer 2. The Group III nitride semiconductor crystal 10 and the Group III nitride semiconductor reverse polarity crystal 3 can be grown with ease when there is a large difference in the pitch $P_W$ between windows and the width $W_W$ of the windows in the mask layer and Ni or Ti is used as the material of the mask layer, and are grown with ease when the crystal is grown at low temperature and the raw gas pressure is high.

Here, inversion of the polarity means that the atomic surface constituting the (hklu) face and the $(\overline{hklu})$ face, which are two faces that are in vertical opposition to one another about the <hklu> axis, of the Group III nitride semiconductor crystal are inverted (here, $l=\overline{hk}$). As mentioned above, when the Group III nitride semiconductor crystal is grown on the starting substrate, ordinarily the crystal is grown from the starting substrate in the growth direction of the crystal in the order of an atomic layer made of elemental nitrogen, an atomic layer made of a Group III element, an atomic layer made of elemental nitrogen, an atomic layer made of a Group III element, etc., and thus as illustrated in FIG. 3B, the lower surface 10a of the Group III nitride semiconductor crystal 10 that is in contact with the starting substrate 1 is an atomic surface made of elemental nitrogen, and the upper surface 10b of the Group III nitride semiconductor crystal 10 is an atomic surface made of a Group III element.

Figure 3A:
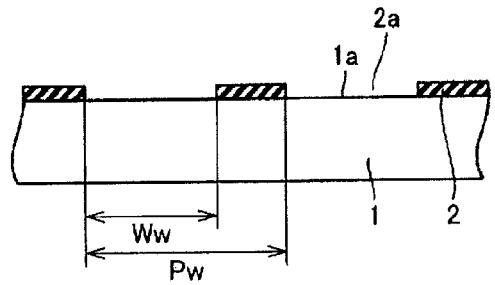
FIG. 3A is a schematic cross section for explaining yet another method for manufacturing a Group III nitride semiconductor crystal and a Group III nitride semiconductor device according to the invention, and illustrates the process of forming on the starting substrate a mask layer having windows.
Figure 3B:
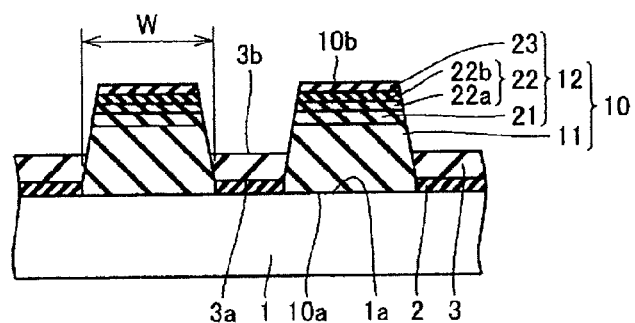
FIG. 3B is a schematic cross section for explaining yet another method for manufacturing a Group III nitride semiconductor crystal and a Group III nitride semiconductor device according to the invention, and illustrates the process of growing a Group III nitride semiconductor crystal on the open surface of the starting substrate and growing a Group III nitride semiconductor reverse polarity crystal on the mask layer.

In contrast, when the Group III nitride semiconductor crystal is grown on a mask layer made from $SiO_2$, Ni, or Ti, the crystal is grown from the mask layer in the growth direction of the crystal in the order of an atomic layer made of a Group III element, an atomic layer made of elemental nitrogen, an atomic layer made of a Group III element, an atomic layer made of elemental nitrogen, etc., and thus, as illustrated in FIG. 3B, the lower surface 3a of the Group III nitride semiconductor reverse polarity crystal that is in contact with the mask layer 2 is an atomic surface made of a Group III element, and the upper surface 10b of the Group III nitride semiconductor crystal 10 is an atomic surface made of elemental nitrogen. As mentioned above, the Group III nitride semiconductor crystal is difficult to etch from an atomic surface made of a Group III element, however, it can be easily etched from an atomic surface made of elemental nitrogen using a strong base such as KOH.

Figure 3C:
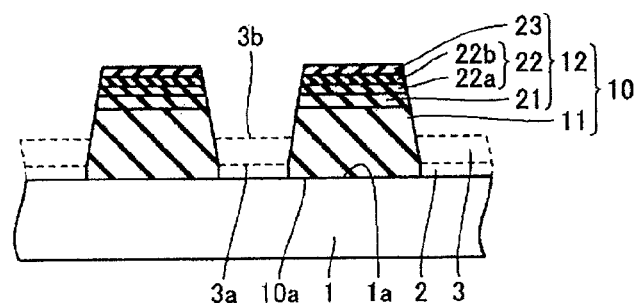
FIG. 3C is a schematic cross section for explaining yet another method for manufacturing a Group III nitride semiconductor crystal and a Group III nitride semiconductor device according to the invention, and illustrates the process of removing the Group III nitride semiconductor reverse polarity crystal and the mask layer.
Figure 3D:
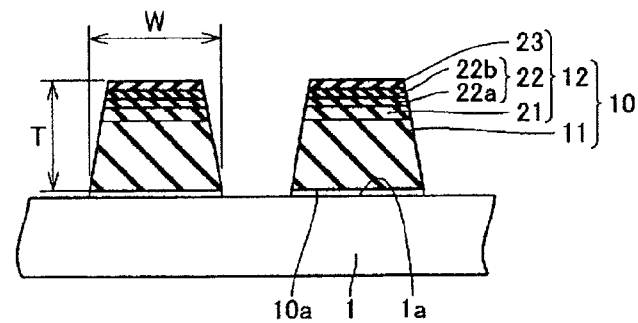
FIG. 3D is a schematic cross section for explaining yet another method for manufacturing a Group III nitride semiconductor crystal and a Group III nitride semiconductor device according to the invention, and illustrates the process of separating the Group III nitride semiconductor crystal from the starting substrate.

Thus, in this mode of mode of embodiment, the Group III nitride semiconductor crystal 10 is separated from the starting substrate 1 by etching the Group III nitride semiconductor reverse polarity crystal 3 that has been grown on the mask layer 2 from the atomic surface made of elemental nitrogen, that is, the upper surface 3b, using a strong base such as KOH, and then the mask layer 2, which is made of $SiO_2$, Ni, or Ti is etched using a corrosive acid such as hydrofluoric acid or an acid mixture including nitric acid, hydrofluoric acid, and copper sulfate, as shown in FIG. 3C. Then, as shown in FIG. 3D, a strong base such as KOH is used to etch the lower surface 10a of the Group III nitride semiconductor crystal 10 that is in contact with the starting substrate 1, and by doing this, the Group III nitride semiconductor crystal 10 can be separated from the starting substrate 1.

It should be noted that if the lower surface of the Group III nitride semiconductor crystal has a large area and cannot be etched easily, then, although not shown, the interface between the Group III nitride semiconductor crystal and the starting substrate can be cleaved using a laser, for example, to separate the Group III nitride semiconductor crystal from the starting substrate.

The growth rate, impurity concentration, and off angle between the principal face and the Miller index face of the Group III nitride semiconductor crystal of this mode of mode of embodiment are the same as in Embodying Mode 1.

Embodying Mode 4

Figure 4A:
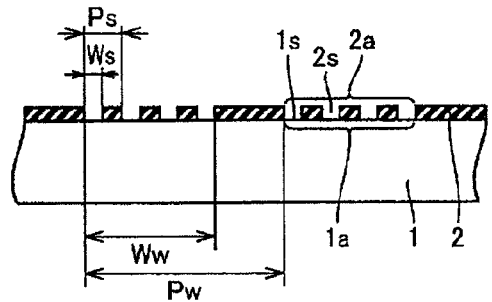
FIG. 4A is a schematic cross section for explaining yet another method for manufacturing a Group III nitride semiconductor crystal and a Group III nitride semiconductor device according to the invention, and illustrates the process of forming a mask layer having windows each formed from a group of two or more micro-apertures on the starting substrate.
Figure 4B:
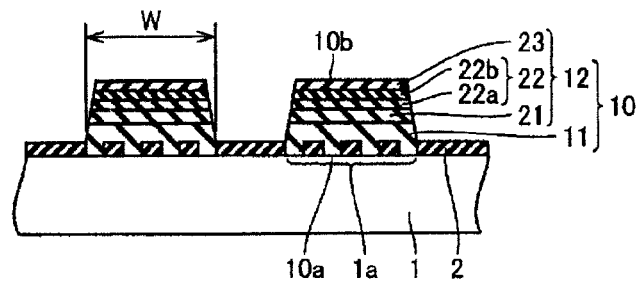
FIG. 4B is a schematic cross section for explaining yet another method for manufacturing a Group III nitride semiconductor crystal and a Group III nitride semiconductor device according to the invention, and illustrates the process of growing a Group III nitride semiconductor crystal on the open surface of the starting substrate.
Figure 4C:
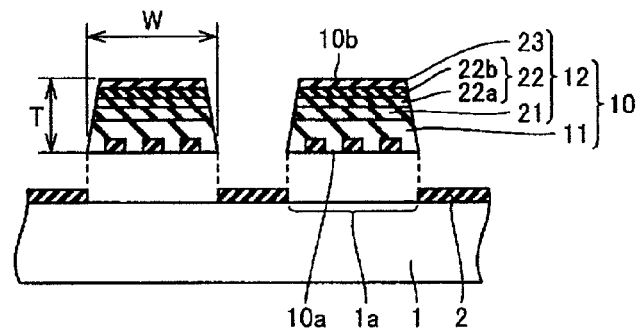
FIG. 4C is a schematic cross section for explaining yet another method for manufacturing a Group III nitride semiconductor crystal and a Group III nitride semiconductor device according to the invention, and illustrates the process of separating the Group III nitride semiconductor crystal from the starting substrate.
Figure 4D:
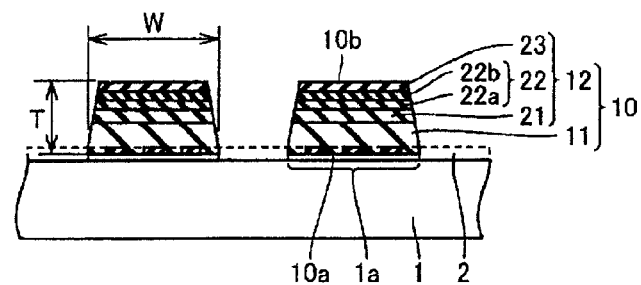
FIG. 4D is a schematic cross section for explaining yet another method for manufacturing a Group III nitride semiconductor crystal and a Group III nitride semiconductor device according to the invention, and illustrates the process of separating the Group III nitride semiconductor crystal from the starting substrate.

Yet another method for manufacturing a Group III nitride semiconductor crystal according to the invention is described with reference to FIG. 4, and as the process for growing at least one Group III nitride semiconductor crystal 10 on the starting substrate 1, includes a process of forming a mask layer 2 that has at least one window 2a that is formed from a group of at least two micro-apertures 2s on the starting substrate 1 as shown in FIG. 4A, and a process of growing the Group III nitride semiconductor crystal 10 on at least the open surface 1a of the starting substrate 1 located below the windows 2a of the mask layer 2 as shown in FIG. 4B.

As the window 2a increases in size, cracks are increasingly likely to occur in the Group III nitride crystal that is grown, however, forming the window 2a from a group of small window portions 2s allows cleaving in the Group III nitride semiconductor crystal to be inhibited. The effect of inhibiting cleaving in the Group III nitride semiconductor crystal through the micro-apertures is that a Group III nitride crystal whose width (which is substantially equal to the width of the window) is particularly large at 200 μm or more can be grown, and it is possible to grow a Group III nitride semiconductor crystal whose width is 50,000 μm without allowing cleaving to occur.

Figure 5A:
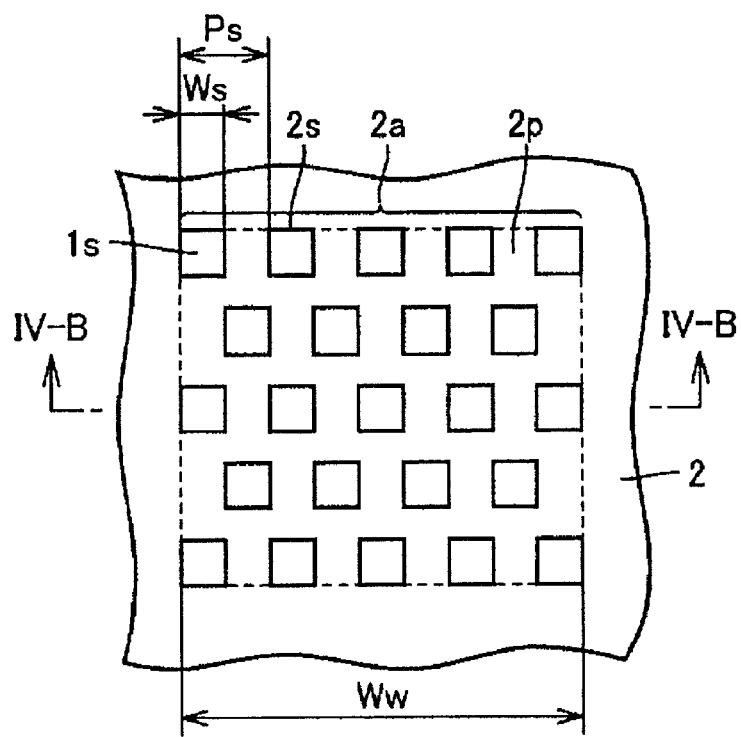
FIG. 5A shows the relationship between the windows and the micro-apertures that are formed in the mask layer, and is a top view of the mask layer formed on the starting substrate.
Figure 5B:
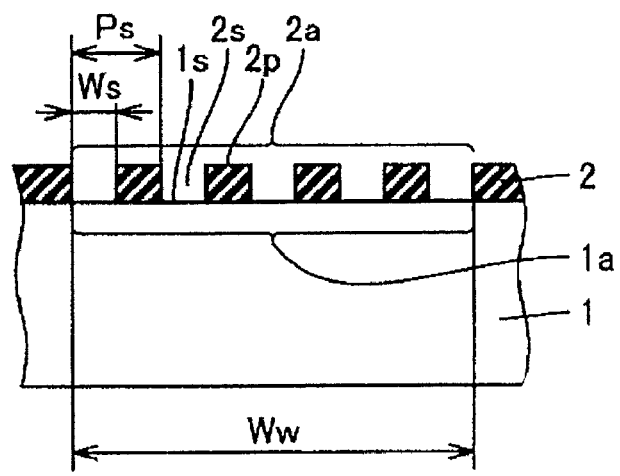
FIG. 5B shows the relationship between the windows and the micro-apertures that are formed in the mask layer, and is a cross section taken in the IV-B direction in FIG. 5A.

As illustrated in FIG. 5, the window 2a of the mask layer 2 is formed from a group of at least two micro-apertures 2s. There are no particular limitations regarding the arrangement of the micro-apertures 2s, however, from the perspective of growing a uniform Group III nitride semiconductor crystal, preferably they are arranged uniformly at a constant spacing in such a manner that the center of the micro-apertures becomes an apex of an equilateral triangle or a regular square. The width $W_S$ of the micro-apertures preferably is at least 0.5 μm but not more than 200 μm, and the pitch $P_S$ between micro-apertures preferably is at least 1 μm but not more than 250 μm. When the width $W_S$ of the micro-apertures is less than 0.5 μm, inexpensive photolithography cannot be used and this increases the manufacturing costs, whereas when over 200 μm, the effect of inhibiting cleaving in the Group III nitride semiconductor crystal is reduced. When the pitch $P_S$ of the micro-apertures is less than 1 μm, inexpensive photolithography cannot be used and this increases the manufacturing costs, whereas when over 250 μm, the effect of inhibiting cleaving in the Group III nitride semiconductor crystal is reduced.

In this mode of mode of embodiment, the small width $W_S$ and pitch $P_S$ of the micro-apertures described above allow the Group III nitride semiconductor crystal to be formed not only on the small open surface 1s within the region of the open surface 1a but also on the mask portion 2p. Further, the growth rate, impurity concentration, and off angle between the principal face and the Miller index face of the Group III nitride semiconductor crystal of this mode of mode of embodiment are the same as in Embodying Mode 1. The features of this mode of mode of embodiment can be adopted in Embodying Mode 2 and Embodying Mode 3 as well.

Embodying Mode 5

Figure 6A:
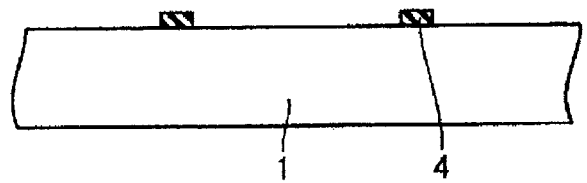
FIG. 6A is a schematic cross section for explaining yet another method for manufacturing a Group III nitride semiconductor crystal and a Group III nitride semiconductor device according to the invention, and illustrates the process of disposing a seed crystal on the starting substrate.
Figure 6B:
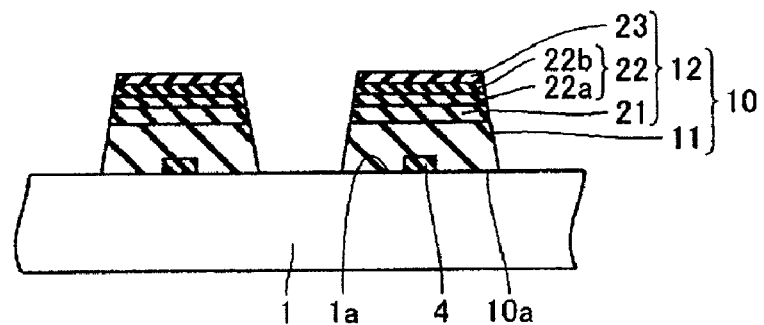
FIG. 6B is a schematic cross section for explaining yet another method for manufacturing a Group III nitride semiconductor crystal and a Group III nitride semiconductor device according to the invention, and illustrates the process of growing a Group III nitride semiconductor crystal from the seed crystal.

A yet further method for manufacturing a Group III nitride semiconductor crystal according to the invention is described with reference to FIG. 6, and as the process for growing at least one Group III nitride semiconductor crystal 10 on a starting substrate 1, includes a process of disposing at least one seed crystal 4 on the starting substrate 1 as shown in FIG. 6A, and a process of growing the Group III nitride semiconductor crystal using the seed crystal 4 as the crystal nucleus as shown in FIG. 6B. It should be noted that there are no particular limitations regarding the seed crystal, but preferably it is the same type of crystal as the Group III nitride semiconductor crystal to be grown because this yields a good-quality crystal.

Figure 6C:
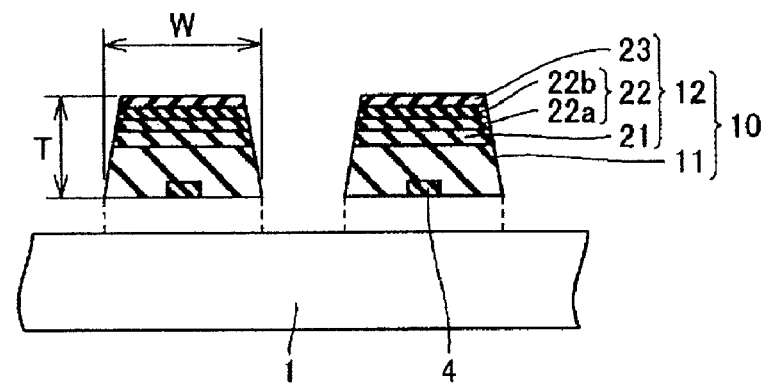
FIG. 6C is a schematic cross section for explaining yet another method for manufacturing a Group III nitride semiconductor crystal and a Group III nitride semiconductor device according to the invention, and illustrates the process of separating the Group III nitride semiconductor crystal from the starting substrate.

Placing the seed crystal on the starting substrate 1 is one method of disposing the seed crystal (Embodying Mode 5a), and allows the Group III nitride semiconductor crystal to be separated from the starting substrate 1 simply by applying a small force, as shown in FIG. 6C, because the Group III nitride semiconductor crystal 10 that is grown from the seed crystal does not adhere to the starting substrate 1 tightly. It should be noted that if it is difficult to separate the Group III nitride semiconductor crystal 10 from the starting substrate 1, then it is possible to use a laser, for example, to cleave the lower surface 10a of the Group III nitride semiconductor crystal 10 that is in contact with the starting substrate 1, or to etch this with a strong base such as KOH, to separate the Group III nitride semiconductor crystal 10 from the starting substrate 1.

Figure 7A:
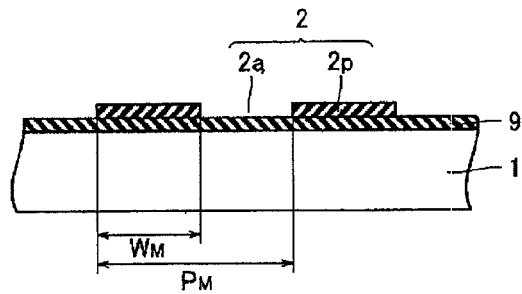
FIG. 7A is a schematic cross section for explaining yet another method for manufacturing a Group III nitride semiconductor crystal and a Group III nitride semiconductor device according to the invention, and illustrates the process of forming on the starting substrate a starting Group III nitride crystal and a mask layer having at least one window.
Figure 7B:
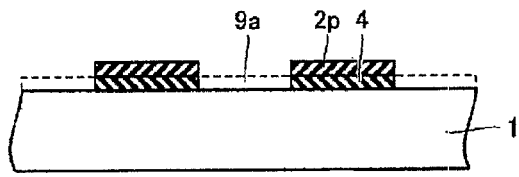
Figure 7C:
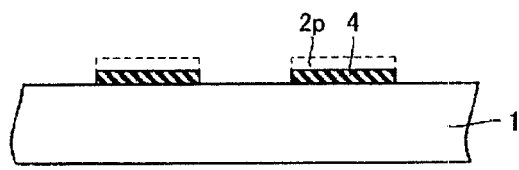
FIG. 7C is a schematic cross section for explaining yet another method for manufacturing a Group III nitride semiconductor crystal and a Group III nitride semiconductor device according to the invention, and illustrates the process of removing the mask portion and disposing a seed crystal.

Another method of disposing the seed crystal (Embodying Mode 5b) includes forming a starting Group III nitride crystal 9 on the starting substrate 1 and forming a mask layer 2 (mask portion 2p) that has at least one window 2a as illustrated in FIG. 7A, then etching the starting Group III nitride crystal 9a located below the window 2a as illustrated in FIG. 7B, and removing the mask portion 2p as shown in FIG. 7C, and disposes the remaining starting Group III nitride crystal on the starting substrate 1 as the seed crystal 4.

In Embodying Mode 5b, the Group III nitride semiconductor crystal 10 is grown from the starting Group III nitride crystal remaining as the seed crystal 4, and the Group III nitride semiconductor crystal 10 can be separated from the starting substrate 1 using a laser, for example, to cleave the lower surface 10a of the Group III nitride semiconductor crystal 10 that has been grown that is in contact with the seed crystal 4 of the starting substrate 1, or by etching the lower surface 10a with a strong base such as KOH.

In this mode of mode of embodiment (Embodying Modes 5a and 5b), the starting substrate and the seed crystal are not tightly adhered to one another, or the area of contact between the two is small, and thus it is possible to grow a Group III nitride semiconductor crystal whose width is 50,000 μm without causing cleaving.

The growth rate and the impurity concentration of the Group III nitride semiconductor crystal of this mode of mode of embodiment are the same as in Embodying Mode 1. There is a close relationship between the off angle between the principal face of the Group III nitride semiconductor crystal and its Miller index face and the off angle between the principal face and the Miller index face of the seed crystal. That is to say, when the seed crystal has a hexagonal crystal system, ordinarily it is easy to grow a Group III nitride semiconductor crystal whose principal face is the same Miller index face as the Miller index face of the principal face of the seed crystal. When the seed crystal is not a hexagonal system, the Group III nitride crystal grows easily on the face that reflects the arrangement of the atoms in the surface of the starting substrate, and for example its (0001) face grows easily on the Si (1 1 1) face. Further, the off angle between the principal face of the seed crystal and a particular Miller index face and the off angle between the principal face of the Group III nitride crystal and its Miller index face substantially match one another.

Figure 8A:
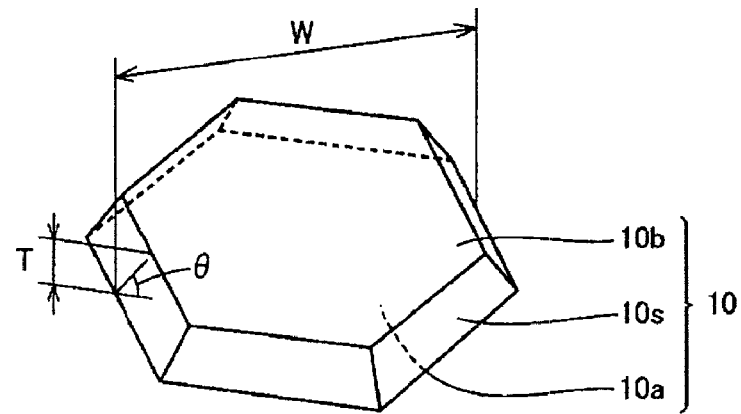
FIG. 8A is a three-dimensional schematic figure showing the shape of the Group III nitride semiconductor crystal according to the invention, and shows a hexagonal plate form.
Figure 8B:
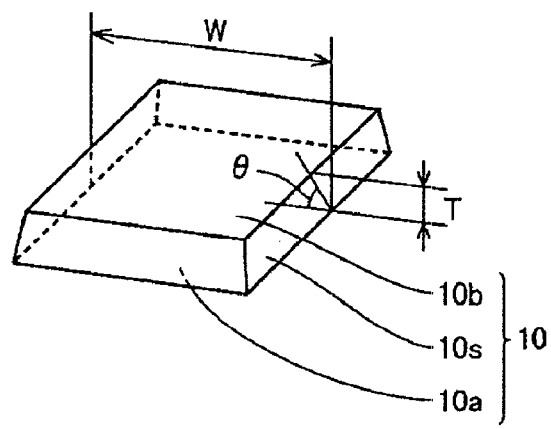
FIG. 8B is a three-dimensional schematic figure showing the shape of the Group III nitride semiconductor crystal according to the invention, and shows a rectangular plate form.
Figure 8C:
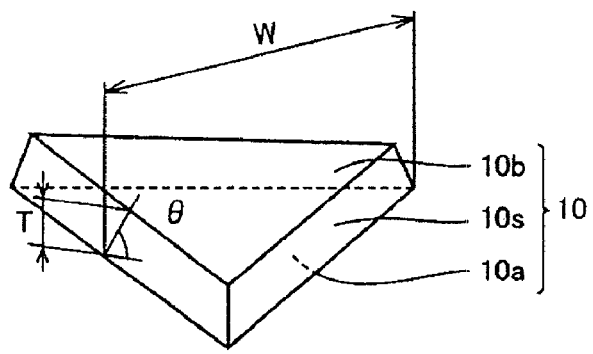
FIG. 8C is a three-dimensional schematic figure showing the shape of the Group III nitride semiconductor crystal according to the invention, and shows a triangular plate form.

Since here the Group III nitride semiconductor crystal belongs to a hexagonal or cubic system, as shown in FIG. 8 the Group III nitride semiconductor crystal 10 that is grown in Embodying Modes 1 through 5 easily takes the shape of a hexagonal plate whose lower surface 10a and upper surface 10b are hexagonal in shape (FIG. 8A), a rectangular plate whose lower surface 10a and upper surface 10b are cubic in shape (FIG. 8B), or a triangular plate whose lower surface 10a and upper surface 10b are triangular in shape (FIG. 8C). "Rectangular plate" as used here includes rectangular forms that are square, elongate, and rhomboid. Also, as shown in FIG. 8, the angle θ between the lower surface 10a and a lateral surface 10s of the hexagonal plate, rectangular plate, or triangular plate can be an angle from 30° to 90° depending on the conditions under which the crystal is grown. In particular, the value of this angle θ frequently is 60° and near 90°.

It should be noted that, as shown in FIG. 8, the width W of the Group III nitride semiconductor crystal 10 indicates the distance between one edge and the opposing edge or angle of the lower surface 10a, and the thickness T of the Group III nitride semiconductor crystal 10 indicates the distance between the lower surface 10a and the upper surface 10b.

Embodying Mode 6

A method of manufacturing a Group III nitride semiconductor device according to the invention is described with reference to FIG. 1, and includes a process of growing one or more Group III nitride semiconductor substrates 11 on a starting substrate 1 as shown in FIGS. 1A and 1B, a process of growing one or more Group III nitride semiconductor crystal layers 12 on the Group III nitride semiconductor crystal substrate(s) 11 as shown in FIG. 1B, and a process of separating the Group III nitride semiconductor crystal 10, which is constituted by the Group III nitride semiconductor crystal substrate(s) 11 and the Group III nitride semiconductor crystal layer(s) 12 from the starting substrate 1 as shown in FIGS. 1C and 1D. The method produces a Group III nitride semiconductor device in which the Group III nitride semiconductor crystal 10 is at least 10 μm and not more than 600 μm thick and at least 0.2 mm but not more than 50 mm wide.

With the method of manufacturing a Group III nitride semiconductor device according to this mode of mode of embodiment, the area of the principal face (this corresponds to the lower surface 10 shown in FIG. 1) of the Group III semiconductor crystal substrate 11 can be made smaller than the area of the principal face 1h of the starting substrate 1 as illustrated in FIG. 1. Thus, a Group III nitride semiconductor device whose size is approximately that of a semiconductor device can be produced directly and efficiently, even when a large starting substrate is used.

The method of manufacturing a Group III nitride semiconductor device according to this mode of mode of embodiment more specifically includes, as a process for growing at least one Group III nitride semiconductor crystal substrate 11 on the starting substrate 1, a process of forming a mask layer 2 that has at least one window 2a on the starting substrate 1 as shown in FIG. 1A, and a step of growing the Group III nitride semiconductor crystal substrate 11 on the open surface 1a of the starting substrate 1 located below the windows 2a of the mask 2 as shown in FIG. 1B. Here, the method and conditions for growing the Group III nitride semiconductor crystal substrate 11 are the same as the method and conditions for growing the Group III nitride semiconductor crystal 10 in Embodying Mode 1.

As illustrated by FIG. 1B, one or more Group III nitride semiconductor crystal layers 12 are then grown atop the Group III nitride semiconductor crystal substrate 11. Growing one or more Group III nitride semiconductor crystal layers 12 on a Group III nitride semiconductor crystal substrate 11 already in the form of a chip in this way allows the processing steps for processing the surface of the Group III nitride semiconductor crystal 10 made of the Group III nitride semiconductor crystal substrate(s) 11 and the Group III nitride semiconductor crystal layer(s) 12 and turning this into a chip to be eliminated. There are no particular limitations regarding the method for growing the Group III nitride semiconductor crystal layer(s) 12, and various vapor state growth methods such as HVPE, MOCVD, and MBE may be used preferably, and of these, MOCVD is particularly preferable because it yields a product whose crystal layers have excellent flatness.

FIG. 1B illustrates an example of the one or more Group III nitride semiconductor crystal layers 12 that are grown on atop the Group III nitride semiconductor crystal substrate 11, and here an n-type GaN layer serves as an n-type Group III nitride semiconductor crystal layer 21, an $In_{0.2}Ga_{0.8}N$ layer 22a and an $Al_{0.2}Ga_{0.8}N$ layer 22b serve as a light-emitting layer 22, and a p-type GaN layer serving as a p-type Group III nitride semiconductor crystal layer 23 are grown atop the Group III nitride semiconductor crystal substrate 11 in that order. Here, the n-type Group III nitride semiconductor crystal layer 21, the light-emitting layer 22, and the p-type Group III nitride semiconductor crystal layer 23 each are grown on the principal face of the Group III nitride semiconductor crystal substrate 11, that is, on the principal face that is substantially parallel to the principal face 1h of the starting substrate 1.

Next, although not shown in the drawings, a p-side electrode is formed on the uppermost surface of the Group III nitride semiconductor crystal layer 12 (here this corresponds to the upper surface of the p-type Group III nitride semiconductor crystal layer 23), and then, as shown in FIGS. 1C and 1D, the Group III nitride semiconductor crystal 10 made of the Group III nitride semiconductor crystal substrate 11 and the Group III nitride semiconductor crystal layer 12 is separated from the starting substrate 1. The method for separating the Group III nitride semiconductor crystal 10 from the starting substrate 1 is the same as that of Embodying Mode 1. In this way, the principal faces of the Group III nitride semiconductor crystal substrate 11, the Group III nitride semiconductor crystal layer 12, and the p-side electrode all are layered substantially parallel to the principal face 1h of the starting substrate 1.

Next, although not shown in the drawings, an n-side electrode is formed on the lower surface 10a of the Group III nitride semiconductor 10 that has been separated from the starting substrate 1 (here this corresponds to the lower surface of the Group III nitride semiconductor substrate 11), and in doing so a semiconductor device is produced.

As illustrated by FIG. 8, this Group III nitride crystal 10 readily takes the form of a hexagonal plate, a rectangular plate, or a triangular plate, and the angle θ between the lower surface 10a and the lateral surface 10s of this plate may be an angle between 30° to 90°, and thus the semiconductor device obtained in Embodying Mode 5 also easily takes the shape of a hexagonal plate, a rectangular plate, or a triangular plate, and the angle θ between the lateral surface and the lower surface of this plate can be an angle between 30° to 90°. Consequently, although the upper surface and the lower surface of the semiconductor device do not necessarily match one another, they are significantly thinner than the width of the semiconductor device, and thus there is little difference in size between the upper surface and the lower surface and the semiconductor device can be used as a semiconductor device as is. Further, it is also possible for the upper surface and the lower surface of the semiconductor device to be made the same size by performing cutting so that the semiconductor device's lateral surface is perpendicular to its upper and lower surfaces. It should be noted that this also applies to the semiconductor devices of Embodying Modes 7 to 10 discussed below.

The rate at which the Group III nitride semiconductor crystal substrate of this mode of embodiment is grown preferably allows growth of a Group III nitride semiconductor crystal substrate that is at least 10 μm/hr but not more than 300 μm/hr. A rate of growth that produces a Group III nitride semiconductor crystal substrate that is less than 10 μm/hr will lower manufacturing efficiency, whereas when this is greater than 300 μm/hr, defects such as holes easily occur in the Group III nitride semiconductor crystal substrate and make it more prone to cleaving.

The concentration of impurities in the Group III nitride crystal substrate of this mode of embodiment preferably is less than $5 \times 10^{19}$ cm$^{-3}$. A concentration of impurities in the Group III nitride crystal substrate in excess of $5 \times 10^{19}$ cm$^{-3}$ leads to defects readily occurring in the Group III nitride semiconductor crystal substrate and makes it more prone to cleaving.

The off angle formed between the principal face of the Group III nitride semiconductor crystal substrate of the mode of embodiment and any one of the (0001) face, (1$\bar{1}$00) face, (11$\bar{2}$0) face, (1$\bar{1}$01) face, (1$\bar{1}$02) face, (11$\bar{2}$1) face, or (11$\bar{2}$2) face preferably is 0° or more but not more than 4°. An off angle of 0° means that the principal face of the Group III nitride crystal substrate is parallel to one of the (0001) face, (1$\bar{1}$00) face, (11$\bar{2}$0) face, (1$\bar{1}$01) face, (1$\bar{1}$02) face, (11$\bar{2}$1) face, or (11$\bar{2}$2) face. An off angle greater than 4° will increase the likelihood of defects occurring in the Group III nitride crystal substrate and make it more prone to cleaving.

When the starting substrate has a hexagonal crystal system, normally it is easy to grow a Group III nitride semiconductor crystal substrate whose principal face is the same Miller index face as the Miller index face of the principal face of the starting substrate. When the starting substrate is not a hexagonal system, the Group III nitride semiconductor crystal grows easily on the face that reflects the arrangement of the atoms in the surface of the starting substrate, and for example its (0001) face easily grows on the Si (1 1 1) face. Further, the off angle between the principal face of the starting substrate and a particular Miller index face substantially matches the off angle between the principal face of the Group III nitride crystal substrate and its Miller index face.

Embodying Mode 7

A separate method for manufacturing a Group III nitride semiconductor device according to the invention is described with reference to FIG. 2, and as the process for growing at least one Group III nitride semiconductor crystal substrate 11 on the starting substrate 1, includes a process of forming a mask layer 2 that has at least one window 2a on the starting substrate 1 shown in FIG. 2A, and a process of growing a Group III nitride semiconductor crystal substrate 11 on the open surface 1a of the starting substrate located below the windows 2a of the mask layer 2 shown in FIG. 2B and atop some of the upper surface 2b of the mask layer surrounding the windows 2a. Here, the method and conditions for growing the Group III nitride semiconductor crystal substrate 11 are the same as the method and conditions for growing the Group III nitride semiconductor crystal 10 in Embodying Mode 2.

Next, as shown in FIG. 2B, one or more Group III nitride semiconductor crystal layers 12 are grown on the Group III nitride semiconductor crystal substrate as in Embodying Mode 5. A p-side electrode that is not shown in the drawings is then formed on the uppermost surface of the Group III nitride semiconductor crystal layer 12. Next, the Group III nitride semiconductor crystal 10, which is constituted by the Group III nitride semiconductor crystal substrate 11 and the Group III nitride semiconductor crystal layer 12, is separated from the starting substrate 1 like in Embodying Mode 2 as shown in FIGS. 2C and 2D. An n-side electrode that is not shown in the drawings is then formed on the lower surface 10a (this corresponds to the lower surface of the Group III nitride semiconductor substrate 11) of the Group III nitride semiconductor 10 that has been separated from the starting substrate 1, producing a semiconductor device.

The growth rate, impurity concentration, and off angle between the principal face and the Miller index face of the Group III nitride semiconductor crystal substrate of this mode of embodiment are the same as in Embodying Mode 6.

Embodying Mode 8

Another method for manufacturing a Group III nitride semiconductor device according to the invention is described with reference to FIG. 3, and as the process for growing at least one Group III nitride semiconductor crystal substrate 11 on a starting substrate 1, includes a process of forming a mask layer 2 that has at least one window 2a on the starting substrate 1 as shown in FIG. 3A, and a process of growing a Group III nitride semiconductor crystal substrate 11 on the open surface 1a of the starting substrate located below the windows 2a of the mask layer 2 as shown in FIG. 3B and growing a Group III nitride semiconductor reverse polarity crystal 3 whose polarity has been inverted atop the mask layer 2. Here, the method and conditions for growing the Group III nitride semiconductor crystal substrate 11 are the same as the method and conditions for growing the Group III nitride semiconductor crystal 10 in Embodying Mode 3.

Next, as shown in FIG. 3B, one or more Group III nitride semiconductor crystal layers 12 are grown on the Group III nitride semiconductor crystal substrate as in Embodying Mode 5. A p-side electrode that is not shown in the drawings is then formed on the uppermost surface of the Group III nitride semiconductor crystal layer 12. Next, the Group III nitride semiconductor crystal 10, which is constituted by the Group III nitride semiconductor crystal substrate 11 and the Group III nitride semiconductor crystal layer 12, is separated from the starting substrate 1 like in Embodying Mode 3 as shown in FIGS. 3C and 3D. An n-side electrode that is not shown in the drawings is then formed on the lower surface 10a (this corresponds to the lower surface of the Group III nitride semiconductor crystal substrate 11) of the Group III nitride semiconductor 10 that has been separated from the starting substrate, producing a semiconductor device.

The growth rate, impurity concentration, and off angle between the principal face and the Miller index face of the Group III nitride semiconductor crystal substrate of this mode of embodiment are the same as in Embodying Mode 6.

Embodying Mode 9

A yet further method for manufacturing a Group III nitride semiconductor device according to the invention is described with reference to FIG. 4, and as the process for growing at least one Group III nitride semiconductor crystal substrate 11 on a starting substrate 1, includes a process of forming a mask layer 2 that has at least one window 2a formed from a group of at least two micro-apertures 2s on the starting substrate 1 as shown in FIG. 4A, a process of growing the Group III nitride semiconductor crystal substrate 11 at least on the open surface 1a of the starting substrate 1 located below the windows 2a of the mask layer 2 as shown in FIG. 4B, and also as shown in FIG. 4B, a process of growing at least one Group III nitride semiconductor crystal layer 12 on the Group III nitride semiconductor crystal substrate 11.

As the windows 2a increases in size, cracks are increasingly likely to occur in the Group III nitride semiconductor crystal substrate 11 that is grown, however, forming the windows 2a as a group of micro-aperture portions 2s allows cleaving in the Group III nitride semiconductor crystal substrate 11 to be inhibited. The effect of inhibiting cleaving in the Group III nitride semiconductor crystal substrate through micro-apertures is that a Group III nitride crystal substrate whose width (which is substantially equal to the width of the window portion) is particularly large at 200 μm or more can be grown, and it is possible to grow a Group III nitride semiconductor crystal whose width is 50,000 μm without allowing cleaving to occur.

As illustrated in FIG. 5, the windows 2a of the mask layer 2 is made of a group of at least two micro-apertures 2s. There are no particular limitations regarding the arrangement of the micro-apertures 2s, however, from the perspective of growing a uniform Group III nitride semiconductor crystal, preferably they are arranged uniformly at a constant spacing in such a manner that the center of the micro-apertures is the apex of an equilateral triangle or a regular square. The width $W_S$ of the micro-apertures preferably is at least 0.5 μm but not more than 200 μm, and the pitch $P_S$ between micro-apertures preferably is at least 1 μm but not more than 250 μm. When the width $W_S$ of the micro-apertures is less than 0.5 μm, inexpensive photolithography cannot be used and this increases the manufacturing costs, whereas when over 200 μm, the effect of inhibiting cleaving in the Group III nitride semiconductor crystal substrate is reduced. When the pitch $P_S$ of the micro-apertures is less than 1 μm, inexpensive photolithography cannot be used and this increases the manufacturing costs, whereas when over 250 μm, the effect of inhibiting cleaving in the Group III nitride semiconductor crystal substrate is reduced.

In this mode of embodiment, the small width $W_S$ and the pitch $P_S$ of the windows described above allow the Group III nitride semiconductor crystal substrate to be formed not only on the small open surface 1s within the region of the open surface 1a but also on the mask portion 2p. Further, the growth rate, impurity concentration, and off angle between the principal face and the Miller index face of the Group III nitride semiconductor crystal substrate of this mode of embodiment are the same as in Embodying Mode 6. The features of this mode of embodiment can be adopted in Embodying Mode 7 and Embodying Mode 8 as well.

Embodying Mode 10

A yet further method for manufacturing a Group III nitride semiconductor device according to the invention is described with reference to FIG. 6, and as the process for growing at least one Group III nitride semiconductor crystal substrate 11 on a starting substrate 1, includes a process of disposing at least one seed crystal 4 on the starting substrate 1 as shown in FIG. 6A, and a process of growing a Group III nitride semiconductor crystal substrate 11 using the seed crystal 4 as the crystal nucleus as shown in FIG. 6B. There are no particular limitations regarding the seed crystal, but preferably it is the same type of crystal as the Group III nitride semiconductor crystal substrate to be grown because this yields a good-quality crystal.

Next, as shown in FIG. 6B, one or more Group III nitride semiconductor crystal layers 12 are grown on the Group III nitride semiconductor crystal substrate 11 as in Embodying Mode 5. A p-side electrode that is not shown in the drawings is then formed on the uppermost surface of the Group III nitride semiconductor crystal layer 12.

Next, the Group III nitride semiconductor crystal 10, which is constituted by the Group III nitride semiconductor crystal substrate 11 and the Group III nitride semiconductor crystal layer 12, is separated from the starting substrate 1 like in Embodying Mode 5 as shown in FIG. 6C. In this mode of embodiment, if the seed crystal 4 has been placed on the starting substrate 1 as in Embodying Mode 5a (Embodying Mode 10a), then the Group III nitride semiconductor crystal 10 grown from the seed crystal 4 does not adhere tightly to the starting substrate 1 and thus the Group III nitride semiconductor crystal 10 can be separated from the starting substrate 1 simply by applying a small force.

Another method of disposing the seed crystal (Embodying Mode 10b) includes forming a starting Group III nitride crystal 9 on the starting substrate 1 and forming a mask layer 2 (mask portion 2p) that has at least one window 2a as illustrated in FIG. 7A, then etching the starting Group III nitride crystal 9a located below the windows 2a as illustrated in FIG. 7B, and removing the mask portion 2p as illustrated in FIG. 7C, and disposes the remaining starting Group III nitride crystal on the starting substrate 1 as the seed crystal 4.

Figure 7D:
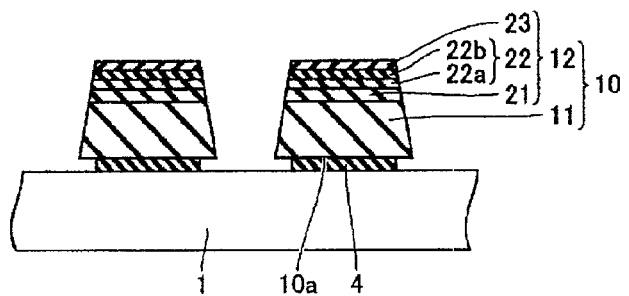
FIG. 7D is a schematic cross section for explaining yet another method for manufacturing a Group III nitride semiconductor crystal and a Group III nitride semiconductor device according to the invention, and illustrates the process of growing a Group III nitride semiconductor crystal from the seed crystal.
Figure 7E:
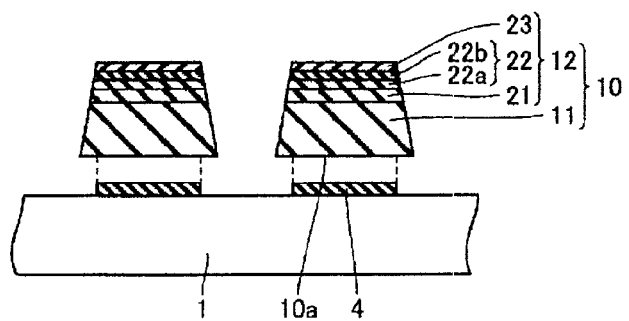
FIG. 7E is a schematic cross section for explaining yet another method for manufacturing a Group III nitride semiconductor crystal and a Group III nitride semiconductor device according to the invention, and illustrates the process of separating the Group III nitride semiconductor crystal from the starting substrate.

In Embodying Mode 10b, the Group III nitride semiconductor crystal substrate 11 is grown from the remaining starting Group III nitride crystal acting as the seed crystal 4, at least one Group III nitride semiconductor crystal layer 12 is grown on the Group III nitride semiconductor crystal substrate 11 to form the Group III nitride semiconductor crystal 10 (see FIG. 7D), and the Group III nitride semiconductor crystal 10 can be separated from the starting substrate 1 using a laser, for example, to cleave the lower surface 10a of the Group III nitride semiconductor crystal 10 that is in contact with the seed crystal 4 of the starting substrate 1, or etching the lower surface 10a with a strong base such as KOH (see FIG. 7E).

In this mode of embodiment (Embodying Modes 10a and 10b), the starting substrate and the seed crystal are not tightly adhered to one another, or the area of contact between the two is small, and thus it is possible to grow a Group III nitride semiconductor crystal whose width is 50,000 μm without causing cleaving.

An n-side electrode that is not shown in the drawings is then formed on the lower surface 10a (this corresponds to the lower surface of the Group III nitride semiconductor crystal substrate 11) of the Group III nitride semiconductor crystal 10 that has been separated from the starting substrate 1, yielding a semiconductor device.

In Embodying Modes 6 through 10, when removing the Group III nitride semiconductor crystal 10 from the starting substrate 1 through laser irradiation or etching, peaks and valleys are formed in the rear surface of the Group III nitride semiconductor crystal substrate 11 that serves as the separation surface (by this meaning the surface on which the Group III nitride semiconductor crystal layer has not been formed; hereinafter the same) (corresponds to the lower surface 10a of the Group III nitride semiconductor crystal 10 in FIGS. 1 through 4, 6, and 7). The presence of these peaks and valleys in its surface increases the efficiency with which light is taken up. The surface roughness $R_{P-V}$ of this surface having peaks and valleys preferably is at least 0.01 μm but not more than 50 μm. An $R_{P-V}$ less than 0.01 μm reduces the effect of an increase in the light take-up efficiency, whereas an $R_{P-V}$ greater than 50 μm makes it difficult to form the n-side electrode. Here, the surface roughness $R_{P-V}$ of this surface having peaks and valleys refers to the maximum vertical distance between the peaks and valleys of the uneven surface. It should be noted that the surface roughness $R_{P-V}$ of this surface having peaks and valleys can be measured using a laser interferometer.

Embodying Mode 11

Figure 9:
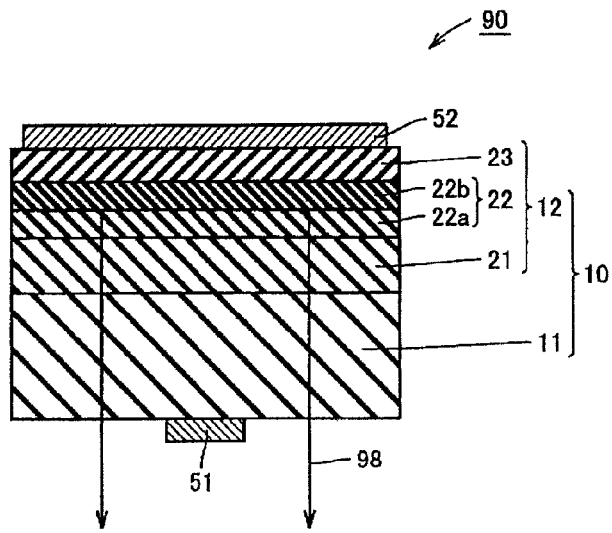
FIG. 9 is a schematic cross section showing a Group III nitride semiconductor device according to the invention.

One semiconductor device according to the invention is described in reference to FIG. 9, and is a Group III nitride semiconductor device that includes a Group III nitride semiconductor crystal 10 that is constituted by a Group III nitride semiconductor crystal substrate 11 and at least one Group III nitride semiconductor crystal layer 12 that has been grown thereon. The Group III nitride semiconductor device having this structure can be produced more efficiently with fewer process steps than conventionally.

As shown in FIG. 9, the semiconductor device more specifically is a Group III nitride semiconductor device 90 that functions as an LED, in which an n-type GaN layer serving as an n-type Group III nitride semiconductor crystal layer 21, an $In_{0.2}Ga_{0.8}N$ layer 22a and an $Al_{0.2}Ga_{0.8}N$ layer 22b serving as a light-emitting layer 22, and a p-type GaN layer serving as a p-type Group III nitride semiconductor crystal layer 23 are grown in that order atop the Group III nitride semiconductor crystal substrate 11 as the one or more Group III nitride semiconductor crystal layers 12, and also an n-side electrode 51 is formed on the lower surface of the Group III nitride semiconductor crystal 10 (this corresponds to the lower surface of the Group III nitride semiconductor crystal substrate 11) and a p-side electrode 52 is formed on the upper surface of the Group III nitride semiconductor crystal 10 (this corresponds to the upper surface of the p-type nitride semiconductor crystal layer 23), and this Group III nitride semiconductor device 90 emits emission rays 98. It should be noted that the light-emitting layer 22 also can have a MQW (Multi-Quantum Well) structure that is achieved by layering multiple units of a two-layered structure composed of a GaN layer and an $In_{0.2}Ga_{0.8}N$ layer.

Embodying Mode 12

Figure 10:
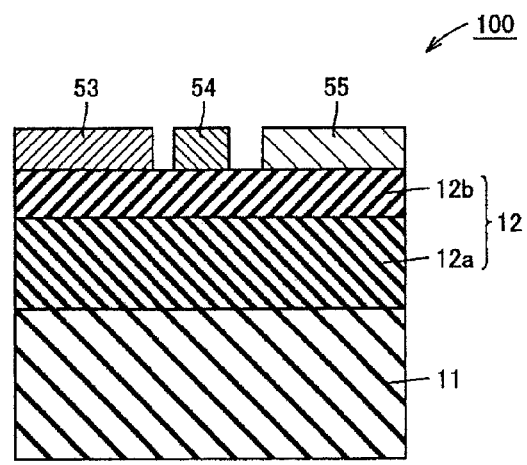
FIG. 10 is a schematic cross section showing another Group III nitride semiconductor device according to the invention.

A separate semiconductor device according to the invention specifically is a semiconductor device 100 that functions as a HEMT (High Electron Mobility Transistor) in which, as illustrated by FIG. 10, an i-type GaN layer 12a and an i-type $Al_xGa_{1-x}N$ layer ($0 \leq x \leq 1$) 12b are formed in that order as the one or more Group III nitride semiconductor crystal layers 12 on a GaN substrate serving as the Group III nitride semiconductor crystal substrate 11, and then a source electrode 53, a gate electrode 54, and a drain electrode 55 are formed on the upper surface of the i-type $Al_xGa_{1-x}N$ layer 12b.

Embodying Mode 13

Figure 11:
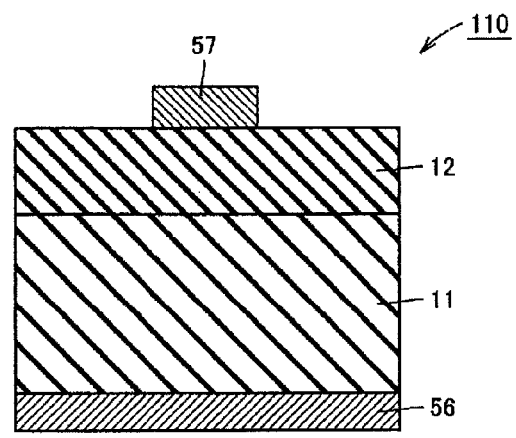
FIG. 11 is a schematic cross section showing yet another Group III nitride semiconductor device according to the invention.

Another separate semiconductor device according to the invention specifically is a semiconductor device 110 that functions as a Schottky diode in which, as illustrated in FIG. 11, an n⁻ GaN layer is formed as the one or more Group III nitride semiconductor crystal layers 12 on a GaN substrate serving as the Group III nitride semiconductor crystal substrate 11, and then an ohmic electrode 56 is formed on the lower surface of the Group III nitride semiconductor crystal substrate 11 and a Schottky electrode 57 is formed on the upper surface of the n⁻ GaN layer.

Embodying Mode 14

Figure 12:
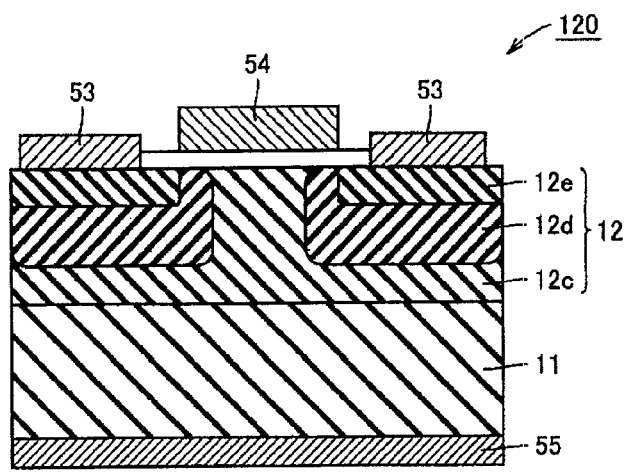
FIG. 12 is a schematic cross section showing a yet further Group III nitride semiconductor device according to the invention.

A further separate semiconductor device according to the invention specifically is a semiconductor device 120 that functions as a vertical MIS (Metal Insulator Semiconductor) transistor in which, as illustrated in FIG. 12, an n⁻ GaN layer 12c is formed as the one or more Group III nitride semiconductor crystal layers 12 on a GaN substrate serving as the Group III nitride semiconductor crystal substrate 11, a p-type layer 12d and an n⁺ layer 12e are formed in a region of the n⁻ GaN layer 12c, and then a drain electrode 55 is formed on the lower surface of the Group III nitride semiconductor crystal substrate 11, a gate electrode 54 is formed on the upper surface of the n⁻ GaN layer, and a source electrode 53 is formed on the upper surface of the n⁺ layer 12e.

Embodying Mode 15

Figure 13:
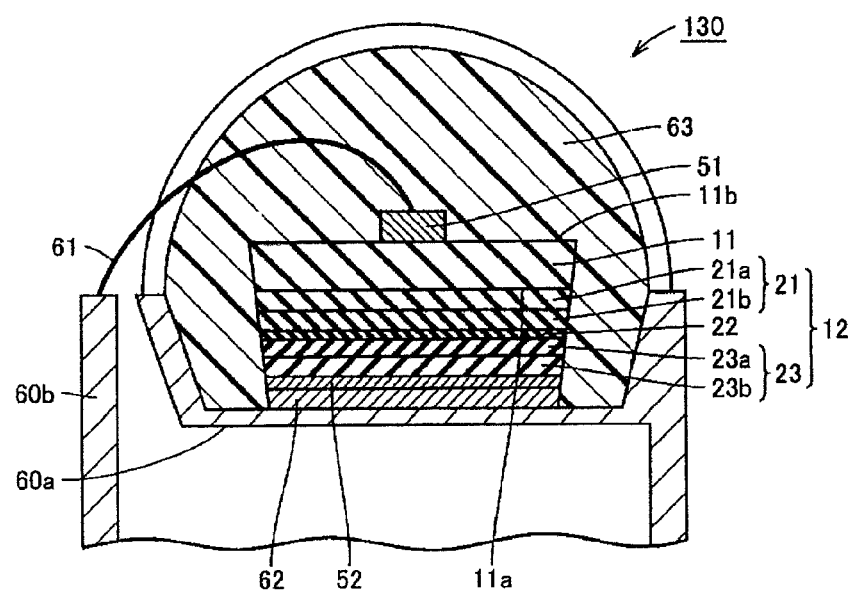
FIG. 13 is a schematic cross section showing a light-emitting appliance according to the invention.

A light-emitting appliance according to the invention as illustrated in FIG. 13 is a light-emitting appliance 130 that includes one of the foregoing Group III nitride semiconductor devices, and the Group III nitride semiconductor device characterized in that it is provided with a Group III nitride semiconductor crystal substrate 11, and, on a first principal face 11a side of the Group III nitride semiconductor crystal substrate, an n-type Group III nitride semiconductor layer 21, a p-type Group III nitride semiconductor crystal layer 23 farther from the Group III nitride semiconductor substrate 11 than the n-type Group III nitride semiconductor layer 21, and a light-emitting layer 22 located between the n-type Group III nitride semiconductor layer 21 and the p-type Group III nitride semiconductor crystal layer 23, and also characterized in that the Group III nitride semiconductor crystal substrate 11 resistance is 0.5 Ω·m or less, the p-type Group III nitride semiconductor layer 23 side is installed down, and light is radiated from the second principal face 11b, which is the principal face opposite the first principal face, of the Group III nitride semiconductor crystal substrate 11.

In this structure, a n-side electrode is provided on the rear face (second principal face 11b) of a low-resistance nitride semiconductor substrate, thus allowing current to flow through the entire nitride semiconductor substrate even if the n-side electrode has a small coverage, that is, a large numerical window. The amount of light absorbed by the radiation surface thus becomes small and allows the light-emission efficiency to be increased. Of course, it is also possible for light to be radiated from a lateral face as well as the second principal face. The same applies for the following light-emitting appliances as well.

Since the light-emission face is not on the high-resistance p-type nitride semiconductor layer 23 side, the p-side electrode 52 can be formed over the entire surface of the p-type nitride semiconductor layer 23, and this structure is advantageous because it inhibits the generation of heat secondary to the flow of a large current as well as allows the heat that has been generated to escape through conduction. To put it differently, this structure allows restrictions arising from heat-related requirements to be eased significantly. For this reason, it is not necessary to adopt a comb-shaped structure that incorporates p-side and n-side electrodes in order to lower the electrical resistance.

Embodying Mode 16

A separate light-emitting appliance according to the invention is illustrated in FIG. 13 and is a light-emitting appliance 130 that includes one of the foregoing Group III nitride semiconductor devices, and the Group III nitride semiconductor device is characterized in that it is provided with a GaN substrate as the Group III nitride semiconductor crystal substrate 11, and, on the first principal face side of the GaN substrate, an n-type $Al_xGa_{1-x}N$ layer ($0 \leq x \leq 1$) serving as the n-type Group III nitride semiconductor layer 21, a p-type $Al_xGa_{1-x}N$ layer ($0 \leq x \leq 1$) serving as a p-type Group III nitride semiconductor crystal layer 23 located farther from the GaN substrate than the $Al_xGa_{1-x}N$ layer, and a light-emitting layer 22 located between the n-type $Al_xGa_{1-x}N$ layer and the p-type $Al_xGa_{1-x}N$ layer, and also characterized in that the GaN substrate dislocation density is not more than $10^8$/cm², the device is mounted with its p-type $Al_xGa_{1-x}N$ layer side down, and light is radiated from the second principal face 11b, which is the principal face opposite the first principal face of the GaN substrate.

With the above structure, the GaN substrate of the invention is assumed to be conductive and its electrical resistance can be lowered easily, and thus, in addition to the action and effect of the above light-emitting appliance, the GaN substrate has a dislocation density of $10^8$/cm² and thus a high degree of crystallinity, and its high numerical window allows the light output from the second principal face to be increased. Light also is radiated from the lateral surface.

The excellent conductivity of the GaN substrate obviates any express need to provide a protective circuit to protect against surge voltage, and it has superb resistance to pressure as well. Further, the lack of complex processing steps allows manufacturing costs to be curbed with ease.

In the light-emitting appliance of this mode of embodiment, it is preferable that the GaN substrate, which is a Group III nitride crystal substrate, is provided with n-type character by doping with Si (silicon) and/or O (oxygen), that the O atom density is in the range of $1 \times 10^{17}$ cm⁻³ to $5 \times 10^{19}$ cm⁻³, and that the GaN substrate is at least 100 µm but not more than 600 µm thick. The Si atom and/or O atom density of the substrate significantly impacts the resistivity and the light transmittance of the substrate, and the thickness of a substrate significantly affects its light transmittance. An Si atom and/or O atom density less than $1 \times 10^{17}$ cm⁻³ results in a large light transmittance but also results in a large resistivity, whereas when this is over $5 \times 10^{19}$ cm⁻³ the resistivity becomes small but the light transmittance also becomes small, and in both cases the end result is a drop in light-emission efficiency. When the substrate is less than 100 µm thick there is a drop in its mechanical strength, whereas a substrate thickness over 600 µm will result in a drop in light transmittance and lower the light-emission efficiency.

From the standpoint of increasing the emission efficiency, it is more preferable that the Si atom and/or O atom density is at least $5 \times 10^{18}$ cm⁻³ but not more than $2 \times 10^{19}$ cm⁻³, the substrate is at least 200 µm but not more than 600 µm thick, and the width of both rectangular faces that radiate the light of the second principal face is not more than 50 mm, that the Si atom and/or O atom density is at least $3 \times 10^{18}$ cm⁻³ but not more than $5 \times 10^{18}$ cm⁻³, the substrate is at least 400 µm but not more than 600 µm thick, and the width of both rectangular faces that radiate the light of the second principal face is not more than 3 mm, and that the Si atom and/or O atom density is at least $5\times10^{18}$ cm$^{-3}$ but not more than $5\times10^{19}$ cm$^{-3}$, the substrate is at least 100 μm but not more than 200 μm thick, and the width of both rectangular faces that radiate the light of the second principal face is not more than 3 mm.

The light-emitting appliance of this mode of embodiment preferably further includes a p-type GaN buffer layer in contact with the p-type $Al_xGa_{1-x}N$ layer ($0\leq x\leq1$) on the down side, and a p-type $In_yGa_{1-y}N$ contact layer ($0\leq y\leq1$) in contact with the p-type GaN buffer layer. Supplying a p-type GaN buffer layer increases the hole density and in turn increases the light-emission efficiency. Providing a p-type $In_yGa_{1-y}N$ contact layer allows the contact resistance with the p-side electrode to be reduced. Further, it is preferable that the Mg atom density of the p-type $In_yGa_{1-y}N$ contact layer is at least $1\times10^{18}$ cm$^{-3}$ but not more than $1\times10^{21}$ cm$^{-3}$. A Mg atom density less than $1\times10^{18}$ cm$^{-3}$ lowers the layer's ability to reduce contact resistance, whereas when this is greater than $1\times10^{21}$ cm$^{-3}$, the crystallinity of the p-type $In_yGa_{1-y}N$ contact layer becomes poor and its ability to reduce contact resistance drops. The p-side electrode that is in contact with the p-type $In_yGa_{1-y}N$ contact layer preferably is formed from any one of Ag, Al, or Rh. Forming the p-side electrode from any one of Ag, Al, or Rh increases the reflectance from the portion of the element that is mounted, that is, the bottom of the light-emitting element, and this allows the amount of light that is lost to be reduced and increases the light output.

Embodying Mode 17

A separate light-emitting appliance according to the invention is illustrated in FIG. 13 and is a light-emitting appliance 130 that includes one of the foregoing Group III nitride semiconductor devices, and the Group III nitride semiconductor device is characterized in that it is provided with an AlN substrate as the Group III nitride semiconductor crystal substrate 11, and, on the first principal face side of the AlN substrate, an n-type $Al_xGa_{1-x}N$ layer ($0\leq x\leq1$) serving as the n-type Group III nitride semiconductor layer 21, a p-type $Al_xGa_{1-x}N$ layer ($0\leq x\leq1$) serving as a p-type Group III nitride semiconductor crystal layer 23 located farther from the AlN substrate than the $Al_xGa_{1-x}N$ layer, and a light-emitting layer located between the n-type $Al_xGa_{1-x}N$ layer and the p-type $Al_xGa_{1-x}N$ layer, and also is characterized in that the AlN substrate has a thermal conductivity of at least 100 W/(m·K), the p-type $Al_xGa_{1-x}N$ layer side is installed down, and light is radiated from the second principal face, which is the principal face opposite the first principal face, of the AlN substrate.

AlN has exceptionally high thermal conductivity and an excellent ability to radiate heat, and thus heat can be transmitted from the p-type $Al_xGa_{1-x}N$ layer to a lead frame, for example, to keep the temperature of the light-emitting appliance from rising. Heat also is dissipated from the AlN substrate, and this can contribute to inhibiting a rise in temperature.

The light-emitting appliance of this mode of embodiment preferably is provided with a first p-side electrode that is in contact with and discretely disposed over the surface of the p-type nitride semiconductor crystal layer, and a second p-side electrode made from whichever of Ag, Al, or Rh that is filled in the gaps in the first p-electrode and covers the p-type nitride semiconductor layer and the first p-side electrode. Providing such first and second p-side electrode allows the current that is introduced to the p-electrodes to sufficiently spread out within the surface, and increases the reflectance, which in turn improves light output. It is preferable that the first p-electrode covers at least 10% but not more than 40% of the surface of the p-type nitride semiconductor layer. When the first p-electrode covers less than 10% of the surface of the p-type nitride semiconductor layer, current cannot spread out over the entire epitaxial surface uniformly, and when greater than 40%, the negative effect that the discretely-disposed p-side electrode has on the light take-up efficiency cannot be ignored.

It should be noted that in all modes of embodiment, to reduce defect density, an effective crystal for the starting substrate 1 has the same crystal structure and lattice constant as the crystal layers making up the device, and for example, if a GaN crystal is used as the starting substrate 1, then it is most preferable that a GaN crystal and a GaN layer are layered as the Group III nitride crystal 11 and the Group III nitride semiconductor layer 12, respectively. It is also preferable that the crystal structures are the same and the lattice constants are close, and for example, if a AlN crystal or a SiC crystal is used as the starting substrate 1, then preferably a GaN crystal and a GaN layer are layered as the Group III nitride crystal 11 and the Group III nitride semiconductor layer 12, respectively.

Embodiments

The following describes specific implementations of semiconductor devices manufactured based on the methods for manufacturing Group III nitride semiconductor crystals according to the invention, and comparative examples of semiconductor devices manufactured based on conventional methods for manufacturing Group III nitride semiconductor crystals.

Comparative Example 1

Figure 14A:
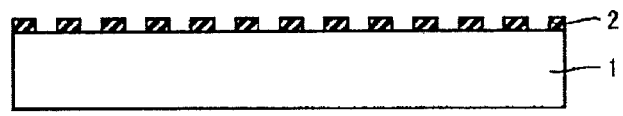
FIG. 14A is a schematic cross section for explaining a conventional method for manufacturing a Group III nitride semiconductor device, and illustrates the process of forming on a starting substrate a mask layer having windows.

Description is made with reference to FIG. 14, and as shown in FIG. 14A, a 50 nm thick $SiO_2$ layer was sputtered as a mask layer 2 on a 30 mm×30 mm×400 μm thick sapphire substrate acting as a starting substrate 1 (1$^{st}$ Step), then photolithography ensued to provide rectangular windows having 4 μm aperture widths at 8 μm spacing (2$^{nd}$ Step).

Figure 14B:
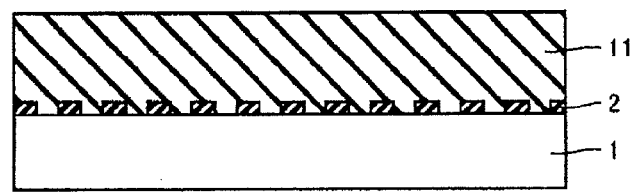
FIG. 14B is a schematic cross section for explaining a conventional method for manufacturing a Group III nitride semiconductor device, and illustrates the process of growing a Group III nitride semiconductor crystal on the starting substrate and the mask layer.
Figure 14C:
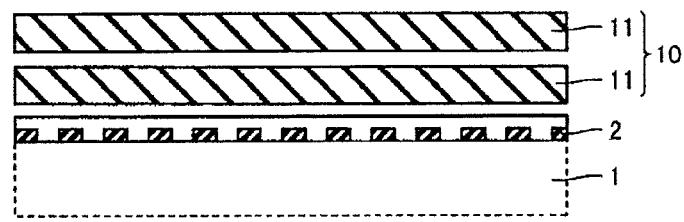
FIG. 14C is a schematic cross section for explaining a conventional method for manufacturing a Group III nitride semiconductor device, and illustrates the process of slicing and polishing the Group III nitride semiconductor crystal to form a Group III nitride semiconductor crystal substrate.

Next, as shown in FIG. 14B, a 1300 μm thick GaN crystal was grown as a Group III nitride semiconductor crystal substrate 11 on the starting substrate 1 and the mask layer 2 through HVPE under the conditions of GaCl gas flow rate 35 sccm (1 sccm indicates a 1 cm$^3$ min$^{-1}$ flow rate of gas under standard conditions (1013 hPa, 0° C.); hereinafter the same), $NH_3$ gas flow rate 6000 sccm, growth temperature 1050° C., and growth time 15 hours (3$^{rd}$ Step). The sapphire starting substrate 1 was then ground off as illustrated in FIG. 14C (4$^{th}$ Step), and the GaN crystal was sliced by an internal blade (5$^{th}$ Step) into two 550 μm thick GaN substrates.

Each GaN substrate was attached to the crystal holder of a grinding/polishing machine (6$^{th}$ Step), the Ga surface (atomic surface made of Ga atoms) side of the GaN substrate was ground (7$^{th}$ Step), the GaN substrate was removed from the crystal holder, turned upside down and placed in the crystal holder again (8$^{th}$ Step), the N surface (atomic surface made of N atoms) side of the GaN substrate was ground (9$^{th}$ Step), the N surface side of the GaN substrate was polished (10$^{th}$ Step), the GaN substrate was removed from the crystal holder, turned upside down and placed in the crystal holder again (11$^{th}$ Step), the Ga surface side was polished (12$^{th}$ Step), the GaN substrate was removed from the crystal holder (13$^{th}$ Step), and the then GaN substrate was cleaned (14$^{th}$ Step), producing a 400 μm thick GaN substrate as the Group III nitride semiconductor crystal substrate 11.

Figure 14D:
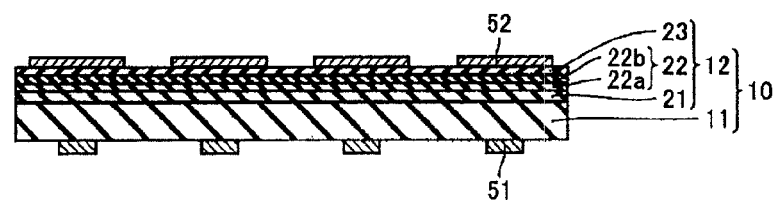
FIG. 14D is a schematic cross section for explaining a conventional method for manufacturing a Group III nitride semiconductor device, and illustrates the process of forming Group III nitride semiconductor crystal layers and electrodes on the Group III nitride semiconductor crystal substrate.
Figure 14E:
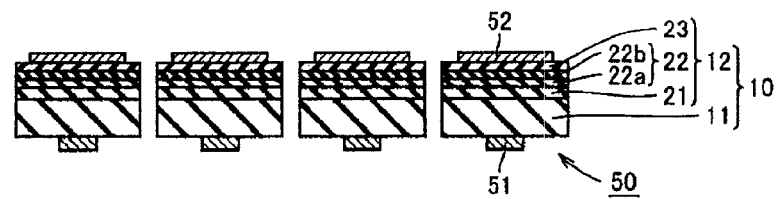
FIG. 14E is a schematic cross section for explaining a conventional method for manufacturing a Group III nitride semiconductor device, and illustrates the process of turning the layered Group III nitride semiconductor crystal unit into chips.

MOCVD was employed to grow a 5 μm thick n-type GaN layer 21, a 3 nm thick $In_{0.2}Ga_{0.8}N$ layer 22, a 60 nm thick $Al_{0.2}Ga_{0.8}N$ layer 23, and a 150 nm thick p-type GaN layer 24, in that order, as the one or more Group III nitride semiconductor crystal layers 12 on the 400 μm thick GaN substrate (Group III nitride semiconductor substrate 11) as shown in FIG. 14D (15$^{th}$ Step). Next, an 80 μm diameter, 100 nm thick n-side electrode 51 was formed at the position that will become the center of the lower surface of the GaN substrate when separated into chips (16$^{th}$ Step), and a 100 nm thick p-side electrode 52 was formed on the upper surface of the p-type GaN layer 24 (17$^{th}$ Step). Next, as illustrated by FIG. 14E, the Group III nitride semiconductor crystal 10 was divided into chips each 400 μm×400 μm (18$^{th}$ Step), forming Group III nitride semiconductor devices 50 that are LEDs. Thus, this conventional method requires 18 processing steps to produce an LED. The surface roughness $R_{P-V}$ of the rear surface having peaks and valleys of the GaN substrate of this LED was measured by laser interferometer and found to be 0.004 μm. This LED had a light-emission spectrum with a peak wavelength of 450 nm. The strength of the light-emission spectrum at this peak wavelength divided by the area of the principal face, that is, the strength per unit area, was regarded as 1.0, and used to evaluate the relative strength per unit area of the emission spectra at the peak wavelength 450 nm of the LEDs in the following implementations. A spectrophotometer was used to measure the LED emission spectra. The results are shown in Table I.

Embodiment 1

This embodiment is an implementation of Embodying Mode 6. Description is made with reference to FIG. 1, and as shown in FIG. 1A, a 50 nm thick SiN layer was sputtered as a mask layer 2 on a 400 μm thick sapphire substrate serving as a starting substrate 1 (1$^{st}$ Step), then photolithography ensued to provide rectangular windows each having a 400 μm aperture width $W_W$ at a 410 μm window pitch $P_W$ (2$^{nd}$ Step).

Next, as shown in FIG. 1B, a crystal was grown by HVPE under the conditions of GaCl gas flow rate 100 sccm, $NH_3$ gas flow rate 6000 sccm, growth temperature 1050° C., and growth time 20 minutes (0.33 hours) (3$^{rd}$ Step), yielding a 400 μm×400 μm×25 μm thick GaN substrate as a Group III nitride semiconductor crystal substrate 11 on only the open surface 1a of the starting substrate 1. Then, as in the Comparative Example 1, MOCVD was used to grow an n-type GaN layer serving as the n-type nitride semiconductor crystal layer 21, a $In_{0.2}Ga_{0.8}N$ layer 22a and a $Al_{0.2}Ga_{0.8}N$ layer 22b serving as the light-emitting layer 22, and a p-type GaN layer serving as the p-type nitride semiconductor crystal layer 23, in that order, as the one or more Group III nitride semiconductor crystal layers 12 on the Group III nitride semiconductor crystal substrate 11 (4$^{th}$ Step).

Next, although not shown in the drawing, a 100 nm thick p-side electrode was formed on the upper surface of the p-type nitride semiconductor crystal layer 23 (5$^{th}$ Step), then, as illustrated by FIG. 1C, an excimer laser (250 nm wavelength) was irradiated on the interface between the Group III nitride semiconductor crystal 10 and the starting substrate 1 to separate the Group III nitride semiconductor crystal 10 and the starting substrate 1 (6$^{th}$ Step). Next, an 80 μm diameter, 100 nm thick n-side electrode that also is not shown was formed in the center portion of the lower surface of the GaN substrate of the Group III nitride semiconductor crystal 10 (7$^{th}$ Step), producing the LED of this implementation. The surface roughness $R_{P-V}$ of the rear surface having peaks and valleys of the GaN substrate of this LED was 0.035 μm.

Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.1. The results are shown in Table I.

Embodiment 2

This embodiment is an implementation that corresponds to Embodying Mode 6, and relates to an LED that is larger than that of Embodiment 1. That is, except that the windows in the mask layer were formed at a 3010 μm window pitch $P_W$ and 3000 μm aperture width $W_W$ to produce a 3000 μm×3000 μm×25 μm thick GaN substrate on the open surface of the starting layer, an LED was formed through the same processes as in Embodiment 1. Thus, the total number of process steps was seven like in Embodiment 1. The surface roughness $R_{P-V}$ of the rear surface having peaks and valleys of the GaN substrate of this LED was 0.048 μm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.1. The results are shown in Table I.

Embodiment 3

This embodiment is an implementation of Embodying Mode 7. Description is made with reference to FIG. 2, and as shown in FIG. 2A, a 50 nm thick $SiO_2$ layer was sputtered as a mask layer 2 on a 400-μm thick GaN substrate serving as a starting substrate 1 (1$^{st}$ process), then photolithography ensued to form rectangular windows each having a 100 μm aperture width $W_W$ at a 400 μm window pitch $P_W$ (2$^{nd}$ Step).

Next, as shown in FIG. 2B, a crystal was grown through HVPE under the conditions of GaCl gas flow rate 130 sccm, $NH_3$ gas flow rate 6000 sccm, growth temperature 1050° C., and growth time 50 minutes (0.83 hours) (3$^{rd}$ Step), yielding a 300 μm×300 μm×85 μm thick GaN substrate as a Group III nitride semiconductor crystal substrate 11 on the open surface 1a of the starting substrate 1 located below the windows 2a of the mask layer 2 and on some of the upper surface 2b of the mask layer surrounding the windows 2a. Then, as in Embodiment 1, MOCVD was employed to grow an n-type GaN layer serving as the n-type nitride semiconductor crystal layer 21, a $In_{0.2}Ga_{0.8}N$ layer 22a and a $Al_{0.2}Ga_{0.8}N$ layer 22b serving as the light-emitting layer 22, and a p-type GaN layer serving as the p-type nitride semiconductor crystal layer 23, in that order, on the Group III nitride semiconductor crystal substrate 11 as the one or more Group III nitride semiconductor crystal layers 12 (4$^{th}$ Step).

Next, although not shown in the drawing, a 100 nm thick p-side electrode was formed on the upper surface of the p-type nitride semiconductor crystal layer 23 (5$^{th}$ Step), then, as illustrated by FIG. 1C, this was soaked in hydrofluoric acid (aq) (hydrofluoric acid: 1 wt %) to etch away the mask layer 2 (6$^{th}$ Step), after which it was soaked in aqueous KOH (KOH: 5 wt %) to etch the lower surface 10a (the atomic surface made of nitrogen atoms) of the Group III nitride semiconductor crystal 10 that is in contact with the starting substrate 1, and by doing this, separating the Group III nitride semiconductor crystal 10 and the starting substrate 1 (7$^{th}$ Step). Next, an 80 μm diameter, 100 nm thick n-side electrode that also is not shown was formed in the center portion of the lower surface of the GaN substrate of the Group III nitride semiconductor crystal 10 (8$^{th}$ Step), producing the LED of this implementation. The surface roughness $R_{P-V}$ of the rear surface having peaks and valleys of the GaN substrate of this LED was 1.5 µm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.1. The results are shown in Table I.

Embodiment 4

This embodiment is an implementation of Embodying Mode 8. Description is made with reference to FIG. 3, and as shown in FIG. 3A, a 50 nm thick $SiO_2$ layer was sputtered as a mask layer 2 on a 350 µm thick sapphire substrate serving as a starting substrate 1 ($1^{st}$ Step), then photolithography ensued to provide rectangular windows each having a 3000 µm aperture width $W_W$ at a 4000 µm window pitch $P_W$ ($2^{nd}$ Step).

Next, as shown in FIG. 3B, a crystal was grown through HVPE under the conditions of GaCl gas flow rate 110 sccm, $NH_3$ gas flow rate 6000 sccm, growth temperature 980° C., and growth time 5 hours ($3^{rd}$ Step), yielding a 3000 µm×3000 µm×400 µm thick GaN substrate as a Group III nitride semiconductor crystal substrate 11 on the open surface 1a of the starting substrate 1 and also yielding a reverse polarity GaN layer as a Group III nitride semiconductor reverse polarity crystal 3 on the mask layer 2. Then, as in Embodiment 1, MOCVD was employed to grow an n-type GaN layer serving as the n-type nitride semiconductor crystal layer 21, a $In_{0.2}Ga_{0.8}N$ layer 22a and a $Al_{0.2}Ga_{0.8}N$ layer 22b serving as the light-emitting layer 22, and a p-type GaN layer serving as the p-type nitride semiconductor crystal layer 23, in that order, on the Group III nitride semiconductor crystal substrate 11 as the one or more Group III nitride semiconductor crystal layers 12 ($4^{th}$ Step).

Next, although not shown in the drawing, a 100 nm thick p-side electrode was formed on the upper surface of the p-type nitride semiconductor crystal layer 23 ($5^{th}$ Step), then, as illustrated by FIG. 1C, this was soaked in an aqueous solution of KOH (KOH: 5 wt %) to etch the Group III nitride semiconductor reverse polarity crystal layer 3 from its upper surface 3b, which is an atomic surface constituted by elemental nitrogen ($6^{th}$ Step), then soaked in aqueous hydrofluoric acid (hydrofluoric acid: 1 wt %) to etch away the mask layer 2 ($7^{th}$ Step), and then soaked in aqueous KOH solution (KOH: 5 wt %) to etch the lower surface 10a (atomic layer made of elemental nitrogen) of the Group III nitride semiconductor crystal 10 that is in contact with the starting substrate 1 from the starting substrate 1, thereby separating the Group III nitride semiconductor crystal 10 and the starting substrate 1 ($8^{th}$ Step). Next, although not shown, an 80 µm diameter, 100 nm thick n-side electrode was formed in the center portion of the lower surface of the GaN substrate of the Group III nitride semiconductor crystal 10 ($9^{th}$ Step), producing the LED of this implementation. The surface roughness $R_{P-V}$ of the rear surface having peaks and valleys of the GaN substrate of this LED was 15 µm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.2. The results are shown in Table I.

Embodiment 5

This embodiment is an implementation of Embodying Mode 6, in which the same LED as that of Embodiment 1 was fabricated, except that a 300 µm thick Si substrate was used as the starting substrate, the Group III nitride semiconductor crystal substrate 11 was grown by growing a crystal by HVPE under the conditions of $AlCl_3$ gas flow rate 150 sccm, $NH_3$ gas flow rate 7000 sccm, growth temperature 1050° C., and growth time 30 minutes (0.5 hours), to produce a 400 µm×400 µm×15 µm thick AlN substrate, and the Group III nitride semiconductor crystal and the starting substrate were separated by etching the Si starting substrate using an aqueous solution of hydrofluoric acid and nitric acid (hydrofluoric acid: 1 wt %; nitric acid: 1 wt %). Thus, the total number of process steps to fabricate the LED of this implementation was seven. The surface roughness $R_{P-V}$ of the rear surface having peaks and valleys of the AlN substrate of this LED was 0.021 µm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.2. The results are shown in Table I.

Embodiment 6

This embodiment is an implementation of Embodying Mode 6, in which the same LED as in Embodiment 1 was fabricated, except that a 300 µm thick AlN substrate was used as the starting substrate, and the Group III nitride semiconductor crystal substrate 11 was grown by growing a crystal through HVPE under the conditions of $InCl_3$ gas flow rate 20 sccm, GaCl gas flow rate 70 sccm, $NH_3$ gas flow rate 7500 sccm, growth temperature 880° C., and growth time one hour, to produce a 400 µm×400 µm×15 µm thick $In_{0.1}Ga_{0.9}N$ substrate. Thus, the total number of process steps to fabricate the LED of this implementation was seven. The surface roughness $R_{P-V}$ of the rear surface having peaks and valleys of the $In_{0.1}Ga_{0.9}N$ substrate of this LED was 0.33 µm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.0. The results are shown in Table I.

Embodiment 7

This embodiment is an implementation of Embodying Mode 7, and the same LED as in Embodiment 3 was fabricated, except that a 300 µm thick SiC substrate was used as a starting substrate, and the Group III nitride semiconductor crystal substrate 11 was grown by growing a crystal through HVPE under the conditions of $AlCl_3$ gas flow rate 60 sccm, GaCl gas flow rate 70 sccm, $NH_3$ gas partial pressure 8000 sccm, growth temperature 1050° C., and growth time 1.5 hours, to produce a 300 µm×300 µm×85 µm thick $Al_{0.4}Ga_{0.6}N$ substrate. Thus, the total number of process steps to fabricate the LED of this implementation was eight. The surface roughness $R_{P-V}$ of the rear surface having peaks and valleys of the $Al_{0.4}Ga_{0.6}N$ substrate of this LED was 3.1 µm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.3. The results are shown in Table I.

TABLE I

|  |  | Emb. 1 | Emb. 2 | Emb. 3 | Emb. 4 | Emb. 5 | Emb. 6 | Emb. 7 | Comp. Ex. 1 |
|---|---|---|---|---|---|---|---|---|---|
| Corres. Embod. Mode | | Mode 6 | Mode 6 | Mode 7 | Mode 8 | Mode 6 | Mode 6 | Mode 7 | |
| Starting substrate material | | Sapphire | Sapphire | GaN | Sapphire | Si | AlN | SiC | Sapphire |
| Mask | Mask layer material | $Si_3N_4$ | $Si_3N_4$ | $SiO_2$ | $SiO_2$ | $Si_3N_4$ | $Si_3N_4$ | $SiO_2$ | |
| | Window pitch $P_w$ (μm) | 410 | 3010 | 400 | 4000 | 410 | 410 | 400 | |
| | Aperture width $W_w$ (μm) | 400 | 3000 | 100 | 3000 | 400 | 400 | 100 | |
| Group III nitride semi-conductor crystal substrate | Source gas (Flow volume: sccm) | GaCl (100) $NH_3$ (6000) | GaCl (100) $NH_3$ (6000) | GaCl (130) $NH_3$ (6000) | GaCl (110) $NH_3$ (6000) | $AlCl_3$ (150) $NH_3$ (7000) | $InCl_3$ (20) GaCl (70) $NH_3$ (7500) | $AlCl_3$ (60) GaCl (70) $NH_3$ (8000) | GaCl (35) $NH_3$ (6000) |
| | Crystal growth temp. (° C.) | 1050 | 1050 | 1050 | 980 | 1050 | 880 | 1050 | 1050 |
| | Crystal growth time (hr.) | 0.33 | 0.33 | 0.83 | 5 | 0.5 | 1 | 1.5 | 15 |
| | Grown crystal type | GaN | GaN | GaN | GaN | AlN | $In_{0.1}Ga_{0.9}N$ | $Al_{0.4}Ga_{0.6}N$ | GaN |
| | Crystal thickness (μm) | 25 | 25 | 85 | 400 | 15 | 15 | 85 | 400 |
| | Crystal width (μm) | 400 | 3000 | 300 | 3000 | 400 | 400 | 300 | (30 mm) |
| Group III nitride semiconductor crystal layer | | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN |
| Method of separating substrate and starting substrate | | Laser irradiation | Laser irradiation | Etching | Etching | Etching | Laser irradiation | Etching | Grinding/ polishing |
| $R_{P-V}$ of substrate back side (μm) | | 0.035 | 0.048 | 1.5 | 15 | 0.021 | 0.33 | 3.1 | 0.004 |
| No. steps in LED fab. | | 7 | 7 | 8 | 9 | 7 | 7 | 8 | 18 |
| LED's relative emission intensity | | 1.1 | 1.1 | 1.1 | 1.2 | 1.2 | 1.0 | 1.3 | 1.0 |

Embodiment 8

This embodiment is an implementation of Embodying Mode 10a. That is, description is made with reference to FIG. 6, and as shown in FIG. 6A, a 200 μm×200 μm×100 μm thick AlN microcrystal was disposed as the seed crystal 4 on a 300 μm thick sapphire substrate 1 serving as the starting substrate 1 (1st Step). Next, as shown in FIG. 6B, a crystal was grown from this AlN microcrystal with HVPE under the conditions of $AlCl_3$ gas flow rate 90 sccm, $NH_3$ gas flow rate 8000 sccm, growth temperature 1050° C., and growth time seven hours (3rd Step), to produce a 1000 μm×1000 μm×400 μm thick AlN substrate as the Group III nitride semiconductor crystal substrate 11. Then, as in Embodiment 1, MOCVD was employed to grow an n-type GaN layer serving as the n-type nitride semiconductor crystal layer 21, a $In_{0.2}Ga_{0.8}N$ layer 22a and a $Al_{0.2}Ga_{0.8}N$ layer 22b serving as the light-emitting layer 22, and a p-type GaN layer serving as the p-type nitride semiconductor crystal layer 23, in that order, on the Group III nitride semiconductor crystal substrate 11 as the one or more Group III nitride semiconductor crystal layers 12 (4th Step).

Next, although not shown in the drawing, a 100 nm thick p-side electrode was formed on the upper surface of the p-type nitride semiconductor crystal layer 23 (5th Step), then, as illustrated by FIG. 6C, a small force was applied to the Group III nitride semiconductor crystal 10 to separate the Group III nitride semiconductor crystal 10 from the starting substrate 1 (6th Step). A 80 μm diameter, 100 nm thick n-side electrode that also is not shown was then formed in the center portion of the lower surface of the GaN substrate of the Group III nitride semiconductor crystal 10 (7th Step) to produce the LED of this implementation. The surface roughness $R_{P-V}$ of the rear surface having peaks and valleys of the AlN substrate of this LED was 0.014 μm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.0. The results are shown in Table II.

Embodiment 9

This embodiment is an implementation of Embodying Mode 10a, and aside from the fact that a 300 μm thick Si substrate was used as the starting substrate, a GaN microcrystal approximately 80 μm×80 μm×50 μm thick was disposed as a seed crystal, and a crystal was grown from this GaN microcrystal with HVPE under the conditions of GaCl gas flow rate 80 sccm, $NH_3$ gas flow rate 6000 sccm, growth temperature 1050° C., and growth time five hours, to produce a 700 μm×700 μm×300 μm thick AlN substrate as the Group III nitride semiconductor crystal substrate 11, the same LED as in Embodiment 8 was fabricated. Thus, the total number of process steps to fabricate the LED of this implementation was seven. The surface roughness $R_{P-V}$ of the rear surface having peaks and valleys of the AlN substrate of this LED was 0.018 μm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.0. The results are shown in Table II.

TABLE II

| | | Emb. 8 | Emb. 9 |
|---|---|---|---|
| Corres. Embod. Mode | | Mode 10 | Mode 10 |
| Starting substrate material | | Sapphire | Si |
| Seed crystal | Seed crystal material | AlN | GaN |
| | Seed crystal thickness (μm) | 100 | 50 |
| | Seed crystal width (μm) | 200 | 80 |
| Group III nitride | Source gas (Flow volume: sccm) | $AlCl_3$ (90) | GaCl (80) |

TABLE II-continued

|  |  | Emb. 8 | Emb. 9 |
|---|---|---|---|
| semiconductor crystal substrate |  | $NH_3$ (8000) | $NH_3$ (6000) |
|  | Crystal growth temp. (° C.) | 1050 | 1050 |
|  | Crystal growth time (hr.) | 7 | 5 |
|  | Grown crystal type | AlN | GaN |
|  | Crystal thickness (μm) | 400 | 300 |
|  | Crystal width (μm) | 1000 | 700 |
| Group III nitride semiconductor crystal layer |  | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN |
| Method of separating substrate and starting substrate |  | Slight force | Slight force |
| $R_{P-V}$ of substrate back side (μm) |  | 0.014 | 0.018 |
| No. steps in LED fab. |  | 7 | 7 |
| LED's relative emission intensity |  | 1.0 | 1.0 |

It can understood from Table I and Table II that an LED can be manufactured more efficiently by reducing the number of the eleven process steps in the conventional method for manufacturing a LED, without adversely affecting the light-emission properties of the LED, to seven processes in the case of Embodiment 6 and Embodying Mode 10, to eight processes in the case of Embodiment 7, and to nine processes in the case of Embodiment 8, with the manufacturing method of the invention.

Embodiment 9-2

This implementation corresponds to Embodying Mode 10b, and as shown in FIG. 7A, a 10 μm GaN crystal serving as the starting Group III nitride crystal 9 was grown on a 5.08 cm (2 inch) diameter (0001) sapphire substrate using HVPE (1$^{st}$ Step), then a 50 μm $SiO_2$ layer was sputtered as a mask layer to produce a mask portion 2p whose mask portion width $W_M$ is 1500 μm at a 3000 μm mask portion pitch $P_M$ (2$^{nd}$ Step).

Next, as shown in FIG. 7B, etching was performed at 250° C. using a mixed acid solution of phosphoric acid and sulfuric acid to remove the GaN crystal (starting Group III nitride crystal 9a) located below the windows 2a (3$^{rd}$ Step). Then, as shown in FIG. 7C, the $SiO_2$ portion 2p was removed by hydrofluoric acid (4$^{th}$ Step) and the remaining GaN crystal serving as the starting Group III nitride crystal was disposed on the sapphire substrate as the seed crystal 4.

Next, like in Embodiment 9, a 2000 μm×2000 μm×200 μm thick GaN crystal substrate serving as the Group III nitride semiconductor crystal substrate 11 was grown from the GaN crystal (seed crystal 4) using HVPE (5$^{th}$ Step), then MOCVD was used to grow the Group III nitride semiconductor crystal layer 12 on this GaN crystal substrate (6$^{th}$ Step), a p-side electrode was formed (seventh step), a laser was used to separate the Group III nitride semiconductor crystal 10 from the seed crystal 4 like in Embodiment 1 (8$^{th}$ Step), and then an n-side electrode was formed (9$^{th}$ Step), producing an LED. Thus, the total number of process steps to fabricate the LED of this implementation was nine. The surface roughness $R_{P-V}$ of the rear surface having peaks and valleys of the GaN substrate of this LED was 0.063 μm. Taking the strength per unit area of the light-emission spectrum at the peak wavelength 450 nm of the LED of Comparative Example 1 as 1.0, the relative strength of the emission spectra at the peak wavelength 450 nm of the LED of this implementation was 1.2.

The method of manufacturing a Group III nitride semiconductor crystal according to the invention allows a Group III nitride semiconductor crystal that is about the size of a semiconductor device to be produced directly, and thus obviates all the processing steps for slicing, polishing, and turning into chips, the Group III nitride semiconductor crystal that were necessary when producing semiconductor devices conventionally, and allows Group III nitride semiconductor devices to be produced with high efficiency.

The following Embodiments 10 through 45 and Comparative Example 2 investigate more preferable manufacturing conditions for the method of manufacturing a Group III nitride semiconductor crystal according to the invention. It should be noted that Embodiments 10 through 38 and 42 through 45 correspond to Embodying Mode 6. Embodiments 39 through 41 correspond to Embodying Mode 9.

Embodiment 10

As shown in FIG. 1, the same method as that of Embodiment 1 was adopted to form a 50 nm thick $SiO_2$ layer as a mask layer on a 5.08 cm diameter×400 μm thick sapphire substrate serving as the starting substrate 1 and subsequently provide windows having a 260 μm window pitch $P_W$ and a 230 μm aperture width $W_W$ in the mask layer. A GaN substrate was subsequently grown on the open surface of the sapphire substrate as a Group III nitride semiconductor crystal substrate through HVPE under the conditions shown in Table III without allowing cleaving to occur. Then, as in Embodiment 1, MOCVD was employed to grow a 5 μm thick n-type GaN layer serving as the n-type Group III nitride semiconductor crystal layer 21, a 3 nm thick $In_{0.2}Ga_{0.8}N$ layer 22a and a 60 nm thick $Al_{0.2}Ga_{0.8}N$ layer 22b serving as the light-emitting layer 22, and a 150 nm p-type GaN layer serving as the p-type Group III nitride semiconductor crystal layer 23, in that order, on the GaN substrate as the one or more Group III nitride semiconductor crystal layers 12. Next, like in Embodiment 1, a p-side electrode was formed, the Group III nitride semiconductor crystal and the starting substrate were separated, and an n-side electrode was formed, producing an LED. The relative strength of the emission spectra of this LED at the peak wavelength 450 nm was assessed. The results are shown in Table III.

Table III shows that the Group III nitride semiconductor crystal substrate 11 of this implementation had a crystal growth rate of 8 μm/hr, impurity concentration of Si at $6 \times 10^{19}$ cm$^{-3}$, principal face orientation of (0001), and an 8° off angle between the principal face of the substrate and the (0001) face. The results are shown in Table III.

Comparative Example 2

In this comparative example, a 2 μm thick GaN layer was formed as a starting layer on the starting substrate and then, in the same way as in Embodiment 10, a 50 nm thick $_{SiO2}$ layer was formed as a mask layer and then windows having a 230 μm aperture width $W_W$ were provided at a 260 μm window pitch GaN. Next, a GaN substrate that is a Group III nitride crystal substrate was grown as in Embodiment 10 except that the raw gas flow rate was set at 80 sccm for GaCl and 6000 sccm for $NH_3$, the crystal growth time was 1.33 hours, the crystal growth rate was 60 μm/hr, and the impurity concentration was set to Si at $4 \times 10^{18}$ cm$^{-3}$. Cleaving occurred in this GaN substrate and prohibited growth of a Group III nitride semiconductor crystal layer on the GaN substrate, and thus an LED could not be obtained. Table III shows the results.

TABLE III

|  |  | Comp. Ex. 2 | Emb. 10 |
|---|---|---|---|
| Corres. Embod. Mode |  |  | Mode 7 |
| Starting substrate | Starting substrate material | Sapphire | Sapphire |
|  | Starting substrate diameter (cm) | 5.08 | 5.08 |
|  | Starting substrate orientation | (0001) | (0001) |
|  | Starting substrate off angle (°) | 0 | 8 |
| Starting layer |  | GaN | None |
| Mask | Mask layer material | $SiO_2$ | $SiO_2$ |
|  | Window pitch $P_w$ (μm) | 260 | 260 |
|  | Window aperture width $W_w$ (μm) | 230 | 230 |
|  | Micro-aperture pitch $P_w$ (μm) | — | — |
|  | Micro-aperture width $W_w$ (μm) | — | — |
| Separation layer |  | None | None |
| Group III nitride semiconductor crystal substrate | Source gas flow volume   GaCl (sccm)         $NH_3$ | 80  6000 | 25  6000 |
|  | Crystal growth temp. (° C.) | 1000 | 1000 |
|  | Crystal growth time (hr.) | 1.33 | 10.0 |
|  | Crystal growth rate (μm/hr) | 60 | 8 |
|  | Grown crystal type | GaN | GaN |
|  | Impurities | Si | Si |
|  | (conc.: $cm^{-3}$) | $(4 \times 10^{18})$ | $(6 \times 10^{19})$ |
|  | Crystal thickness (μm) | 80 | 80 |
|  | Crystal width (μm) | 250 | 250 |
|  | Angle θ (°) | 58 | 58 |
|  | Presence of cracks? | Yes | No |
|  | Crystal orientation | (0001) | (0001) |
|  | Crystal off angle (°) | Unmeasurable | 8 |
| Group III nitride semiconductor crystal layer |  | — | n-GaN/ $In_{0.2}Ga_{0.8}N$/ $Al_{0.2}Ga_{0.8}N$/ p-GaN |
| Separation method (substrate/starting substrate) |  | — | Laser irradiation |
| $R_{P-V}$ of substrate back side (μm) |  | — | 0.065 |
| No. steps in LED fab. |  | — | 7 |
| LED's relative emission intensity |  | — | 1.1 |

The starting layer in Comparative Example 2 is for facilitating growth of the Group III nitride semiconductor crystal and separation of it from the starting substrate, but defects appear in the starting layer when a mask layer is formed on the starting layer, and it is likely that this leads to cracks in the crystal that is formed on the starting layer. Thus, directly growing the Group III nitride crystal on the open surface of the starting substrate allows cracks to be kept from occurring, as illustrated in Embodiment 10.

Embodiments 11 Through 14

In Embodiments 11 through 14 an LED was fabricated in the same way as in Embodiment 10, except that the pitch and the width of the windows in the mask layer, the flow rate of the raw gas GaCl, and the growth time and the growth rate of the Group III nitride semiconductor crystal substrate were changed as shown in Table IV. The relative strength of the emission spectra of these LED at the peak wavelength 450 nm was assessed. The results are shown in Table IV. The focus of Embodiments 11 through 14 was on the growth rate of the Group III nitride semiconductor crystal substrate.

TABLE IV

|  |  | Emb. 11 | Emb. 12 | Emb. 13 | Emb. 14 |
|---|---|---|---|---|---|
| Corres. Embod. Mode |  | Mode 7 | Mode 7 | Mode 7 | Mode 7 |
| Starting substrate | Starting substrate material | Sapphire | Sapphire | Sapphire | Sapphire |
|  | Starting substrate diameter (cm) | 5.08 | 5.08 | 5.08 | 5.08 |
|  | Starting substrate orientation | (0001) | (0001) | (0001) | (0001) |
|  | Starting substrate off angle (°) | 8 | 8 | 8 | 8 |
| Starting layer |  | None | None | None | None |
| Mask | Mask layer material | $SiO_2$ | $SiO_2$ | $SiO_2$ | $SiO_2$ |
|  | Window pitch $P_w$ (μm) | 2200 | 2200 | 2200 | 4100 |
|  | Window aperture width $W_w$ (μm) | 2000 | 2000 | 2000 | 4000 |
|  | Micro-aperture pitch $P_w$ (μm) | — | — | — | — |
|  | Micro-aperture width $W_w$ (μm) | — | — | — | — |
| Separation layer |  | None | None | None | None |
| Group III nitride semiconductor crystal substrate | Source gas flow   GaCl volume (sccm)   $NH_3$ | 80  6000 | 130  6000 | 260  6000 | 130  6000 |
|  | Crystal growth temp. (° C.) | 1000 | 1000 | 1000 | 1000 |
|  | Crystal growth time (hr.) | 1.33 | 0.08 | 0.40 | 0.80 |
|  | Crystal growth rate (μm/hr) | 60 | 100 | 200 | 100 |
|  | Grown crystal type | GaN | GaN | GaN | GaN |
|  | Impurities | Si | Si | Si | Si |
|  | (conc.: $cm^{-3}$) | $(6 \times 10^{19})$ | $(6 \times 10^{19})$ | $(6 \times 10^{19})$ | $(6 \times 10^{19})$ |

TABLE IV-continued

|  |  | Emb. 11 | Emb. 12 | Emb. 13 | Emb. 14 |
|---|---|---|---|---|---|
|  | Crystal thickness (μm) | 80 | 80 | 80 | 80 |
|  | Crystal width (μm) | 2020 | 2030 | 2050 | 4030 |
|  | Angle θ (°) | 58 | 58 | 58 | 58 |
|  | Presence of cracks? | No | No | No | No |
|  | Crystal orientation | (0001) | (0001) | (0001) | (0001) |
|  | Crystal off angle (°) | 8 | 8 | 8 | 8 |
| Group III nitride semiconductor crystal layer $Al_{0.2}Ga_{0.8}N$/ p-GaN |  | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN |
| Separation method (substrate/starting substrate) |  | Laser irradiation | Laser irradiation | Laser irradiation | Laser irradiation |
| $R_{P-V}$ of substrate back side (μm) |  | 0.073 | 0.071 | 0.069 | 0.12 |
| No. steps in LED fab. |  | 7 | 7 | 7 | 7 |
| LED's relative emission intensity |  | 1.1 | 1.1 | 1.1 | 1.1 |

Comparing Embodiment 10 of Table III and Embodiments 11 through 14 of Table IV, it is clear that setting the growth rate of the Group III nitride semiconductor crystal substrate to at least 10 μm/hr but not more than 300 μm/hr allows large, 2000 μm wide Group III nitride semiconductor crystal substrates to be obtained without cleaving. In particular, setting the growth rate of the Group III nitride semiconductor crystal substrate to at least 30 μm/hr but not more than 250 μm/hr as in Embodiment 14 allows a large, 4000 μm wide Group III nitride semiconductor crystal substrate to be obtained without cleaving.

Embodiments 15 Through 18

In Embodiments 15 through 18, an LED was fabricated in the same way as in Embodiment 10, except that the pitch and the width of the windows in the mask layer, and the concentration of impurities were changed as shown in Table V. The relative strength of the emission spectra of these LED at the peak wavelength 450 nm was assessed. The results are shown in Table V. The focus of Embodiments 15 through 18 was on the impurity concentration of the Group III nitride semiconductor crystal substrate.

TABLE V

|  |  | Emb. 15 | Emb. 16 | Emb. 17 | Emb. 18 |
|---|---|---|---|---|---|
| Corres. Embod. Mode |  | Mode 7 | Mode 7 | Mode 7 | Mode 7 |
| Starting substrate | Starting substrate material | Sapphire | Sapphire | Sapphire | Sapphire |
|  | Starting substrate diameter (cm) | 5.08 | 5.08 | 5.08 | 5.08 |
|  | Starting substrate orientation | (0001) | (0001) | (0001) | (0001) |
|  | Starting substrate off angle (°) | 8 | 8 | 8 | 8 |
| Starting layer |  | None | None | None | None |
| Mask | Mask layer material | $SiO_2$ | $SiO_2$ | $SiO_2$ | $SiO_2$ |
|  | Window pitch $P_w$ (μm) | 2200 | 2200 | 2200 | 4100 |
|  | Window aperture width $W_w$ (μm) | 2000 | 2000 | 2000 | 4000 |
|  | Micro-aperture pitch $P_w$ (μm) | — | — | — | — |
|  | Micro-aperture width $W_w$ (μm) | — | — | — | — |
| Separation layer |  | None | None | None | None |
| Group III nitride semiconductor crystal substrate | Source gas flow volume (sccm) GaCl | 25 | 25 | 25 | 25 |
|  | $NH_3$ | 6000 | 6000 | 6000 | 6000 |
|  | Crystal growth temp. (° C.) | 1000 | 1000 | 1000 | 1000 |
|  | Crystal growth time (hr.) | 10.0 | 10.0 | 10.0 | 10.0 |
|  | Crystal growth rate (μm/hr) | 8 | 8 | 8 | 8 |
|  | Grown crystal type | GaN | GaN | GaN | GaN |
|  | Impurities | Si | Si | Si | Si |
|  | (conc.: $cm^{-3}$) | $(2 \times 10^{17})$ | $(3 \times 10^{18})$ | $(7 \times 10^{18})$ | $(3 \times 10^{18})$ |
|  | Crystal thickness (μm) | 80 | 80 | 80 | 80 |
|  | Crystal width (μm) | 2020 | 2020 | 2020 | 4020 |
|  | Angle θ (°) | 58 | 58 | 58 | 58 |
|  | Presence of cracks? | No | No | No | No |
|  | Crystal orientation | (0001) | (0001) | (0001) | (0001) |
|  | Crystal off angle (°) | 8 | 8 | 8 | 8 |
| Group III nitride semiconductor crystal layer |  | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN |
| Separation method (substrate/starting substrate) |  | Laser irradiation | Laser irradiation | Laser irradiation | Laser irradiation |
| $R_{P-V}$ of substrate back side (μm) |  | 0.071 | 0.068 | 0.072 | 0.11 |
| No. steps in LED fab. |  | 7 | 7 | 7 | 7 |
| LED's relative emission intensity |  | 1.1 | 1.1 | 1.1 | 1.2 |

Comparing Embodiment 10 of Table III and Embodiments 15 through 18 of Table V, it is clear that setting the impurity concentration of the Group III nitride semiconductor crystal substrate to $5 \times 10^{19}$ cm$^{-3}$ or less allows large 2000 μm wide Group III nitride semiconductor crystal substrates to be obtained without cleaving. In particular, setting the impurity concentration of the Group III nitride semiconductor crystal substrate to $9 \times 10^{18}$ cm$^{-3}$ or less as in Embodiment 18 allows a large, 4000 μm wide Group III nitride semiconductor crystal substrate to be obtained without cleaving.

Embodiments 19 Through 22

In Embodiments 19 through 22, an LED was fabricated in the same way as in Embodiment 10, except that the pitch and the width of the windows in the mask layer, and the off angle between the principal face and the (0001) face of the starting substrate were changed as shown in Table VI. The relative strength of the emission spectra of these LED at the peak wavelength 450 nm was assessed. The results are shown in Table VI. The focus of Embodiments 19 through 22 was on the off angle between the principal face and the (0001) face of the Group III nitride semiconductor crystal substrate.

TABLE VI

| | | Emb. 19 | Emb. 20 | Emb. 21 | Emb. 22 |
|---|---|---|---|---|---|
| Corres. Embod. Mode | | Mode 7 | Mode 7 | Mode 7 | Mode 7 |
| Starting substrate | Starting substrate material | Sapphire | Sapphire | Sapphire | Sapphire |
| | Starting substrate diameter (cm) | 5.08 | 5.08 | 5.08 | 5.08 |
| | Starting substrate orientation | (0001) | (0001) | (0001) | (0001) |
| | Starting substrate off angle (°) | 0 | 0.2 | 3 | 0.2 |
| Starting layer | | None | None | None | None |
| Mask | Mask layer material | SiO$_2$ | SiO$_2$ | SiO$_2$ | SiO$_2$ |
| | Window pitch $P_w$ (μm) | 2200 | 2200 | 2200 | 4100 |
| | Window aperture width $W_w$ (μm) | 2000 | 2000 | 2000 | 4000 |
| | Micro-aperture pitch $P_w$ (μm) | — | — | — | — |
| | Micro-aperture width $W_w$ (μm) | — | — | — | — |
| Separation layer | | None | None | None | None |
| Group III nitride semiconductor crystal substrate | Source gas flow volume (sccm) GaCl | 25 | 25 | 25 | 25 |
| | NH$_3$ | 6000 | 6000 | 6000 | 1000 |
| | Crystal growth temp. (° C.) | 1000 | 1000 | 1000 | 1000 |
| | Crystal growth time (hr.) | 10.0 | 10.0 | 10.0 | 10.0 |
| | Crystal growth rate (μm/hr) | 8 | 8 | 8 | 8 |
| | Grown crystal type | GaN | GaN | GaN | GaN |
| | Impurities | Si | Si | Si | Si |
| | (conc.: cm$^{-3}$) | ($6 \times 10^{19}$) | ($6 \times 10^{19}$) | ($6 \times 10^{19}$) | ($6 \times 10^{19}$) |
| | Crystal thickness (μm) | 80 | 80 | 80 | 80 |
| | Crystal width (μm) | 2020 | 2020 | 2020 | 4020 |
| | Angle θ (°) | 58 | 58 | 58 | 58 |
| | Presence of cracks? | No | No | No | No |
| | Crystal orientation | (0001) | (0001) | (0001) | (0001) |
| | Crystal off angle (°) | 0 | 0.2 | 3 | 0.2 |
| Group III nitride semiconductor crystal layer | | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN |
| Separation method (substrate/starting substrate) | | Laser irradiation | Laser irradiation | Laser irradiation | Laser irradiation |
| $R_{P-V}$ of substrate back side (μm) | | 0.083 | 0.079 | 0.069 | 0.141 |
| No. steps in LED fab. | | 7 | 7 | 7 | 7 |
| LED's relative emission intensity | | 1.1 | 1.1 | 1.1 | 1.2 |

Comparing Embodiment 10 of Table III and Embodiments 19 through 22 of Table VI, it is clear that setting the off angle between the principal face and the (0001) face of the Group III nitride semiconductor crystal substrate to at least 0° but not more than 4° allows large 2000 μm wide Group III nitride semiconductor crystal substrates to be obtained without cleaving. In particular, setting the off angle to 3° or less as in Embodiment 22 allows a large, 4000 μm wide Group III nitride semiconductor crystal substrate to be obtained without cleaving.

Embodiments 23 Through 25

In Embodiments 23 through 25 an LED was fabricated in the same way as in Embodiment 10, except that the pitch and the width of the windows in the mask layer, the flow rate of the raw gas GaCl, the growth time and the growth rate of the Group III nitride semiconductor crystal substrate, the concentration of impurities, and the off angle between the principal face and the (0001) face of the starting substrate were changed as shown in Table VII. The relative strength of the emission spectra of these LED at the peak wavelength 450 nm was assessed. The results are shown in Table VII. The focus of Embodiments 23 through 25 was on the combination of at least two conditions chosen from the growth rate of the Group III nitride semiconductor crystal, the impurity concentration, and the off angle between the principal face and the (0001) face of the Group III nitride semiconductor crystal substrate.

TABLE VII

|  |  | Emb. 23 | Emb. 24 | Emb. 25 |
|---|---|---|---|---|
|  | Corres. Embod. Mode | Mode 7 | Mode 7 | Mode 7 |
| Starting substrate | Starting substrate material | Sapphire | Sapphire | Sapphire |
|  | Starting substrate diameter (cm) | 5.08 | 5.08 | 5.08 |
|  | Starting substrate orientation | (0001) | (0001) | (0001) |
|  | Starting substrate off angle (°) | 8 | 0.2 | 0.2 |
| Starting layer |  | None | None | None |
| Mask | Mask layer material | $SiO_2$ | $SiO_2$ | $SiO_2$ |
|  | Window pitch $P_w$ (μm) | 15,200 | 15,200 | 15,200 |
|  | Window aperture width $W_w$ (μm) | 15,000 | 15,000 | 15,000 |
|  | Micro-aperture pitch $P_w$ (μm) | — | — | — |
|  | Micro-aperture width $W_w$ (μm) | — | — | — |
| Separation layer |  | None | None | None |
| Group III nitride semiconductor crystal substrate | Source gas flow volume (sccm)   GaCl | 130 | 130 | 25 |
|  | $NH_3$ | 6000 | 6000 | 6000 |
|  | Crystal growth temp. (° C.) | 1000 | 1000 | 1000 |
|  | Crystal growth time (hr.) | 0.80 | 0.80 | 10.0 |
|  | Crystal growth rate (μm/hr) | 100 | 100 | 8 |
|  | Grown crystal type | GaN | GaN | GaN |
|  | Impurities | Si | Si | Si |
|  | (conc.: $cm^{-3}$) | ($3 \times 10^{18}$) | ($6 \times 10^{19}$) | ($3 \times 10^{18}$) |
|  | Crystal thickness (μm) | 80 | 80 | 80 |
|  | Crystal width (μm) | 15050 | 15050 | 15010 |
|  | Angle θ (°) | 58 | 58 | 58 |
|  | Presence of cracks? | No | No | No |
|  | Crystal orientation | (0001) | (0001) | (0001) |
|  | Crystal off angle (°) | 8 | 0.2 | 0.2 |
| Group III nitride semiconductor crystal layer |  | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN | n-GaN/ $In_{0.2}Ga_{0.8}N/$ $Al_{0.2}Ga_{0.8}N/$ p-GaN |
| Separation method (substrate/starting substrate) |  | Laser irradiation | Laser irradiation | Laser irradiation |
| $R_{P-V}$ of substrate back side (μm) |  | 0.32 | 0.57 | 0.27 |
| No. steps in LED fab. |  | 7 | 7 | 7 |
| LED's relative emission intensity |  | 1.2 | 1.1 | 1.2 |

It is clear from Table VII that by combining at least any two conditions chosen from setting the growth rate of the Group III nitride semiconductor crystal substrate to at least 10 μm/hr but not more than 300 μm/hr, setting the impurity concentration of the Group III nitride semiconductor crystal substrate to $5 \times 10^{19}$ cm$^{-3}$ or less, and setting the off angle between the principal face of the (0001) face of the Group III nitride semiconductor crystal substrate to at least 0° but not more than 4°, allows a large 15,000 μm wide Group III nitride semiconductor crystal substrate to be obtained without cleaving.

Embodiments 26 Through 29

In Embodiments 26 through 29, an LED was fabricated in the same way as in Embodiment 10, except that the pitch and the width of the windows in the mask layer, the flow rate of the raw gas GaCl, the growth time and the growth rate of the Group III nitride semiconductor crystal substrate, the concentration of impurities, and the off angle between the principal face and the (0001) face of the starting substrate were changed as shown in Table VIII. The relative strength of the emission spectra of these LED at the peak wavelength 450 nm was assessed. The results are shown in Table VIII. The focus in Embodiments 26 through 29 was on the combination of the three conditions of the growth rate of the Group III nitride semiconductor crystal, the impurity concentration, and the off angle between the principal face and the (0001) face of the Group III nitride semiconductor crystal substrate.

TABLE VIII

| | | | Emb. 26 | Emb. 27 | Emb. 28 | Emb. 29 |
|---|---|---|---|---|---|---|
| Corres. Embod. Mode | | | Mode 7 | Mode 7 | Mode 7 | Mode 7 |
| Starting | Starting substrate material | | Sapphire | Sapphire | Sapphire | Sapphire |
| substrate | Starting substrate diameter (cm) | | 5.08 | 5.08 | 5.08 | 5.08 |
| | Starting substrate orientation | | (0001) | (0001) | (0001) | (0001) |
| | Starting substrate off angle (°) | | 0 | 0 | 0 | 0 |
| Starting layer | | | None | None | None | None |
| Mask | Mask layer material | | $SiO_2$ | $SiO_2$ | $SiO_2$ | $SiO_2$ |
| | Window pitch $P_w$ (μm) | | 900 | 2100 | 10,200 | 25,200 |
| | Window aperture width $W_w$ (μm) | | 800 | 2000 | 10,000 | 25,000 |
| | Micro-aperture pitch $P_w$ (μm) | | — | — | — | — |
| | Micro-aperture width $W_w$ (μm) | | — | — | — | — |
| Separation layer | | | None | None | None | None |
| Group III nitride semiconductor crystal | Source gas flow | GaCl | 130 | 130 | 130 | 130 |
| substrate | volume (sccm) | $NH_3$ | 6000 | 6000 | 6000 | 6000 |
| | Crystal growth temp. (° C.) | | 1000 | 1000 | 1000 | 1000 |
| | Crystal growth time (hr.) | | 0.80 | 0.80 | 0.80 | 0.80 |
| | Crystal growth rate (μm/hr) | | 100 | 100 | 100 | 100 |
| | Grown crystal type | | GaN | GaN | GaN | GaN |
| | Impurities | | Si | Si | Si | Si |
| | (conc.: cm$^{-3}$) | | ($4 \times 10^{18}$) | ($4 \times 10^{18}$) | ($4 \times 10^{18}$) | ($4 \times 10^{18}$) |
| | Crystal thickness (μm) | | 80 | 80 | 80 | 80 |
| | Crystal width (μm) | | 850 | 2050 | 10050 | 25050 |
| | Angle θ (°) | | 58 | 58 | 58 | 58 |
| | Presence of cracks? | | No | No | No | No |
| | Crystal orientation | | (0001) | (0001) | (0001) | (0001) |
| | Crystal off angle (°) | | 0 | 0 | 0 | 0 |
| Group III nitride semiconductor crystal | | | n-GaN/ | n-GaN/ | n-GaN/ | n-GaN/ |
| layer | | | $In_{0.2}Ga_{0.8}N/$ | $In_{0.2}Ga_{0.8}N/$ | $In_{0.2}Ga_{0.8}N/$ | $In_{0.2}Ga_{0.8}N/$ |
| | | | $Al_{0.2}Ga_{0.8}N/$ | $Al_{0.2}Ga_{0.8}N/$ | $Al_{0.2}Ga_{0.8}N/$ | $Al_{0.2}Ga_{0.8}N/$ |
| | | | p-GaN | p-GaN | p-GaN | p-GaN |
| Separation method | | | Laser | Laser | Laser | Laser |
| (substrate/starting substrate) | | | irradiation | irradiation | irradiation | irradiation |
| $R_{P-V}$ of substrate back side (μm) | | | 0.054 | 0.085 | 0.24 | 0.62 |
| No. steps in LED fab. | | | 7 | 7 | 7 | 7 |
| LED's relative emission intensity | | | 1.1 | 1.1 | 1.2 | 1.2 |

It is clear from Table VIII that by combining the three conditions of a Group III nitride semiconductor crystal substrate growth rate of at least 10 μm/hr but not more than 300 μm/hr, an impurity concentration of the Group III nitride semiconductor crystal substrate of $5\times10^{19}$ cm$^{-3}$ or less, and an off angle between the principal face and the (0001) face of the Group III nitride semiconductor crystal substrate of at least 0° but not more than 4°, allows a large 25,000 μm wide Group III nitride semiconductor crystal substrate to be obtained without cleaving.

Embodiments 30 and 31

In Embodiments 30 and 31 an LED was fabricated in the same way as in Embodiment 10, except that a 10.08 cm diameter silicon substrate (principal face direction (111)) was used as the starting substrate, and that the pitch and the width of the windows in the mask layer, the flow rate of the raw gas GaCl, the growth time and the growth rate of the Group III nitride semiconductor crystal substrate, the concentration of impurities, and the off angle between the principal face and the (0001) face of the starting substrate were changed as shown in Table IX. The relative strength of the emission spectra of these LED at the peak wavelength 450 nm was assessed. The results are shown in Table IX. The focus in both Embodiments 30 and 31 is on the combination of the three conditions of the growth rate of the Group III nitride semiconductor crystal substrate, the impurity concentration, and the off angle between the principal face and the (0001) face of the Group III nitride semiconductor crystal substrate.

TABLE IX

|  |  | Emb. 30 | Emb. 31 |
|---|---|---|---|
| Corres. Embod. Mode | | Mode 7 | Mode 7 |
| Starting substrate | Starting substrate material | Silicon | Silicon |
|  | Starting substrate diameter (cm) | 10.16 | 10.16 |
|  | Starting substrate orientation | (111) | (111) |
|  | Starting substrate off angle (°) | 0 | 0 |
| Starting layer | | None | None |
| Mask | Mask layer material | SiO$_2$ | SiO$_2$ |
|  | Window pitch P$_w$ (μm) | 15,200 | 25,200 |
|  | Window aperture width W$_w$ (μm) | 15,000 | 25,000 |
|  | Micro-aperture pitch P$_w$ (μm) | — | — |
|  | Micro-aperture width W$_w$ (μm) | — | — |
| Separation layer | | None | None |
| Group III nitride semiconductor crystal substrate | Source gas flow volume GaCl (sccm) | 130 | 130 |
|  | NH$_3$ | 6000 | 6000 |
|  | Crystal growth temp. (° C.) | 1000 | 1000 |
|  | Crystal growth time (hr.) | 0.80 | 0.80 |
|  | Crystal growth rate (μm/hr) | 100 | 100 |
|  | Grown crystal type | GaN | GaN |
|  | Impurities | Si | Si |
|  | (conc.: cm$^{-3}$) | ($4 \times 10^{18}$) | ($4 \times 10^{18}$) |
|  | Crystal thickness (μm) | 80 | 80 |
|  | Crystal width (μm) | 15050 | 25050 |
|  | Angle θ (°) | 58 | 58 |
|  | Presence of cracks? | No | No |
|  | Crystal orientation | (0001) | (0001) |
|  | Crystal off angle (°) | 0 | 0 |
| Group III nitride semiconductor crystal layer | | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN |
| Separation method (substrate/starting substrate) | | Laser irradiation | Laser irradiation |
| R$_{P-V}$ of substrate back side (μm) | | 0.29 | 0.67 |
| No. steps in LED fab. | | 7 | 7 |
| LED's relative emission intensity | | 1.1 | 1.2 |

It is clear from Table IX that by using an Si substrate as the starting substrate and combining the three conditions of a Group III nitride semiconductor crystal substrate growth rate of at least 10 μm/hr but not more than 300 μm/hr, an impurity concentration of the Group III nitride semiconductor crystal substrate of $5 \times 10^{19}$ cm$^{-3}$ or less, and an off angle between the principal face and the (0001) face of the Group III nitride crystal substrate of at least 0° but not more than 4°, allows a large 25,000 μm wide Group III nitride semiconductor crystal substrate to be obtained without cleaving occurring even when using a large 10.06 cm diameter starting substrate.

It should be noted that in Embodiments 10 through 31, the principal face direction of the Group III nitride semiconductor crystal layer that is grown on the Group III nitride semiconductor crystal substrate, whose principal face direction is (0001), also is (0001). Further, the off angle between the principal face and the (0001) face of the Group III nitride semiconductor crystal substrate and the off angle between the principal face and the (0001) face of the Group III nitride semiconductor crystal layer matched one another.

Embodiment 32

In Embodiment 32 an LED was fabricated in the same way as in Embodiment 10, except that a 15 mm×15 mm×400 μm thick GaN starting substrate (principal face direction (1$\bar{1}$00)) was used as the starting substrate, the pitch and the width of the windows in the mask layer, the flow rate of the raw gas GaCl, the growth time and the growth rate of the Group III nitride semiconductor crystal substrate, the type and concentration of impurities, and the off angle between the principal face and the (1$\bar{1}$00) face of the starting substrate were changed as shown in Table X, and the Group III nitride semiconductor crystal substrate and the starting substrate were separated by cleaving. The relative strength of the emission spectrum of the LED at the peak wavelength 450 nm was assessed. The results are shown in Table X. The focus of Embodiment 32 was on the face direction of the Group III nitride semiconductor crystal substrate. The results are shown in Table X.

Embodiment 33

In Embodiment 33 an LED was fabricated in the same way as in Embodiment 10, except that a 15 mm×15 mm×400 μm thick GaN starting substrate (principal face direction (11$\bar{2}$0)) was used as the starting substrate, that the pitch and the width of the windows in the mask layer, the flow rate of the raw gas GaCl, the growth temperature, growth time and growth rate of the Group III nitride semiconductor crystal substrate, the type and concentration of impurities, and the off angle between the principal face and the (11$\bar{2}$0) face of the starting substrate were changed as shown in Table X, and a 3 μm thick In$_{0.8}$Ga$_{0.2}$N layer was formed as a separation layer that is a Group III nitride semiconductor crystal layer after the windows are provided in the mask layer but before the Group III nitride semiconductor crystal substrate is grown. The relative strength of the emission spectrum of the LED at the peak wavelength 450 nm was assessed. The results are shown in Table X.

Separation layer here is used to mean the spot of separation when separating the Group III nitride semiconductor crystal and the starting substrate are separated. Forming a separation layer having smaller band gap energy than the band gap energies of the starting substrate and the Group III nitride crystal and irradiating a laser allows the Group III nitride crystal and the starting substrate to be separated without causing damage to the Group III nitride crystal and the starting substrate. The focus of Embodiment 33 was on the face direction of the Group III nitride semiconductor crystal substrate.

Embodiment 34 and Embodiment 35

In Embodiments 34 and 35, an LED was fabricated in the same way as in Embodiment 10, except that a starting substrate having the material (chemical composition), shape, and face direction shown in Table IX was used, and the pitch and the width of the windows in the mask layer, the flow rate of the raw gas GaCl, the growth temperature, growth time and growth rate of the Group III nitride semiconductor crystal substrate, the type and concentration of impurities, and the off angle between the principal face and the (11$\bar{2}$0) face of the starting substrate were changed as shown in Table IX. The relative strength of the emission spectra of these LED at the peak wavelength 450 nm was assessed. The results are shown in Table X. The focus of Embodiment 34 and Embodiment 35 was on the face direction of the Group III nitride semiconductor crystal substrate.

TABLE X

|  |  | Emb. 32 | Emb. 33 | Emb. 34 | Emb. 35 |
|---|---|---|---|---|---|
| Corres. Embod. Mode |  | Mode 7 | Mode 7 | Mode 7 | Mode 7 |
| Starting substrate | Starting substrate material | GaN | GaN | AlN | Al$_{0.3}$Ga$_{0.7}$N |
|  | Starting substrate diameter (cm) | 15 | 15 | 15 | 15 |
|  | Starting substrate orientation | (1$\bar{1}$00) | (11$\bar{2}$0) | (1$\bar{1}$01) | (1$\bar{1}$02) |
|  | Starting substrate off angle (°) | 0 | 0 | 0 | 0 |
| Starting layer |  | None | None | None | None |
| Mask | Mask layer material | SiO$_2$ | SiO$_2$ | SiO$_2$ | SiO$_2$ |
|  | Window pitch P$_w$ (μm) | 2200 | 2200 | 2200 | 2200 |
|  | Window aperture width W$_w$ (μm) | 2000 | 2000 | 2000 | 2000 |
|  | Micro-aperture pitch P$_w$ (μm) | — | — | — | — |
|  | Micro-aperture width W$_w$ (μm) | — | — | — | — |
| Separation layer |  | None | In$_{0.8}$Ga$_{0.2}$N | None | None |
| Group III nitride semiconductor crystal substrate | Source gas flow volume (sccm) GaCl | 45 | 45 | 45 | 45 |
|  | NH$_3$ | 6000 | 6000 | 6000 | 6000 |
|  | Crystal growth temp. (° C.) | 1000 | 1050 | 1050 | 1050 |
|  | Crystal growth time (hr.) | 3.75 | 3.75 | 3.75 | 3.75 |
|  | Crystal growth rate (μm/hr) | 40 | 40 | 40 | 40 |
|  | Grown crystal type | GaN | GaN | GaN | GaN |
|  | Impurities | 0 | 0 | 0 | 0 |
|  | (conc.: cm$^{-3}$) | ($3 \times 10^{18}$) | ($3 \times 10^{18}$) | ($3 \times 10^{18}$) | ($3 \times 10^{18}$) |

TABLE X-continued

|  |  | Emb. 32 | Emb. 33 | Emb. 34 | Emb. 35 |
|---|---|---|---|---|---|
|  | Crystal thickness (μm) | 150 | 150 | 150 | 150 |
|  | Crystal width (μm) | 2100 | 2080 | 2080 | 2050 |
|  | Angle θ (°) | 60 | 30.60 | 30.60 | 30.60 |
|  | Presence of cracks? | No | No | No | No |
|  | Crystal orientation | (1$\bar{1}$00) | (11$\bar{2}$0) | (1$\bar{1}$01) | (1$\bar{1}$02) |
|  | Crystal off angle (°) | 0 | 0 | 0 | 0 |
| Group III nitride semiconductor crystal layer |  | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN |
| Separation method (substrate/starting substrate) |  | Cleaving | Laser irradiation | Laser irradiation | Laser irradiation |
| $R_{P-V}$ of substrate back side (μm) |  | 0.012 | 0.075 | 0.078 | 0.071 |
| No. steps in LED fab. |  | 7 | 7 | 7 | 7 |
| LED's relative emission intensity |  | 1.1 | 1.1 | 1.1 | 1.1 |

Embodiments 36 Through 38

In Embodiments 36 through 38, an LED was fabricated in the same way as in Embodiment 33, except that a starting substrate having the material (chemical composition), shape (15 mm×15 mm×400 μm thickness), and face direction shown in Table I1 was used, and that a 3 μm thick InN layer was formed as a separation layer. The relative strength of the emission spectra of these LED at the peak wavelength 450 nm was assessed. The results are shown in Table XI. The focus of Embodiments 36 to 38 was on the face direction of the Group III nitride semiconductor crystal substrate.

It should be noted that in Embodiments 32 to 38, the direction of the principal face of the Group III nitride semiconductor crystal layer that was grown on the Group III nitride semiconductor crystal substrate, whose principal face direction is (abdc) (where abcd are integers satisfying the relationship d=−(a+b)), was (abdc). Further, the off angle between the principal face and the (abdc) face of the Group III nitride semiconductor crystal substrate and the off angle between the principal face and the (abdc) face of the Group III nitride semiconductor crystal layer matched one another.

TABLE XI

|  |  | Emb. 36 | Emb. 37 | Emb. 38 |
|---|---|---|---|---|
| Corres. Embod. Mode |  | Mode 7 | Mode 7 | Mode 7 |
| Starting substrate | Starting substrate material | SiC | SiC | GaN |
|  | Starting substrate diameter (cm) | 15 | 15 | 15 |
|  | Starting substrate orientation | (1102) | (1121) | (1122) |
|  | Starting substrate off angle (°) | 0 | 0 | 0 |
| Starting layer |  | None | None | None |
| Mask | Mask layer material | SiO$_2$ | SiO$_2$ | SiO$_2$ |
|  | Window pitch P$_w$ (μm) | 2200 | 2200 | 2200 |
|  | Window aperture width W$_w$ (μm) | 2000 | 2000 | 2000 |
|  | Micro-aperture pitch P$_w$ (μm) | — | — | — |
|  | Micro-aperture width W$_w$ (μm) | — | — | — |
| Separation layer |  | InN | InN | InN |
| Group III nitride semiconductor crystal substrate | Source gas flow volume GaCl (sccm) NH$_3$ | 45 6000 | 45 6000 | 45 6000 |
|  | Crystal growth temp. (° C.) | 1050 | 1050 | 1000 |
|  | Crystal growth time (hr.) | 3.75 | 3.75 | 3.75 |
|  | Crystal growth rate (μm/hr) | 40 | 40 | 40 |
|  | Grown crystal type | GaN | GaN | GaN |
|  | Impurities (conc.: cm$^{-3}$) | 0 (3 × 10$^{18}$) | 0 (3 × 10$^{18}$) | 0 (3 × 10$^{18}$) |
|  | Crystal thickness (μm) | 150 | 150 | 150 |
|  | Crystal width (μm) | 2100 | 2080 | 2080 |
|  | Angle θ (°) | 32.58 | 32.58 | 32.58 |
|  | Presence of cracks? | No | No | No |
|  | Crystal orientation | (1102) | (1121) | (1122) |
|  | Crystal off angle (°) | 0 | 0 | 0 |
| Group III nitride semiconductor crystal layer |  | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN | n-GaN/ In$_{0.2}$Ga$_{0.8}$N/ Al$_{0.2}$Ga$_{0.8}$N/ p-GaN |
| Separation method (substrate/starting substrate) |  | Laser irradiation | Laser irradiation | Laser irradiation |
| $R_{P-V}$ of substrate back side (μm) |  | 1.2 | 1.2 | 1.2 |
| No. steps in LED fab. |  | 7 | 7 | 7 |
| LED's relative emission intensity |  | 1.2 | 1.2 | 1.2 |

It was possible to grow large Group III nitride semiconductor crystals having principal faces in various directions as illustrated in Tables X and XI without allowing cleaving to occur.

Embodiment 39

In this implementation, the same method as that of Embodiment 1 was used to form a 50 nm thick $SiO_2$ layer as a mask layer on a 5.08 cm diameter×400 μm thick sapphire substrate serving as the starting substrate 1 and then provide windows 2a each made from a group of at least two or more micro-apertures 2s, as illustrated in FIG. 4, which corresponds to Embodiment 9. Here, the window pitch $P_W$ was 2200 μm, the aperture width $W_W$ was 2000 μm, the micro-aperture pitch $P_s$ was 2 μm, and the micro-aperture width $W_s$ was 1 μm. Next, a GaN substrate was grown as the Group III nitride semiconductor crystal substrate 11 on the open surface 1a of the sapphire substrate through HVPE under the conditions shown in Table XII without allowing cleaving to occur. Then, as in Embodiment 1, MOCVD was employed to grow a 5 μm thick n-type GaN layer serving as the n-type Group III nitride semiconductor crystal layer 21, a 3 nm thick $In_{0.2}Ga_{0.8}N$ layer 22a and a 60 nm thick $Al_{0.2}Ga_{0.8}N$ layer 22b serving as the light-emitting layer 22, and a 150 nm p-type GaN layer serving as the p-type Group III nitride semiconductor crystal layer 23, in that order, on the GaN substrate as the one or more Group III nitride semiconductor crystal layers 12. Next, as in Embodiment 1, a p-side electrode was formed, the Group III nitride semiconductor crystal and the starting substrate were separated, and an n-side electrode was formed, producing an LED. The relative strength of the emission spectrum of this LED at the peak wavelength 450 nm was assessed. The results are shown in Table XII.

Embodiment 40 and Embodiment 41

LEDs were fabricated in the same manner as in Embodiment 39, except that the micro-aperture pitch $P_s$ and the micro-aperture width $W_s$ were changed as shown in Table XII. The relative strength of the emission spectra at the peak wavelength 450 nm of these LEDs was assessed. The results are shown in Table XII.

TABLE XII

|  |  | Emb. 39 | Emb. 40 | Emb. 41 |
|---|---|---|---|---|
| Corres. Embod. Mode |  | Mode 9 | Mode 9 | Mode 9 |
| Starting substrate | Starting substrate material | Sapphire | Sapphire | Sapphire |
|  | Starting substrate diameter (cm) | 5.08 | 5.08 | 5.08 |
|  | Starting substrate orientation | (0001) | (0001) | (0001) |
|  | Starting substrate off angle (°) | 0 | 0 | 0 |
| Starting layer |  | None | None | None |
| Mask | Mask layer material | $SiO_2$ | $SiO_2$ | $SiO_2$ |
|  | Window pitch $P_W$ (μm) | 2200 | 2200 | 2200 |
|  | Window aperture width $W_W$ (μm) | 2000 | 2000 | 2000 |
|  | Micro-aperture pitch $P_W$ (μm) | 2 | 8 | 155 |
|  | Micro-aperture width $W_W$ (μm) | 1 | 5 | 155 |
| Separation layer |  | None | None | None |
| Group III nitride semiconductor crystal substrate | Source gas flow volume (sccm) GaCl | 150 | 150 | 150 |
|  | $NH_3$ | 3500 | 3500 | 3500 |
|  | Crystal growth temp. (° C.) | 1000 | 1000 | 1000 |
|  | Crystal growth time (hr.) | 0.80 | 0.80 | 0.80 |
|  | Crystal growth rate (μm/hr) | 100 | 100 | 100 |
|  | Grown crystal type | GaN | GaN | GaN |
|  | Impurities (conc.: $cm^{-3}$) | Si ($4 \times 10^{18}$) | Si ($4 \times 10^{18}$) | Si ($4 \times 10^{18}$) |
|  | Crystal thickness (μm) | 80 | 80 | 80 |
|  | Crystal width (μm) | 2050 | 2050 | 2050 |
|  | Angle θ (°) | 58 | 58 | 58 |
|  | Presence of cracks? | No | No | No |
|  | Crystal orientation | (0001) | (0001) | (0001) |
|  | Crystal off angle (°) | 0 | 0 | 0 |
| Group III nitride semiconductor crystal layer |  | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN | n-GaN/ $In_{0.2}Ga_{0.8}N$/ $Al_{0.2}Ga_{0.8}N$/ p-GaN |
| Separation method (substrate/starting substrate) |  | Laser irradiation | Laser irradiation | Laser irradiation |
| $R_{P-V}$ of substrate back side (μm) |  | 0.10 | 0.10 | 0.98 |
| No. steps in LED fab. |  | 7 | 7 | 7 |
| LED's relative emission intensity |  | 1.1 | 1.1 | 1.1 |

It is clear from Table XII that providing windows each formed from a group of two or more micro-apertures in the mask layer and growing the Group III nitride semiconductor crystal on the open surface of the starting substrate allows a large crystal to be grown without cleaving occurring. Here, preferably the micro-aperture pitch $P_s$ is at least 1 μm but not more than 250 μm, and the micro-aperture width $W_s$ is at least 0.5 μm but not more than 200 μm.

Embodiment 42 and Embodiment 43

In Embodiments 42 and 43, LEDs were fabricated in the same manner as in Implementation 40 except that the window pitch $P_W$ and the aperture width $W_W$ were changed as shown in Table XIII. The relative strength of the emission spectra at the peak wavelength 450 nm of these LEDs was assessed. The results are shown in Table XIII.

Embodiment 44 and Embodiment 45

In Embodiments 44 and 45, LEDs were fabricated in the same manner as in Embodiment 30, except that the material and the diameter of the starting substrate, and the spacing and the width of the windows in the mask layer, were changed as shown in Table XII. The relative strength of the emission spectra at the peak wavelength 450 nm of these LEDs was assessed. The results are shown in Table XIII.

Comparative Example 3

A 400 μm thick GaN substrate was obtained as the Group III nitride semiconductor crystal substrate 11 in the same manner as the first through $14^{th}$ process steps of Comparative

TABLE XIII

|  |  | Emb. 42 | Emb. 43 | Emb. 44 | Emb. 45 |
|---|---|---|---|---|---|
| Corres. Embod. Mode |  | Mode 7 | Mode 7 | Mode 7 | Mode 7 |
| Starting | Starting substrate material | Sapphire | Sapphire | Silicon | Silicon |
| substrate | Starting substrate diameter (cm) | 5.08 | 5.08 | 10.16 | 15.24 |
|  | Starting substrate orientation | (0001) | (0001) | (111) | (111) |
|  | Starting substrate off angle (°) | 0 | 0 | 0 | 0 |
| Starting layer |  | None | None | None | None |
| Mask | Mask layer material | $SiO_2$ | $SiO_2$ | $SiO_2$ | $SiO_2$ |
|  | Window pitch $P_w$ (μm) | 30100 | 45100 | 30100 | 45100 |
|  | Window aperture width $W_w$ (μm) | 30000 | 45000 | 30000 | 45000 |
|  | Micro-aperture pitch $P_w$ (μm) | 8 | 8 | — | — |
|  | Micro-aperture width $W_w$ (μm) | 5 | 5 | — | — |
| Separation layer |  | None | None | None | None |
| Group III nitride semiconductor crystal | Source gas flow     GaCl | 150 | 150 | 130 | 130 |
| substrate | volume (sccm)      $NH_3$ | 3500 | 3500 | 6000 | 6000 |
|  | Crystal growth temp. (° C.) | 1000 | 1000 | 1000 | 1000 |
|  | Crystal growth time (hr.) | 0.80 | 0.80 | 0.80 | 0.80 |
|  | Crystal growth rate (μm/hr) | 100 | 100 | 100 | 100 |
|  | Grown crystal type | GaN | GaN | GaN | GaN |
|  | Impurities | Si | Si | Si | Si |
|  | (conc.: $cm^{-3}$) | $(4 \times 10^{18})$ | $(4 \times 10^{18})$ | $(4 \times 10^{18})$ | $(4 \times 10^{18})$ |
|  | Crystal thickness (μm) | 80 | 80 | 80 | 80 |
|  | Crystal width (μm) | 30030 | 45030 | 30030 | 45030 |
|  | Angle θ (°) | 58 | 58 | 58 | 58 |
|  | Presence of cracks? | None | None | None | None |
|  | Crystal orientation | (0001) | (0001) | (0001) | (0001) |
|  | Crystal off angle (°) | 0 | 0 | 0 | 0 |
| Group III nitride semiconductor crystal |  | n-GaN/ | n-GaN/ | n-GaN/ | n-GaN/ |
| layer |  | $In_{0.2}Ga_{0.8}N/$ | $In_{0.2}Ga_{0.8}N/$ | $In_{0.2}Ga_{0.8}N/$ | $In_{0.2}Ga_{0.8}N/$ |
|  |  | $Al_{0.2}Ga_{0.8}N/$ | $Al_{0.2}Ga_{0.8}N/$ | $Al_{0.2}Ga_{0.8}N/$ | $Al_{0.2}Ga_{0.8}N/$ |
|  |  | p-GaN | p-GaN | p-GaN | p-GaN |
| Separation method |  | Laser | Laser | Etching | Etching |
| (substrate/starting substrate) |  | irradiation | irradiation |  |  |
| $R_{P-V}$ of substrate back side (μm) |  | 12 | 13 | 0.012 | 0.011 |
| No. steps in LED fab. |  | 7 | 7 | 7 | 7 |
| LED's relative emission intensity |  | 1.2 | 1.2 | 1.0 | 1.0 |

It is clear from Table XIII that, as shown in Embodiment 43, using windows each made of a group of two or more micro-apertures (pitch $P_s$ at least 1 μm but not more than 210 μm, micro-aperture width $W_s$ at least 0.5 μm but not more than 200 μm), and combining the three conditions of a Group III nitride semiconductor crystal substrate growth rate of at least 10 μm/hr but not more than 300 μm/hr, an impurity concentration of the Group III nitride semiconductor crystal substrate of $5 \times 10^{19}$ $cm^{-3}$ or less, and an off angle between the principal face and the (0001) face of the Group III nitride crystal substrate of at least 0° but not more than 4°, allows a large 45,030 μm wide Group III nitride semiconductor crystal substrate to be obtained without allowing cleaving to occur. As shown in Implementation 45, using a Si substrate as the starting substrate and combining the three conditions of a Group III nitride semiconductor crystal substrate growth rate of at least 10 μm/hr but not more than 300 μm/hr, an impurity concentration of the Group III nitride crystal substrate of $5 \times 10^{19}$ $cm^{-3}$ or less, and an off angle between the principal face and the (0001) face of the Group III nitride semiconductor crystal substrate of at least 0° but not more than 4°, allows a large 45,030 μm wide Group III nitride semiconductor crystal substrate to be obtained without cleaving occurring even when a large starting substrate having a 15.24 cm diameter is used.

Example 1, as illustrated by FIGS. 14A and 14C, except that the raw gas flow rate, the crystal growth temperature, and the crystal growth time were those shown in Table XIV. Next, as shown in FIG. 10, a 3 μm thick i-type GaN layer 12a and a 30 nm thick i-type $Al_{0.25}Ga_{0.75}N$ layer 12b were grown on the GaN substrate through MOCVD as the one or more Group III nitride semiconductor crystal layers 12 ($15^{th}$ process).

As illustrated in FIG. 10, photolithography and lift-off ensued to form a source electrode 53 and a drain electrode 55 on the i-type $Al_{0.25}Ga_{0.75}N$ layer 12b by heating compound layers each made of a Ti layer (50 nm thick)/Al layer (100 nm thick)/Ti layer (20 nm thick)/Au layer (200 nm thick) for 30 seconds at 800° C. to produce alloys thereof ($16^{th}$ process). A 300 nm thick Au layer was then formed as a gate electrode 54 ($17^{th}$ process). The gate length was 2 μm and the gate width was 150 μm. The Group III nitride semiconductor crystal made of the Group III nitride semiconductor crystal substrate and the Group III nitride semiconductor crystal layer was then separated into 400 μm×400 μm chips ($18^{th}$ process), producing HEMT semiconductor devices 100.

Embodiment 46

This embodiment is an implementation that corresponds to Embodying Mode 7 and Embodying Mode 12. As shown in FIG. 2A, a 50 nm thick $SiO_2$ layer was sputtered as a mask layer 2 on a 400 μm thick GaN substrate serving as a starting substrate 1 (1$^{st}$ Step), then rectangular windows 2a each having a 270 μm aperture width $W_W$ were provided through photolithography at a 400 μm window pitch $P_W$ (2$^{nd}$ Step).

Next, as shown in FIG. 2B, a crystal was grown through HVPE under the conditions of GaCl gas flow rate 110 sccm, NH$_3$ gas flow rate 6000 sccm, growth temperature 1050° C., and growth time one hour (3$^{rd}$ Step), yielding a 300 μm×300 μm×85 μm thick GaN substrate as a Group III nitride semiconductor crystal substrate 11 on the open surface 1a of the starting substrate 1 located below the windows 2a of the mask layer 2 and on some of the upper surface 2b of the mask layer surrounding the windows 2a. Then, as illustrated in FIG. 10, a 3 μm thick i-type GaN layer 12a and a 30 nm thick i-type Al$_{0.25}$Ga$_{0.75}$N layer 12b were grown on the Group III nitride semiconductor crystal substrate 11 through MOCVD as the one or more Group III nitride semiconductor crystal layers 12 (4$^{th}$ Step).

Next, as illustrated in FIG. 10, photolithography and lift-off ensued to form a source electrode 53 and a drain electrode 55 on the i-type Al$_{0.25}$Ga$_{0.75}$N layer 12b by heating compound layers each made of a Ti layer (50 nm thick)/Al layer (100 nm thick)/Ti layer (20 nm thick)/Au layer (200 nm thick) for 30 seconds at 800° C. to produce alloys (5$^{th}$ Step). A 300 nm thick Au layer was then formed as a gate electrode 54 (6$^{th}$ Step). The gate length was 2 μm and the gate width was 150 μm. Next, as illustrated by FIG. 2C, this was soaked in aqueous hydrofluoric acid (hydrofluoric acid: 1 wt %) to etch away the mask layer 2 (7$^{th}$ Step), after which, as shown in FIG. 2D, it was soaked in aqueous KOH (KOH: 5 wt %) to etch the lower surface 10a (atomic layer made of elemental nitrogen) of the Group III nitride semiconductor crystal 10 that is in contact with the starting substrate 1 to separate the Group III nitride semiconductor crystal 10 and the starting substrate 1 (8$^{th}$ Step), producing a HEMT semiconductor device 100.

Embodiment 46-2

A HEMT was produced as in Implementation 46 except that an 85 μm thick GaN crystal serving as the Group III nitride semiconductor crystal substrate 11 was grown after a 10 μm GaN crystal layer doped to a carbon (C) concentration of 1×10$^{19}$ cm$^{-3}$ had been grown on the starting substrate 1, and that separation from the starting substrate 1 was effected at the C-doped GaN crystal layer.

Comparative Example 4

A 400 μm thick GaN substrate was obtained as the Group III nitride semiconductor crystal substrate 11 as in the first through 14$^{th}$ process steps of Comparative Example 1, as illustrated by FIGS. 14A and 14C, except that the raw gas flow rate, the crystal growth temperature, and the crystal growth time were those shown in Table XIV. Next, a 5 μm thick n$^-$ GaN layer (electron concentration 1×10$^{16}$ cm$^{-3}$) was grown on the GaN substrate through MOCVD as the one or more Group III nitride semiconductor crystal layers 12, as illustrated in FIG. 11 (15$^{th}$ Step).

Next, as illustrated in FIG. 11, a compound layer whose layer composition is Ti layer (50 nm thick)/Al layer (100 nm thick)/Ti layer (20 nm thick)/Au layer (200 nm thick) was heated at 800° C. for 30 seconds to form an alloy that functions as an ohmic electrode 56 over the entire second principal face surface of the GaN substrate (16$^{th}$ process). Photolithography and lift-off then ensued to form a 200 μm diameter×300 nm thickness Au layer as a Schottky electrode 57 on the n$^-$ GaN layer (17$^{th}$ process). The Group III nitride semiconductor crystal made of the Group III nitride semiconductor crystal substrate and the Group III nitride semiconductor crystal layer was then separated into 400 μm×400 μm chips (18$^{th}$ process), producing Schottky diodes as the semiconductor device 100.

Embodiment 47

This embodiment corresponds to Embodying Mode 7 and Embodying Mode 13. As shown in FIG. 2A, a 50 nm thick SiO$_2$ layer was sputtered as a mask layer 2 on a 400 μm thick GaN substrate serving as a starting substrate 1 (1$^{st}$ Step), then rectangular windows 2a each having a 270 μm aperture width $W_W$ were provided through photolithography at a 400 μm window pitch $P_W$ (2$^{nd}$ Step).

Next, as shown in FIG. 2B, a crystal was grown through HVPE under the conditions of GaCl gas flow rate 110 sccm, NH$_3$ gas flow rate 6000 sccm, growth temperature 1050° C., and growth time one hour (3$^{rd}$ Step), yielding a 300 μm×300 μm×85 μm thick GaN substrate as a Group III nitride semiconductor crystal substrate 11 on the open surface 1a of the starting substrate 1 located below the windows 2a of the mask layer 2 and on some of the upper surface 2b of the mask layer surrounding the windows 2a. Next, a 5 μm thick n$^-$ GaN layer (electron concentration 1×10$^{16}$ cm$^{-3}$) was grown on the Group III nitride semiconductor crystal substrate 11 through MOCVD as the one or more Group III nitride semiconductor crystal layers 12, as illustrated in FIG. 11 (4$^{th}$ Step).

Next, as shown in FIG. 2C this was soaked in a aqueous hydrofluoric acid (hydrofluoric acid: 1 wt %) to etch away the mask layer 2 (5$^{th}$ Step), after which, as shown in FIG. 2D, it was soaked in aqueous KOH (KOH: 5 wt %) to etch the lower surface 10a of the Group III nitride semiconductor crystal 10 that is in contact with the starting substrate 1 (the atomic surface made of nitrogen atoms) as shown in FIG. 2D, separating the Group III nitride semiconductor crystal 10 and the starting substrate 1 (6$^{th}$ Step).

Next, as shown in FIG. 11, a compound layer whose layer composition is Ti layer (50 nm thick)/Al layer (100 nm thick)/Ti layer (20 nm thick)/Au layer (200 nm thick) was heated at 800° C. for 30 seconds to form an alloy as an ohmic electrode 56 over the entire second principal face surface of the GaN substrate, which is the Group III nitride semiconductor crystal substrate 11 (7$^{th}$ Step). Next, photolithography and lift-off ensued to form a 200 μm diameter×300 nm thick Au layer as a Schottky electrode 57 on the n$^-$ GaN layer (8$^{th}$ Step), producing a Schottky diode as the semiconductor device 100.

Comparative Example 5

A 400 μm thick GaN substrate was obtained as the Group III nitride semiconductor crystal substrate 11 as in the first through 14$^{th}$ process steps of Comparative Example 1 as illustrated by FIGS. 14A and 14C, except that the raw gas flow rate, the crystal growth temperature, and the crystal growth time were those shown in Table XIV. Next, a 5 μm thick n$^-$ GaN layer (electron concentration 1×10$^{16}$ cm$^{-3}$) was grown on the first principal face of the GaN substrate through MOCVD as the one or more Group III nitride semiconductor crystal layers 12 as illustrated in FIG. 12 (15$^{th}$ Step).

Next, a p-layer 12d and an n$^+$-layer 12e were formed through selective ion infusion, as shown in FIG. 12 (16$^{th}$ process). Here, the p-layer 12d is formed through Mg ion infusion, and the n$^+$-layer 12e is formed through Si ion infusion. Next, a 300 nm thick SiO$_2$ film was formed on the Group III nitride semiconductor crystal layer 12 as a protective film (not shown), and then annealing was performed for 30 seconds at 1250° C. to activate the infused ions (17$^{th}$ process).

The protective film was then stripped with hydrofluoric acid, after which a 50 nm thick $SiO_2$ film was formed through P-CVD (Plasma-enhanced Chemical Vapor Deposition) as an MIS insulation film 59 (18$^{th}$ process).

Next, a portion of the MIS insulation film 59 was etched using photolithography and selective etching using buffered hydrofluoric acid, then, through lift-off, a compound layer whose layer composition is Ti layer (50 nm thick)/Al layer (100 nm thick)/Ti layer (20 nm thick)/Au layer (200 nm thick) was heated at 800° C. for 30 seconds to form an alloy as a source electrode 53 in that etched region, as illustrated in FIG. 11 (19$^{th}$ process). Photolithography and lift-off ensued to form a 300 nm thick Al layer as a gate electrode 54 on the MIS insulation film 59, producing a MIS structure (20$^{th}$ process).

The Group III nitride semiconductor crystal made of the Group III nitride semiconductor crystal substrate and the Group III nitride semiconductor crystal layer was then separated into 400 μm×400 μm chips (21$^{st}$ process). Next, a compound layer whose layer composition is Ti layer (50 nm thick)/Al layer (100 nm thick)/Ti layer (20 nm thick)/Au layer (200 nm thick) was heated at 800° C. for 30 seconds to form an alloy as a drain electrode 55 over the entire surface of the second principal face (the principal face opposite the first principal face; hereinafter the same) of the GaN substrate, which is the Group III nitride semiconductor crystal substrate 11 (22$^{nd}$ process), producing a MIS transistor as the semiconductor device 110.

Embodiment 48

This implementation corresponds to Embodying Mode 7 and Embodying Mode 13. As shown in FIG. 2A, a 50 nm thick $SiO_2$ layer was sputtered as a mask layer 2 on a 400 μm thick GaN substrate serving as a starting substrate 1 (1$^{st}$ Step), then rectangular windows 2a each having a 270 μm aperture width $W_W$ were provided through photolithography at a 400 μm window pitch $P_W$ (2$^{nd}$ Step).

Next, as shown in FIG. 2B, a crystal was grown through HVPE under the conditions of GaCl gas flow rate 110 sccm, $NH_3$ gas flow rate 6000 sccm, growth temperature 1050° C., and growth time one hour (3$^{rd}$ Step), yielding a 300 μm×300 μm×85 μm thick GaN substrate as a Group III nitride semiconductor crystal substrate 11 on the open surface 1a of the starting substrate 1 located below the windows 2a of the mask layer 2 and on some of the upper surface 2b of the mask layer surrounding the windows 2a. Next, a 5 μm thick n$^-$ GaN layer 12c (electron concentration $1 \times 10^{16}$ cm$^{-3}$) was grown on the Group III nitride semiconductor crystal substrate 11 through MOCVD as the one or more Group III nitride semiconductor crystal layers 12 as illustrated in FIG. 10 (4$^{th}$ Step).

Next, a p-layer 12d and an n$^+$-layer 12e were formed through selective ion infusion, as shown in FIG. 12 (5$^{th}$ Step). Here, the p-layer 12d is formed through Mg ion infusion, and the n$^+$-layer 12e is formed through Si ion infusion. Next, a 300 nm thick $SiO_2$ film was formed on the Group III nitride semiconductor crystal layer 12 as a protective film (not shown) and then annealed at 1250° C. for 30 seconds to activate the infused ions (6$^{th}$ Step). The protective film was then stripped with hydrofluoric acid, after which a 50 nm thick $SiO_2$ film was formed through P-CVD (Plasma-enhanced Chemical Vapor Deposition) as an MIS insulation film 59 (7$^{th}$ Step).

Next, a portion of the MIS insulation film 59 was etched using photolithography and selective etching using buffered hydrofluoric acid, then, through lift-off, a compound layer whose layer composition is Ti layer (50 nm thick)/Al layer (100 nm thick)/Ti layer (20 nm thick)/Au layer (200 nm thick) was heated at 800° C. for 30 seconds to form an alloy as a source electrode 53 in that etched region (8$^{th}$ Step). Photolithography and lift-off ensued to form a 300 nm thick Al layer as a gate electrode 54 on the MIS insulation film 59, forming a MIS structure (9$^{th}$ Step).

Next, as shown in FIG. 2C, this was soaked in a aqueous hydrofluoric acid (hydrofluoric acid: 1 wt %) to etch away the mask layer 2 (10$^{th}$ Step), after which, as shown in FIG. 2D, it was soaked in aqueous KOH (KOH: 5 wt %) to etch the lower surface 10a of the Group III nitride semiconductor crystal 10 that is in contact with the starting substrate 1 (the atomic surface made of nitrogen atoms), separating the Group III nitride semiconductor crystal 10 and the starting substrate 1 (11$^{th}$ Step). Next, a compound layer whose layer composition is Ti layer (50 nm thick)/Al layer (100 nm thick)/Ti layer (20 nm thick)/Au layer (200 nm thick) was heated at 800° C. for 30 seconds to form an alloy as a drain electrode 55 over the entire surface of the second principal face of the GaN substrate, which is the Group III nitride semiconductor crystal substrate 11 (12$^{th}$ Step), producing a MIS transistor as the semiconductor device 110.

Table XIV shows the conditions under which the electronic devices of Comparative Examples 3 through 5 and Embodiments 46 through 48 were produced.

TABLE XIV

| | | Emb. 46 | Emb. 47 | Emb. 48 | Comp. Ex. 3 | Comp. Ex. 4 | Comp. Ex. 5 |
|---|---|---|---|---|---|---|---|
| Corres. Embod. Mode | | Mode 7 | Mode 7 | Mode 7 | — | — | — |
| Starting substrate material | | GaN | GaN | GaN | Sapphire | Sapphire | Sapphire |
| Mask | Mask layer material | $SiO_2$ | $SiO_2$ | $SiO_2$ | — | — | — |
| | Window pitch $P_w$ (μm) | 400 | 400 | 400 | — | — | — |
| | Aperture width $W_w$ (μm) | 270 | 270 | 270 | — | — | — |
| Group III nitride semiconductor crystal substrate | Source gas flow GaCl $NH_3$ volume (sccm) | 110 6000 | 110 6000 | 110 6000 | 110 6000 | 110 6000 | 110 6000 |
| | Crystal growth temp. (° C.) | 1050 | 1050 | 1050 | 1050 | 1050 | 1050 |
| | Crystal growth time (hr.) | 1 | 1 | 1 | 1 | 1 | 1 |
| | Grown crystal type | GaN | GaN | GaN | GaN | GaN | GaN |
| | Crystal thickness (μm) | 85 | 85 | 85 | 85 | 85 | 85 |
| | Crystal width (μm) | 300 | 300 | 300 | 300 | 300 | 300 |
| Group III nitride semiconductor crystal layer | | i-GaN/ i-AlGaN | n$^-$-GaN | n$^-$-GaN | i-GaN/ i-AlGaN | n$^-$-GaN | $^-$-GaN |
| Method of separating substrate and starting substrate | | Etching | Etching | Etching | Grinding/ polishing | Grinding/ polishing | Grinding/ polishing |
| No. steps in fabrication | | 8 | 8 | 12 | 18 | 18 | 22 |
| Device type | | HEMT | Schottky diode | MIS transistor | HEMT | Schottky diode | MIS transistor |

It is clear from Table 14 that the methods of manufacturing Group III nitride semiconductor devices according to the invention allow the number of manufacturing processes to be reduced, regardless whether the Group III nitride semiconductor device is a HEMT, Schottky diode, or MIS transistor, and thus semiconductor devices can be manufactured efficiently.

Embodiment 49

This embodiment pertains to the light-emitting appliance found in Embodying Mode 16. Illustrated in FIG. 13, this embodiment features a layered structure that includes, among others, an n-type Group III nitride semiconductor crystal layer 21, a light-emitting layer 22, and a p-type Group III nitride semiconductor crystal layer 23, formed on the first principal face side of a GaN substrate 11 serving the Group III nitride semiconductor crystal substrate 11, and a p-electrode 12 is provided on the p-type Group III nitride semiconductor crystal layer 23. This implementation is characterized in one regard in that its p-side electrode 52 is mounted down, on a mount portion 60a of the lead frame using a conductive adhesive 62.

In this implementation, the light that is emitted by the light-emitting layer 22 is radiated from the second principal face 11b of the GaN substrate, on which the n-side electrode 51 is provided. The n-side electrode 51 does not cover the entire second principal face. It is important to secure a large area that is not covered by the n-side electrode 51. Increasing the numerical window reduces the amount of light that is block by the n-side electrode 51 and therefore raises the radiation efficiency at which light is radiated to the outside.

The n-side electrode 51 is electrically connected to the lead portion 60b of the lead frame by a wire 61. The wire 61 and the above layered structure are sealed by an epoxy resin 63.

Here, the layered structured is obtained by sequentially growing an n-type GaN layer 21a, an n-type $Al_xGa_{1-x}N$ layer 21b, a light-emitting layer 22 having a multi-quantum well (MQW) that is made of an $Al_xGa_{1-x}N$ layer ($0 \leq x \leq 1$) and an $Al_xIn_yGa_{1-x-y}N$ layer ($0 \leq x$, $0 \leq y$, $x+y \leq 1$), a p-type $Al_xGa_{1-x}N$ layer ($0 \leq x \leq 1$) 23a, and a p-type GaN layer 23b, in that order, on the GaN substrate 11, which is the Group III nitride semiconductor crystal substrate 11. Additionally, as shown in FIG. 13, a p-side electrode 52 is formed covering the entire surface of the p-type GaN layer 23b, and this side is mounted down.

The method of manufacturing the light-emitting appliance according to this implementation is described below. Description is made in reference to FIG. 2, and first, as shown in FIG. 2A, a 50 nm thick $SiO_2$ layer was sputtered as a mask layer 2 on a 400 μm thick GaN substrate (face direction (0001), 0.5° off angle between principal face and (0001) face of starting substrate) serving as the starting substrate 1, then rectangular windows each having a 270 μm aperture width $W_W$ were provided through photolithography at a 400 μm window pitch $P_W$.

Next, as shown in FIG. 2B, a crystal was grown through HVPE under the conditions of GaCl gas flow rate 110 sccm, $NH_3$ gas flow rate 6000 sccm, growth temperature 1050° C., and growth time one hour, yielding a 300 μm×300 μm×400 μm thick GaN substrate as a Group III nitride semiconductor crystal substrate 11 on the open surface 1a of the starting substrate 1 located below the windows 2a of the mask layer 2 and on some of the upper surface 2b of the mask layer surrounding the windows 2a. The resistivity of the GaN substrate was 0.01 Ω·cm, and its dislocation density was less than $1\times10^7$ cm$^{-2}$.

Next, as in Embodiment 1, MOCVD was employed to grow a 2 μm thick Si-doped n-type GaN layer 21a and a 50 nm thick Si-doped $Al_{0.2}Ga_{0.8}N$ layer 21b (cladding layer) as the n-type Group III nitride semiconductor crystal layer 21, a light-emitting layer 22 having a MQW (multi-quantum well) made of three layers of a two-layer structure made of a GaN layer and a $In_{0.15}Ga_{0.85}N$ layer, and a 20 nm thick Mg-doped p-type $Al_{0.2}Ga_{0.8}N$ layer 23a (cladding layer) and a 20 nm thick Mg-doped p-type GaN layer 23b serving as the p-type Group III nitride semiconductor crystal layer 23, in that order, on the Group III nitride semiconductor crystal substrate 11 as the one or more Group III nitride semiconductor crystal layers 12. The emission wavelength of the element that was obtained was 450 nm, and the internal quantum efficiency was empirically calculated by comparing the PL (photo luminescence) intensity at low temperature (4.2K) and the PL intensity at room temperature (298K), and was found to be 50%.

This element was then activated to lower the resistance of the Mg-doped p-type Group III nitride semiconductor crystal layer. The carrier concentration was obtained by hole measurement, and found to be $5\times10^{17}$ cm$^{-3}$ in the Mg-doped p-type $Al_{0.2}Ga_{0.8}N$ layer and $1\times10^{18}$ cm$^{-3}$ in the Mg-doped p-type GaN layer.

Next, a 100 μm diameter n-side electrode was attached to the center of the N (nitrogen) face, which is the second principal face of the GaN substrate. As the n-side electrode, a compound layer whose layer composition is a Ti layer (50 nm thick)/Al layer (100 nm thick)/Ti layer (20 nm thick)/Au layer (200 nm thick) was formed in that order in contact with the GaN substrate. This was heated in a nitrogen ($N_2$) atmosphere to set to the contact resistance to $1\times10^{-5}$ Ω·cm$^2$ or less.

Next, a 4 nm thick Ni layer was formed in contact with the p-type GaN layer as a p-side electrode, and a 4 nm thick Au layer was formed over its entire surface. This was heated in an inert gas atmosphere to set the contact resistance to $5\times10^{-4}$ Ω·cm$^2$.

Next, as illustrated in FIG. 13, the element was mounted so that its p-type GaN layer 23b-side is in contact with the mount portion 60a of the lead frame, forming a light-emitting appliance. The conductive resin 62 applied to the mount portion fastens the element and the mount to one another and allows electrical conductivity.

To improve the radiation of heat from the light-emitting appliance, here the light-emitting appliance is mounted such that the entire surface of its p-type GaN layer 23b is in contact with the mount portion 60a of the lead frame. An Ag-based conductive adhesive 62 was chosen for its good thermal conductivity, and a CuW-based lead frame 60 was chosen for its good thermal conductivity. By doing this, a thermal resistance of 8° C./W was obtained.

After the n-side electrode 51 and the lead portion 60b of the lead frame were conductively connected by wire bond, a resin seal was formed using an epoxy resin 63, producing a light-emitting appliance 130 that is made into a lamp.

The embodying modes and embodiments that have been disclosed here are illustrative by nature are should not be regarded as limiting. The scope of the invention is defined by its claims rather than the foregoing description, and should be understood to include the features of the claims of the invention and equivalents thereof, in addition to all changes falling within the scope of the claims.

As illustrated above, the invention can be widely employed for Group III nitride semiconductor crystals large enough for semiconductor devices and methods for manufacturing the same, Group III nitride semiconductor devices and methods for manufacturing the same, and light-emitting appliances including such Group III nitride semiconductor devices.

What is claimed is:

1. At least two discrete III-nitride semiconductor devices noncontiguously coexisting as grown simultaneously on a principal face of a starting substrate and lacking only electrodes in order to function as semiconductor devices, each III-nitride semiconductor device comprising:
a III-nitride semiconductor crystal substrate 10 µm to 600 µm in thickness and 0.2 mm to 50 mm in width, formed in atomic layers of elemental nitrogen and of a Group III element alternating in the <0001>direction of said starting substrate such that the III-nitride semiconductor device lower surface, being a back-side principal face thereof in contact with the principal face of said starting substrate, is nitrogen-terminating; and
at least one device-forming III-nitride semiconductor crystal layer grown onto a front-side principal face of said III-nitride semiconductor crystal substrate reverse from its back-side principal face; wherein applying either chemical or mechanical separation means to
said at least two discrete III-nitride semiconductor devices, as lacking semiconductor-device electrodes, separates said at least two discrete III-nitride semiconductor devices from said starting substrate.

2. A III-nitride semiconductor device as recited in claim 1, wherein the side of said III-nitride semiconductor crystal substrate as separated from said starting substrate is a roughened back side of said III-nitride semiconductor crystal substrate.

3. The III-nitride semiconductor device recited in claim 2, characterized in that the surface roughness $R_{P-V}$ of said roughened back side of said III-nitride semiconductor crystal substrate is at least 0.01 µm but not more than 50 µm.

4. A light-emitting appliance comprising a III-nitride semiconductor device as recited in claim 1, wherein:
said III-nitride semiconductor device is furnished with said III-nitride semiconductor crystal substrate, an n-type III-nitride semiconductor layer on said front-side principal face side of said III-nitride semiconductor crystal substrate, a p-type III-nitride semiconductor crystal layer located farther from said III-nitride semiconductor substrate than is said n-type III-nitride semiconductor crystal layer, and a light-emitting layer that is located between said n-type III-nitride semiconductor crystal layer and said p-type III-nitride semiconductor crystal layer;
said III-nitride semiconductor crystal substrate has a resistivity of 0.5 Ω·cm or less; and
said p-type III-nitride semiconductor crystal layer side is mounted down, and light is irradiated from said back-side principal face.

5. A light-emitting appliance comprising a III-nitride semiconductor device as recited in claim 1, wherein:
said III-nitride semiconductor device is furnished with a GaN substrate being said III-nitride semiconductor crystal substrate, an n-type $Al_xGa_{1-x}N$ layer ($0 \leq x \leq 1$), being an n-type III-nitride semiconductor layer, on said front-side principal face side of said GaN substrate, a p-type $Al_xGa_{1-x}N$ layer ($0 \leq x \leq 1$), being a p-type III-nitride semiconductor crystal layer, located farther from said GaN substrate than is said n-type $Al_xGa_{1-x}N$ layer, and a light-emitting layer located between said n-type $Al_xGa_{1-x}N$ layer and said p-type $Al_xGa_{1-x}N$ layer;
the dislocation density of said GaN substrate is not more than $10^8/cm^2$; and
said p-type $Al_xGa_{1-x}N$ layer side is mounted down, and light is irradiated from said back-side principal face.

6. A light-emitting appliance comprising a III-nitride semiconductor device recited in claim 1, characterized in that:
said III-nitride semiconductor device is furnished with a AlN substrate being said III-nitride semiconductor crystal substrate, an n-type $Al_xGa_{1-x}N$ layer ($0 \leq x \leq 1$), being an n-type III-nitride semiconductor layer, on said front-side principal face side of said AlN substrate, a p-type $Al_xGa_{1-x}N$ layer ($0 \leq x \leq 1$) being a p-type III-nitride semiconductor crystal layer located farther from said AlN substrate than is said n-type $Al_xGa_{1-x}N$ layer, and a light-emitting layer located between said n-type $Al_xGa_{1-x}N$ layer and said p-type $Al_xGa_{1-x}N$ layer;
the thermal conductivity of said AlN substrate is 100 W/(m·K) or more; and
said p-type $Al_xGa_{1-x}N$ layer side is mounted down, and light is irradiated from said back-side principal face.

7. The at least two III-nitride semiconductor devices recited in claim 1, wherein the band-gap energy of each device is smaller than the band-gap energy of said starting substrate, such that irradiating the interface between said starting substrate and said devices with a laser as a mechanical separation means separates said devices from said starting substrate without damaging said starting substrate.

8. The at least two III-nitride semiconductor devices recited in claim 1, wherein the back-side principal face of each crystal III-nitride semiconductor substrate is an easily cleavable plane of said crystal substrate, and the principal face of said starting substrate has the same Miller index as that of the back-side principal face of each crystal substrate, such that cleaving devices the from said starting substrate yields the at least two III-nitride semiconductor devices without damaging said starting substrate.

9. The at least two III-nitride semiconductor devices recited in claim 1, wherein a mechanically brittle layer is interposed between the principal face of said starting substrate and the back-side principal face each device-forming crystal-substrate, III-nitride semiconductor.

10. The at least two III-nitride semiconductor devices recited in claim 1, wherein a seed crystal is interposed between the principal face of said starting substrate and the back-side principal face of each device-forming crystal substrate, III-nitride semiconductor.

11. A method of forming a III-nitride semiconductor device, the method comprising a step of separating one of the at least two III-nitride semiconductor device-forming crystals recited in claim 1 from said starting substrate.

12. A method of forming III-nitride semiconductor devices, the method comprising a step of separating the at least two III-nitride semiconductor device-forming crystals recited in claim 1 from said starting substrate without damaging said starting substrate, thereby leaving said starting substrate reusable.

13. A M-nitride semiconductor device as recited in claim 1, wherein said front-side principal face of said III-nitride semiconductor crystal substrate is smaller than said back-side principal face thereof such that the angle θ formed by the lateral surface between said front- and back-side principal faces, and said back-side principal face is $30° \leq \theta < 60°$.

* * * * *

UNITED STATES PATENT AND TRADEMARK OFFICE
CERTIFICATE OF CORRECTION

PATENT NO. : 8,362,521 B2
APPLICATION NO. : 12/767783
DATED : January 29, 2013
INVENTOR(S) : Seiji Nakahata et al.

It is certified that error appears in the above-identified patent and that said Letters Patent is hereby corrected as shown below:

In the Claims

In claim 8, third line (Column 62, Line 30), "each crystal III-nitride semiconductor substrate is" should read --each III-nitride semiconductor crystal substrate is--.

In claim 8, seventh line (Column 62, Line 34), "that cleaving devices the from said" should read --that cleaving the devices from said--.

In claim 9, fourth and fifth lines (Column 62, Lines 40 and 41), "the back-side principal face each device-forming crystal-substrate, III-nitride semiconductor" should read
--the back-side principal face of each III-nitride semiconductor crystal substrate--.

In claim 10, fourth and fifth lines (Column 62, Lines 45 and 46), "device-forming crystal substrate, III-nitride semiconductor" should read
--III-nitride semiconductor crystal substrate--.

In claim 13, first line (Column 62, Line 57), "AM-nitride semiconductor device" should read --A III-nitride semiconductor device--.

Signed and Sealed this
Eleventh Day of June, 2013

Teresa Stanek Rea
*Acting Director of the United States Patent and Trademark Office*